(12) United States Patent
Luzinski et al.

(10) Patent No.: US 11,227,712 B2
(45) Date of Patent: Jan. 18, 2022

(54) PREEMPTIVE THERMAL MITIGATION FOR WIRELESS POWER SYSTEMS

(71) Applicant: NUCURRENT, INC., Chicago, IL (US)

(72) Inventors: Jason Luzinski, Chicago, IL (US); Andrew Kovacs, West LaFayette, IN (US); Christine M. Frysz, Orchard Park, NY (US)

(73) Assignee: NuCurrent, Inc., Chicago, IL (US)

( * ) Notice: Subject to any disclaimer, the term of this patent is extended or adjusted under 35 U.S.C. 154(b) by 129 days.

(21) Appl. No.: 16/517,077

(22) Filed: Jul. 19, 2019

(65) Prior Publication Data
US 2021/0020348 A1    Jan. 21, 2021

(51) Int. Cl.
*H01F 27/22* (2006.01)
*H05K 7/20* (2006.01)
(Continued)

(52) U.S. Cl.
CPC ......... *H01F 27/22* (2013.01); *H01F 27/2885* (2013.01); *H01F 38/14* (2013.01);
(Continued)

(58) Field of Classification Search
CPC .. H02J 50/00; H02J 7/00; H01F 27/00; H01F 38/00; H05K 7/00
See application file for complete search history.

(56) References Cited

U.S. PATENT DOCUMENTS 2,797,393 A    6/1957  Clogston
2,911,605 A   11/1959  Wales, Jr.
(Continued)

FOREIGN PATENT DOCUMENTS

CN    2650300 Y    10/2004
CN    103944196    7/2014
(Continued)

OTHER PUBLICATIONS

EP Search Report 10751119.8.
(Continued)

*Primary Examiner* — Hal Kaplan
*Assistant Examiner* — Joseph N Inge
(74) *Attorney, Agent, or Firm* — Lee Sullivan Shea & Smith LLP

(57) ABSTRACT

The present application relates to an apparatus which comprises a wireless power transfer (WPT) system. This system comprises features which allow it to transfer more power wirelessly at extended distances than other systems operating in the same frequency range. The system possesses heat dissipation features; these features allow it to operate effectively in elevated-temperature environments, and to transfer power at higher levels and/or greater distances than a typical power-transfer system. The system also might include design features to withstand mechanical shocks, stresses, and impacts for use in a rugged environment. The system can also comprise adaptations to reduce electromagnetic interference (EMI), and can comprise specially shaped components with magnetic/ferrimagnetic properties that enhance performance. Other potential features include power conditioning by combining, within one circuit or one board, multiple elements that protect against excessive current, over-voltage, and/or reverse voltage. Other features might include integration of an antenna and a battery within one module.

20 Claims, 33 Drawing Sheets

(51) Int. Cl.
*H01F 38/14* (2006.01)
*H01F 27/28* (2006.01)
*H02J 50/40* (2016.01)
*H02J 7/02* (2016.01)
*H02J 50/12* (2016.01)

(52) U.S. Cl.
CPC .............. *H02J 7/025* (2013.01); *H02J 50/12* (2016.02); *H02J 50/40* (2016.02); *H05K 7/209* (2013.01)

(56) References Cited

U.S. PATENT DOCUMENTS

| | | |
|---|---|---|
| 3,484,731 A | 12/1969 | Rich |
| 4,328,531 A | 5/1982 | Nagashima et al. |
| 4,494,100 A | 1/1985 | Nejdl |
| 4,959,631 A | 9/1990 | Hasegawa et al. |
| 4,996,165 A | 2/1991 | Asbeck |
| 5,137,478 A | 8/1992 | Graf |
| 5,237,165 A | 8/1993 | Tingley, III |
| 5,604,352 A | 2/1997 | Schuetz |
| 5,713,939 A | 2/1998 | Nedungadi |
| 5,748,464 A | 5/1998 | Schuetz |
| 5,767,808 A | 6/1998 | Skogland |
| 5,767,813 A | 6/1998 | Yao |
| 5,777,538 A | 7/1998 | Schuetz |
| 5,801,611 A | 9/1998 | Waanders |
| 5,808,587 A | 9/1998 | Shima |
| 5,838,154 A | 11/1998 | Nishibe |
| 5,883,392 A | 3/1999 | Schuetz |
| 5,892,489 A | 4/1999 | Mandai |
| 5,980,773 A | 11/1999 | Takeda |
| 6,005,193 A | 12/1999 | Markel |
| 6,021,337 A | 2/2000 | Hodge |
| 6,028,568 A | 2/2000 | Mandai |
| 6,107,972 A | 8/2000 | Seward |
| 6,148,221 A | 11/2000 | Hidaka |
| 6,163,307 A | 12/2000 | Park |
| 6,271,803 B1 | 8/2001 | Kanba |
| 6,503,831 B2 | 1/2003 | Speakman |
| 6,556,101 B1 | 4/2003 | Tada |
| 6,583,769 B2 | 6/2003 | Asakura |
| 6,664,863 B1 | 12/2003 | Ikeda |
| 6,809,688 B2 | 10/2004 | Yamada |
| 6,897,830 B2 | 5/2005 | Bae et al. |
| 6,924,230 B2 | 8/2005 | Sheu |
| 7,046,113 B1 | 5/2006 | Ikeda |
| 7,205,655 B2 | 4/2007 | Sippola |
| 7,355,558 B2 | 4/2008 | Lee |
| 7,563,352 B2 | 7/2009 | Hubel |
| 7,579,835 B2 | 8/2009 | Schnell |
| 7,579,836 B2 | 8/2009 | Schnell |
| 7,713,762 B2 | 5/2010 | Lee |
| 7,786,836 B2 | 8/2010 | Gabara |
| 7,952,365 B2 | 5/2011 | Kushta |
| 7,962,186 B2 | 6/2011 | Cui et al. |
| 8,056,819 B2 | 11/2011 | Rowell |
| 8,299,877 B2 | 10/2012 | Hong |
| 8,436,780 B2 | 5/2013 | Compston |
| 8,567,048 B2 | 10/2013 | Babcock |
| 8,610,530 B2 | 12/2013 | Singh |
| 8,653,927 B2 | 2/2014 | Singh |
| 8,680,960 B2 | 3/2014 | Singh |
| 8,692,641 B2 | 4/2014 | Singh |
| 8,692,642 B2 | 4/2014 | Singh |
| 8,698,590 B2 | 4/2014 | Singh |
| 8,698,591 B2 | 4/2014 | Singh |
| 8,707,546 B2 | 4/2014 | Singh |
| 8,710,948 B2 | 4/2014 | Singh |
| 8,774,712 B2 | 7/2014 | Sato |
| 8,803,649 B2 | 8/2014 | Singh |
| 8,823,481 B2 | 9/2014 | Singh |
| 8,823,482 B2 | 9/2014 | Singh |
| 8,855,786 B2 | 10/2014 | Derbas |
| 8,860,545 B2 | 10/2014 | Singh |
| 8,898,885 B2 | 12/2014 | Babcock |
| 9,178,369 B2 | 11/2015 | Partovi |
| 9,208,942 B2 | 12/2015 | Frysz |
| 9,559,526 B2 | 1/2017 | Von Novak, III et al. |
| 9,912,173 B2 | 3/2018 | Tseng |
| 2002/0020554 A1 | 2/2002 | Sakamoto |
| 2002/0053992 A1 | 5/2002 | Kawakami |
| 2002/0071003 A1 | 6/2002 | Kimura |
| 2002/0075191 A1 | 6/2002 | Yokoshima |
| 2002/0101383 A1 | 8/2002 | Junod |
| 2002/0105080 A1 | 8/2002 | Speakman |
| 2003/0006069 A1 | 1/2003 | Watanabe |
| 2003/0058180 A1 | 3/2003 | Foster |
| 2003/0119677 A1 | 6/2003 | Gao |
| 2004/0000974 A1 | 1/2004 | Odenaal |
| 2004/0085247 A1 | 5/2004 | Capelli |
| 2004/0108311 A1 | 6/2004 | De Rooij |
| 2004/0118920 A1 | 6/2004 | He |
| 2004/0140528 A1 | 7/2004 | Kim |
| 2004/0159460 A1 | 8/2004 | Passiopoulos |
| 2004/0189528 A1 | 9/2004 | Delgado |
| 2004/0217488 A1 | 11/2004 | Luechinger |
| 2004/0227608 A1 | 11/2004 | Nakatani et al. |
| 2005/0121229 A1 | 6/2005 | Sueyoshi |
| 2005/0174628 A1 | 8/2005 | Zhang |
| 2006/0022772 A1 | 2/2006 | Kanno |
| 2006/0040628 A1 | 2/2006 | Porret |
| 2006/0192645 A1 | 8/2006 | Lee |
| 2006/0284718 A1 | 12/2006 | Benetik |
| 2007/0018767 A1 | 1/2007 | Gabara |
| 2007/0020969 A1 | 1/2007 | Yungers |
| 2007/0023424 A1 | 2/2007 | Weber |
| 2007/0045773 A1 | 3/2007 | Mizuno |
| 2007/0046544 A1 | 3/2007 | Sano |
| 2007/0095913 A1 | 5/2007 | Takahashi |
| 2007/0120629 A1 | 5/2007 | Schnell |
| 2007/0179570 A1 | 8/2007 | De Taboada |
| 2007/0182367 A1 | 8/2007 | Partovi |
| 2007/0267718 A1 | 11/2007 | Lee |
| 2007/0279287 A1 | 12/2007 | Castaneda |
| 2008/0039332 A1 | 2/2008 | Touitou |
| 2008/0055178 A1 | 3/2008 | Kim |
| 2008/0062066 A1 | 3/2008 | Arai |
| 2008/0067874 A1 | 3/2008 | Tseng |
| 2008/0150693 A1 | 6/2008 | You |
| 2008/0164840 A1 | 7/2008 | Kato et al. |
| 2008/0164844 A1 | 7/2008 | Kato et al. |
| 2008/0164960 A1 | 7/2008 | Schnell |
| 2008/0211320 A1 | 9/2008 | Secall |
| 2008/0277386 A1 | 11/2008 | Haimer |
| 2008/0283277 A1 | 11/2008 | Kusama |
| 2008/0303735 A1 | 12/2008 | Fukimoto |
| 2009/0015266 A1 | 1/2009 | Narita |
| 2009/0079628 A1 | 3/2009 | Rofougaran |
| 2009/0085706 A1 | 4/2009 | Duckworth |
| 2009/0096413 A1 | 4/2009 | Partovi et al. |
| 2009/0108974 A1 | 4/2009 | Raggam |
| 2009/0134875 A1 | 5/2009 | Tomiha |
| 2009/0140691 A1 | 6/2009 | Jung |
| 2009/0152542 A1 | 6/2009 | Leung |
| 2009/0230777 A1 | 9/2009 | Baarman et al. |
| 2009/0243397 A1 | 10/2009 | Cook et al. |
| 2009/0261778 A1 | 10/2009 | Kook |
| 2009/0261936 A1 | 10/2009 | Sarangan |
| 2010/0033290 A1 | 2/2010 | Frye |
| 2010/0072588 A1 | 3/2010 | Yang |
| 2010/0127660 A1 | 5/2010 | Widmer |
| 2010/0141042 A1 | 6/2010 | Giler |
| 2010/0164296 A1 | 7/2010 | Soljacic |
| 2010/0219694 A1 | 9/2010 | Kurs et al. |
| 2010/0289599 A1 | 11/2010 | Vangala |
| 2010/0289709 A1 | 11/2010 | Guan |
| 2010/0295701 A1 | 11/2010 | Cazenave |
| 2011/0024510 A1 | 2/2011 | Ishino |
| 2011/0084656 A1 | 4/2011 | Gao |
| 2011/0101788 A1 | 5/2011 | Sun et al. |
| 2011/0137379 A1 | 6/2011 | Wosmek |
| 2011/0241437 A1 | 10/2011 | Kanno |
| 2011/0248891 A1 | 10/2011 | Park |

(56) References Cited

U.S. PATENT DOCUMENTS

| | | |
|---|---|---|
| 2011/0279198 A1 | 11/2011 | Haner |
| 2012/0001496 A1* | 1/2012 | Yamamoto ............ H02J 7/025 307/104 |
| 2012/0062345 A1 | 3/2012 | Kurs |
| 2012/0095531 A1 | 4/2012 | Derbas |
| 2012/0161696 A1 | 6/2012 | Cook et al. |
| 2012/0169434 A1 | 7/2012 | Mori |
| 2012/0217819 A1 | 8/2012 | Yamakawa et al. |
| 2012/0235500 A1 | 9/2012 | Schatz |
| 2012/0235634 A1 | 9/2012 | Kulikowski |
| 2012/0235636 A1 | 9/2012 | Partovi |
| 2012/0249396 A1 | 10/2012 | Parsche |
| 2012/0274148 A1 | 11/2012 | Sung et al. |
| 2012/0280765 A1 | 11/2012 | Kurs et al. |
| 2012/0326931 A1 | 12/2012 | Kato |
| 2013/0067737 A1 | 3/2013 | Singh |
| 2013/0067738 A1 | 3/2013 | Singh |
| 2013/0068499 A1 | 3/2013 | Singh |
| 2013/0068507 A1 | 3/2013 | Singh |
| 2013/0069748 A1 | 3/2013 | Frysz |
| 2013/0069749 A1 | 3/2013 | Singh |
| 2013/0069750 A1 | 3/2013 | Singh |
| 2013/0069843 A1 | 3/2013 | Frysz |
| 2013/0076154 A1 | 3/2013 | Baarman |
| 2013/0146671 A1 | 6/2013 | Woerle |
| 2013/0199027 A1 | 8/2013 | Singh |
| 2013/0199028 A1 | 8/2013 | Singh |
| 2013/0200070 A1 | 8/2013 | Singh |
| 2013/0200722 A1 | 8/2013 | Singh |
| 2013/0200968 A1 | 8/2013 | Singh |
| 2013/0200969 A1 | 8/2013 | Singh |
| 2013/0200976 A1 | 8/2013 | Singh |
| 2013/0201589 A1 | 8/2013 | Singh |
| 2013/0205582 A1 | 8/2013 | Singh |
| 2013/0207468 A1 | 8/2013 | Wu et al. |
| 2013/0207744 A1 | 8/2013 | Singh |
| 2013/0208389 A1 | 8/2013 | Singh |
| 2013/0208390 A1 | 8/2013 | Singh |
| 2013/0257362 A1 | 10/2013 | Lim |
| 2013/0300207 A1 | 11/2013 | Wang |
| 2014/0008974 A1 | 1/2014 | Miyamoto |
| 2014/0028111 A1 | 1/2014 | Hansen |
| 2014/0031606 A1* | 1/2014 | Hansen ............... H05K 7/2039 600/16 |
| 2014/0035383 A1 | 2/2014 | Riehl |
| 2014/0035793 A1 | 2/2014 | Ozawa |
| 2014/0041218 A1 | 2/2014 | Signh |
| 2014/0047713 A1 | 2/2014 | Derbas |
| 2014/0084946 A1 | 3/2014 | Gadot |
| 2014/0168019 A1 | 6/2014 | Uejima |
| 2014/0183971 A1 | 7/2014 | Endo |
| 2014/0197694 A1 | 7/2014 | Asanuma et al. |
| 2014/0231518 A1 | 8/2014 | Yosui |
| 2014/0266019 A1 | 9/2014 | Pigott |
| 2014/0347008 A1 | 11/2014 | Chae et al. |
| 2014/0361628 A1 | 12/2014 | Keeling |
| 2015/0054455 A1 | 2/2015 | Kim |
| 2015/0091502 A1 | 4/2015 | Mukherjee et al. |
| 2015/0115727 A1 | 4/2015 | Carobolante et al. |
| 2015/0136858 A1 | 5/2015 | Finn |
| 2015/0137746 A1 | 5/2015 | Lee et al. |
| 2015/0140807 A1 | 5/2015 | Mohammed |
| 2015/0145634 A1 | 5/2015 | Kurz |
| 2015/0145635 A1 | 5/2015 | Duetsch |
| 2015/0155094 A1* | 6/2015 | Yasuda ............... H01F 27/2885 361/270 |
| 2015/0180440 A1 | 6/2015 | Ishizuka |
| 2015/0207541 A1 | 7/2015 | Kuroda |
| 2015/0236545 A1 | 8/2015 | Song |
| 2015/0270058 A1 | 9/2015 | Golko et al. |
| 2015/0280322 A1 | 10/2015 | Saito |
| 2015/0318710 A1 | 11/2015 | Lee et al. |
| 2015/0327405 A1* | 11/2015 | Niizuma ............ H05K 7/20509 307/104 |
| 2015/0357827 A1 | 12/2015 | Muratov et al. |
| 2016/0029266 A1 | 1/2016 | Choi-Grogan |
| 2016/0056664 A1 | 2/2016 | Partovi |
| 2016/0094051 A1 | 3/2016 | Soar |
| 2016/0104566 A1 | 4/2016 | O'Brien et al. |
| 2016/0118711 A1 | 4/2016 | Ummenhofer |
| 2016/0126002 A1 | 5/2016 | Chen |
| 2016/0149416 A1 | 5/2016 | Ha et al. |
| 2016/0156103 A1 | 6/2016 | Bae et al. |
| 2016/0156215 A1 | 6/2016 | Bae |
| 2016/0224975 A1 | 8/2016 | Na |
| 2016/0292669 A1 | 10/2016 | Tunnell |
| 2016/0294427 A1 | 10/2016 | Wojcik |
| 2017/0040691 A1 | 2/2017 | Singh et al. |
| 2017/0054213 A1 | 2/2017 | Singh et al. |
| 2017/0126544 A1 | 5/2017 | Vigneras et al. |
| 2017/0129344 A1* | 5/2017 | Islinger ............ B60L 53/126 |
| 2017/0368944 A1* | 12/2017 | Huang ............ H02J 7/025 |
| 2018/0166921 A1 | 6/2018 | Peralta |
| 2018/0167107 A1 | 6/2018 | Peralta |
| 2018/0167108 A1 | 6/2018 | Peralta |
| 2018/0167109 A1 | 6/2018 | Peralta |
| 2018/0167110 A1 | 6/2018 | Peralta |
| 2018/0168057 A1 | 6/2018 | Peralta |
| 2018/0212649 A1 | 7/2018 | Tenno |
| 2018/0337547 A1* | 11/2018 | Menegoli ............ H02J 7/0044 |
| 2019/0148061 A1* | 5/2019 | Lu ............... H01F 27/38 361/784 |
| 2019/0333676 A1* | 10/2019 | Shin ............... H01F 27/255 |
| 2020/0020478 A1* | 1/2020 | Nishimura ............ H01F 27/22 |
| 2020/0168385 A1* | 5/2020 | Handy ............... H01F 27/085 |
| 2020/0287419 A1 | 9/2020 | Sherman et al. |

FOREIGN PATENT DOCUMENTS

| | | |
|---|---|---|
| CN | 104037493 A | 9/2014 |
| CN | 104037494 A | 9/2014 |
| EP | 0310396 A | 4/1989 |
| EP | 2775565 A1 | 9/2004 |
| EP | 1609503 A1 | 12/2005 |
| EP | 2031729 A2 | 3/2009 |
| JP | 1-310518 | 12/1989 |
| JP | 5-83249 | 4/1993 |
| JP | 2008-307114 | 11/1996 |
| JP | 09-093005 | 4/1997 |
| JP | 10-255629 | 9/1998 |
| JP | 2001344574 | 12/2001 |
| JP | 2007-7042569 | 2/2007 |
| JP | 2008-160781 | 7/2008 |
| JP | 2008-205215 | 9/2008 |
| JP | 2008-294285 | 12/2008 |
| JP | 2012-147408 | 8/2012 |
| JP | 2013-93429 | 5/2013 |
| JP | 2014-175864 A | 9/2014 |
| JP | 2014-175865 A | 9/2014 |
| KR | 10-20100092741 | 8/2010 |
| KR | 10-2013-0015618 | 2/2013 |
| KR | 10-2014-0111554 A | 9/2014 |
| KR | 10-2014-0111794 A | 9/2014 |
| KR | 2014-0135357 | 11/2014 |
| KR | 10-1559939 B1 | 10/2015 |
| TW | 201436494 A | 9/2014 |
| TW | 201436495 A | 9/2014 |
| WO | 2008/050917 | 5/2008 |
| WO | 2010/104569 | 9/2010 |
| WO | 2019050157 A1 | 3/2019 |

OTHER PUBLICATIONS

EP Search Report 13001121.6.
EP Search Report 13001130.7.
EP Search Report 14000885.5.
Relative Permativity—Dielectric Constant—Jul. 2011 (3 pages).
Office Action dated Sep. 27, 2016 in corresponding EP Application No. 13 001 130.7 (6 pages).
Office Action dated Sep. 27, 2016 in corresponding EP Application No. 13 001 121.6 (6 pages).
Office Action dated Jan. 31, 2017 in corresponding JP Application No. 2013-047049 (5 pages).

(56) References Cited

OTHER PUBLICATIONS

Office Action dated Jun. 29, 2017 in corresponding EP Application No. 14000885.5 (4 pages).
Office Action dated Feb. 21, 2017 in corresponding TW Application No. 102108342 (10 pages).
Office Action dated Mar. 21, 2017 in corresponding JP Application No. 2013-047048 (12 pages).
International Search Report and Written Opinion dated Oct. 14, 2016 for PCT/US2016/045588 (10 pages).
International Search Report and Written Opinion dated Oct. 28, 2016 for PCT/US2016/047607 (9 pages).
International Search Report and Written Opinion dated issued in PCT/US2017/048708 dated Nov. 8, 2017 (10 pages).
Written Opinion and International Search Report issued in corresponding International Application No. PCT/US2017.065329 dated Feb. 21, 2018 (7 pages).
Office Action issued in corresponding Japanese Patent Application No. 2013-047048 dated Dec. 12, 2017 (11 pages).
Office Action issued in corresponding Chinese Patent Application No. 201310074946.8 dated Mar. 30, 2018 (12 pages).
Office Action issued in corresponding Chinese Patent Application No. 201310075086.X dated Mar. 27, 2018 (11 pages).
Office Action issued in corresponding Japanese Patent Application No. 2013-047048 dated May 8, 2018 (2 pages).
Decision of Dismissal of Amendment issued in corresponding Japanese Patent Application No. 2013-047048 dated May 8, 2018 (7 pages).
Office Action issued in corresponding Taiwanese Patent Application No. 102108345 dated Apr. 27, 2018 (11 pages).
Office Action issued in corresponding Japanese Patent Application No. 2013-047049 dated Nov. 28, 2017 (5 pages).
Office Action issued in corresponding Chinese Patent Application No. 201310075086.X dated Aug. 25, 2017 (13 pages).
Office Action issued in corresponding Chinese Patent Application No. 201310074946.8 dated Aug. 23, 2017 (13 pages).
Office Action issued in corresponding Chinese Patent Application No. 201310074946.8 dated Sep. 12, 2018 (9 pages).
Office Action issued in corresponding Chinese Patent Application No. 201310075086.X dated Sep. 12, 2018 (10 pages).
Notification of Reasons for Refusal issued in corresponding Korean Application No. 10-2013-0026135, dated Oct. 29, 2018, 12 pages.
Notification of Reasons for Refusal issued in corresponding Korean Application No. 10-2013-0025858, dated Oct. 29, 2018, 12 pages.
EP Office Communication Pursuant to Article 94(3) dated Jan. 17, 2019 for EP App. No. 13001121.6-1216.
EP Communication pursuant to Rule 164(1) EPC regarding partial supplementary European Search Report for EP App. No. 16835665.7-1212 dated Feb. 14, 2019, 20 pages.
Muratov, V., Multi-Mode Wireless Power Systems can be a bridge to the Promised Land of Universal Contactless charging, Mediatek, Inc., Nov. 20, 2014, 15 pages.
Qi 2010, "System Description Wireless Power Transfer", vol. 1, Low Power, Part 1: Interface Definition, Version 1.0.1, Oct. 2010, Wireless Power Consortium, 86 pages.
Narayanan, R., "Wireless Power Charging Coil Changing Considerations", Wurth Elektronik, Feb. 23, 2015, 9 pages.
Barcelo, T., "Wireless Power User Guide", Linear Technology, Application Note 138, Oct. 2013, 8 pages.
Yoon, Y., "Embedded conductor technology for micromachined RF elements", Journal of Micromechanics and Microengineering, Jun. 2005, 11 pages.
Burghartz, J., "On the Design of RF Spiral Inductors on Silicon", IEEE Transactions on Electron Devices, vol. 50, No. 3, Mar. 2003, pp. 718-729.
Qi 2009, "System Description Wireless Power Transfer", vol. 1, Low Power, Version 0.95, Jul. 2009, 76 pages.
Lee, Y., "Antenna Circuit Design for RFID Applications", 2003 Microchip Technology, AN710, 50 pages.
Sun, M., et al., "Apparatus for Wireless Power and Data Transfer Over a Distance", University of Pittsburgh, Jun. 2009, 30 pages.

IPR2019-00858—Petition for *Inter Partes* Review of U.S. Pat. No. 8,680,960, *Samsung Electronics Co., Ltd.* v. *NuCurrent, Inc.*, 90 pages.
IPR2019-00858—Ex. 1001 U.S. Pat. No. 8,680,960.
IPR2019-00858—Ex 1004—File History for U.S. Pat. No. 8,680,960.
Ex. 1002 Declaration of Dr. Steven Leeb, 115 pages.
Ex. 1003—CV of Dr. Steven B. Leeb, 7 pages.
Ex. 1005—US20070267718A1 to Lee, 13 pages.
Ex. 1006—Semat—Physics Chapters 29-32, 81 pages, (1958).
Ex 1009—US20090096413 to Partovi, 88 pages.
Ex 1010—IEEE Dictionary 1996 (excerpt), 9 pages.
Ex. 1011—US20070089773A1 to Koester et al., 26 pages.
Ex. 1012—US20120280765 to Kurs, 122 pages.
Ex. 1013—U.S. Pat. No. 6,432,497 to Bunyan, 12 pages.
Ex. 1014 U.S. Pat. No. 6,083,842 to Cheung et al., 8 pages.
Ex. 1015 Reinhold—Efficient Antenna Design of Inductive Coupled RFID—Systems with High Power Demand, Journal of Communication vol. 2, No. 6, Nov. 2007, 10 pages.
Ex. 1016 U.S. Pat. No. 4,549,042 to Akiba et al., 8 pages.
Ex. 1017—U.S. Pat. No. 5,812,344 to Balakrishnan, 12 pages.
Ex. 1018—Wheeler, Formulas for the Skin (1942), 13 pages.
Ex. 1019—Kyriazidou—7236080, 12 pages.
Ex. 1020 Alldred et al., "A 1.2 V, 60 Ghz radio receiver with onchip transformers and inductors in 90 nm CMOS," Proc. IEEE Compound Semiconductor Integrated Circuits SYmp., pp. 51-54, Nov. 2006 ("Alldred"), 12 pages.
Ex. 1022 U.S. Pat. No. 9,912,173 to Tseng, 31 pages.
Ex. 1023 U.S. Pat. No. 7,248,138 to Chiang, 18 pages.
Ex. 1024 U.S. Pat. No. 5,084,958 to Yerman et al., 20 pages.
Ex. 1025—US20070126544—Wotherspoon, 6 pages.
Ex. 1028—U.S. Pat. No. 9,820,374 to Bois et al., 9 pages.
Ex. 1029 U.S. Pat. No. 7,601,919 to Phan et al., 14 pages.
Ex. 1030 U.S. Pat. No. 5,108,825 to Wojnarowski et al., 10 pages.
Ex. 1031 Ahn 7305725, 9 pages.
Ex. 1032—U.S. Pat. No. 5,745,331 to Shamouilian et al., 23 pages.
Ex. 1033—Hu, et al., "AC Resistance to Planar Power Inductors and the Quasidistributed Gap Technique," IEEE Transactions on Power Electronics, vol. 16, No. 4, Jul. 2001 ("Hu"), 13 pages.
Ex. 1034—U.S. Pat. No. 6,608,363 to Fazelpour, 8 pages.
Ex. 1035—IEEE Xplore web page, 2 pages.
Ex. 1036 Kraemer et al., "Architecture Considerations for 60 GhzPulse Transceiver Front-Ends," CAS 2007 Proceedings vol. 2, 2007, Int'l Semiconductor Conference (2007), 26 pages.
Ex. 1037—Varonen et al., "V-band Balanced Resistive Mixer in 65-nm CMOS," Proceedings of the 33rd European Solid-State Circuits Conference (2007), 22 pages.
Ex. 1038—IEEE Xplore web page, 2 pages.
Ex. 1039—Lopera et al., "A Multiwinding Modeling Method for High Frequency Transformers and Inductors", IEEE Transactions on Power Electronics, vol. 18, No. 3, May 2003, 14 pages.
Ex. 1040—Leonavicius et al., "Comparison of Realization Techniques for PFC Inductor Operating in Discontinuous Conduction Mode," IEEE Transactions on Power Electronics, vol. 19, No. 2, Mar. 2004, 14 pages.
Ex. 1041—Roshen, W.A., "Fringing Field Formulas and Winding Loss Due to an Air Gap," IEEE Transactions on Magnetics, vol. 43, No. 8, Aug. 2007, 12 pages.
IPR2019-00859—Petition for Inter Partes Review of U.S. Pat. No. 9,300,046, 87 pages.
Ex. 1001 U.S. Pat. No. 9,300,046 to Singh et al., 50 pages.
Ex. 1004—Prosecution History of U.S. Pat. No. 9,300,046, 322 pages (in two attachments A and B) due to size.
IPR2019-00860—Petition for Inter Partes Review of U.S. Pat. No. 8,680,960, 86 pages.
IPR2019-00861—Petition for Inter Partes Review of U.S. Pat. No. 9,300,046, 89 pages.
IPR2019-00862—Petition for Inter Partes Review of U.S. Pat. No. 8,710,948, 88 pages.
Ex. 1001 U.S. Pat. No. 8,710,948 to Singh et al., 50 pages.
Ex. 1004 File History of U.S. Pat. No. 8,710,948 to Singh et al., 213 pages.
IPR2019-0863 Petition for Inter Partes Review of U.S. Pat. No. 8,698,591, 89 pages.

(56) References Cited

OTHER PUBLICATIONS

Ex. 1001 U.S. Pat. No. 8,698,591, 49 pages.
Ex. 1004—Prosecution History of U.S. Pat. No. 8,698,591, 180 pages.
EP Communication pursuant to Rule 62 EPC regarding extended European Search Report for EP App. No. 16835665.7-1212 dated May 15, 2019, 16 pages.
Notification of Decision of Rejection for KR App. No. 10-2013-0025858 dated May 14, 2019, English Translation, 8 pages.
Notification of Decision of Rejection for KR 10-2013-0026135 dated May 14, 2019, 8 pages with translation.
EP Communication of extended European Search Report for EP 19154162.2 dated Jun. 12, 2019, 9 pages.
PCT/US2020/042765 International Search Report and Written Opinion, dated Nov. 3, 2020, 13 pages.
First Office Action for Chinese App. No. 201680058731.9 dated Aug. 5, 2019, English Translation, 6 pages.
Extended Search Report for EP 19188841.1-1216 dated Sep. 10, 2019, 11 pages.

* cited by examiner

PREEMPTIVE THERMAL MITIGATION FOR WIRELESS POWER SYSTEMS

TECHNICAL FIELD

The present application relates to apparatuses, systems, and methods which comprise components, assemblies, modules, and constituents for a wireless power transfer (WPT) system.

BACKGROUND

A challenge with wireless power transfer involves a transmitting element being able to generate a sufficiently high concentration of magnetic field flux to reach a receiving element at a particular distance away.

Inductive wireless power transfer occurs when magnetic fields created by a transmitting element induce an electric field, and hence electric current, in a receiving element. These transmitting and receiving elements will often take forms of coils of wire. The amount of power that is transferred wirelessly depends on mutual inductance, which is a function of transmitter inductance, receiver inductance, and coupling. Coupling is measured in terms of a coupling coefficient ("k"), which quantifies how much magnetic field is captured by a receiver coil.

Coupling will decrease when distance increases between a transmitting element and a receiving element. This leads to lower mutual inductance, and less power transfer. This effect can be counteracted by increasing transmitter inductance and/or receiver inductance. One disadvantage is that doing so causes equivalent series resistance (ESR) to increase, which leads to more heat and greater energy losses.

When designing present-day systems, electronics and magnetics designers must make trade-offs, since designs which transmit power effectively at larger distances usually create greater electromagnetic interference (EMI) and higher heat levels. Moreover, components of an electrical system can be damaged or forced to shut down if heat levels rise excessively. Excess heat can also degrade battery life.

Examples of situations where longer-distance wireless power transfer would be helpful include harsh environments where sizable housings or barriers must be placed around equipment, thereby preventing a transmitting coil and a receiving coil from being positioned near to one another. Other, similar examples include situations where accessories—such as a hand strap, a phone cover, a card holder, a case, a vehicle mount, a personal electronic device accessory, a phone grip, and/or a stylus holder—must be positioned between a transmitting coil and a receiving coil.

Longer-distance wireless power transfer is often also limited by the design of the device being charged, the design of the charging system, or both in combination. For example, the size and number of devices requiring charging may not allow for longer-distance charging. Likewise, the size and design of the charging system may pre-determine a maximum charging distance for a device, which is less than the distance needed by the device to be charged. Present-day charging systems which require devices be placed within a charging bay, or in contact with the charging bay, may preclude charging over-sized devices. Even multi-bay systems have left this issue unresolved. An example where size and number of devices needing re-charge matter, and where bay or multi-bay charging systems are needed, is in industrial warehouses where multiple inventory tracking devices require simultaneous charging, especially overnight or in between shifts.

Another issue affecting efficacy of present-day multi-device charging at longer distances is that charging efficacy generally requires proper alignment of each power receiving device with the power transmitter. Transmitter housing designs that mechanically align a receiver and a transmitter or transmitter circuitry in a charging system, whether provided on one singular printed circuit board or multiple printed circuit boards, or even when WPT coils may be driven by multiple controllers or one controller, do not resolve the above issues discussed.

Yet another issue for present-day longer-distance charging relates to the limitations and challenges that exist in detection of whether objects are even acceptable for charging or whether they are really "foreign" objects that may negatively impact the quality of charging intended for acceptable devices. Foreign object detection can be challenging because many times it is difficult to develop schemes to appropriately differentiate between a foreign object and a valid object. Generally, a foreign object is detected by a power loss that it generates in overall power transfer. In cases of extended z (or vertical) height and large-volume charging, the acceptable losses in a system are substantially higher, hence, increasing the difficulty to determine whether a foreign object is present or not.

In cases where operating distance has been increased, significant amounts of current must also be passed through a transmitter system, coil, and associated components in order to transfer adequate power to a receiver. This increased current creates heat and often causes the transmitter system to rise in temperature over time. In many cases, this rise in temperature eventually trips an overheat fault and shuts down the entire WPT system, disrupting charging service for the user. Traditional thermal mitigation techniques have been applied, including heat dissipating components such as heatsinks, ridges, fans, etc.; however, product or system requirements can frequently make these difficult or impossible to use.

Challenges also exist in the area of communication of data in wireless power transfer systems. Many modern power transfer systems are dependent on data communication between a power transmitter and a power receiver, which allows appropriate adjustments to be made that maintain charging effectiveness. (Data transfer and power transfer may be done by utilizing a single antenna, or different antennas.) However, oftentimes there may be other antennas or devices in close proximity which use similar communication methodologies, and which can make is difficult to differentiate and appropriately filter messages that are required for effective and/or efficient wireless power transfer. In addition to the above, challenges also exist in handling larger currents required for a system to provide power at a specified distance and frequency of operation. Therefore, component selection is critical to ensure a reliable and safe operating system.

Electrical systems have other limitations in certain use cases that must be factored in when designing a WPT system. System components such as ferrite, which enhance performance of wireless power transfer, can be vulnerable to cracks or breakage if subjected to sudden impact or high stress. Heat buildup is yet another issue; for example, excessive and/or prolonged exposure at elevated temperatures can cause component damage, or can force a system slowdown or shutdown, limiting reliability and utility of the electrical system. Additionally, thermal issues usually limit wattage which can be transferred in a system such as a wireless power system. This is the case because, given constant voltage, higher wattage transfer levels will require more electric current, and higher current levels cause exponentially more heat to be generated due to electrical resistance.

In general, heat-dissipation features in electronics use a heat-conducting material (such as metal) to remove heat from an apparatus. If this heat-conducting material possesses a large surface area which is exposed to air or another surrounding environment, heat is transferred to a surrounding environment efficiently and carried away from the apparatus. Larger surface areas result in more effective heat dissipation, and can be obtained by using larger amounts of heat-conducting material, and can also be obtained with adaptations such as fans, fins, pins, bars, and/or other protrusions. Specialized features used to dissipate excess heat in this way are often referred to as "heat sinks." However, existing systems with heat-dissipation features are often limited because their heat sinks are made of metal, which means magnetic fields can couple to them and increase heat generation by, for example, inducing eddy currents. Moreover, existing heat dissipation features are frequently costly to make, and might require exotic materials and/or significant space. Finally, and more importantly, heat sinks that are made out of metal will not always provide adequate electromagnetic interference (EMI) protection, since they are not grounded to a main ground plane.

In addition to the above, it is important to note that heat dissipation is critical for multi-bay solutions, where two or more transmitters and two or more receivers are built into a system. With heat-generating components located near each other, their combined effect may raise temperature to unacceptable levels quicker than in a single charged system. More powerful power supplies are used to deliver power to multi-bay systems, and such systems require longer cables to deliver power from the power supply to every single bay. This results in higher losses that generate more heat. For such hardware configurations, it becomes critical to redirect heat from where it is generated to where it can be dissipated into a surrounding environment. If cooling with natural convection and conduction is not enough to keep such systems at safe temperature levels, active cooling (with fans or other similar subsystems) has to be used. This further increases complexity and ownership cost of such systems.

In general, present-day wireless power systems operate over short distances. For example, typical Qi™ systems use a 3 mm-5 mm coil-to-coil distance range. As such, there is a need for a power-transmitting system which limits electromagnetic interference and heat creation, while also transmitting an acceptable amount of power at extended distances. Additionally, there is a need to provide a system that can operate in a low frequency range of 25 kHz-300 kHz.

Likewise, with "multi-up" charging stations packing multiple wireless charging transmitter systems closer together, inter-system interference levels increase. These effects are amplified when the systems operate on the same technology, i.e., 2 Qi™ transmitters. Therefore, there is a need to address unintended inter-system interaction once a coil's center is within approximately 3 times the diameter of a nearby coil. This is true for coils used for power and/or data transfer.

Additionally, in present-day WPT systems, a power transmitting unit (PTU) can only support communication with a single power receiving unit (PRU), for systems that transfer data between PRU and PTU by modulating information on top of a standing carrier wave. In other words, for every PRU, the system needs a complete PTU. This increases a final price of the charging system as a function of how many PRUs must be supported, as well as the cost of a PTU [System Cost is proportional to (#PRUs)*(#PTUs)]. Also, for the systems described above, bandwidth (BW) of a data channel is limited by carrier frequency and modulation frequency, $f_m$, where $BW=2*f_m$. Additionally, magnitude of amplitude modulation, AM, directly impacts instantaneous impedances seen by a transmitter power amplifier, PA. (With larger impedance changes, more stable and tolerant power amplifiers are required.) Hence, there is also a need for a more rugged, less costly solution.

SUMMARY OF THE INVENTION

This system comprises features which allow the transfer of more power wirelessly at longer ranges, extended distances and larger volumes than present-day systems operating in the same or similar frequency or frequency range. The system possesses optional heat dissipation features. These features allow effective operation at the longer ranges, extended distances and larger volumes without excessive temperature rise and/or in elevated-temperature environments. The system may incorporate rugged design features that withstand shock, vibration, drops and impacts. The system may also include electromagnetic interference (EMI) mitigation features, custom shaped components fabricated from particular materials that enhance system performance, or system and/or module electronics that support or direct system conditions and/or performance. Antenna and/or battery integration options are also included.

According to various embodiments of the present disclosure, provided are components, assemblies, modules, and methods for wireless power transmission (WPT) systems that transfer more power wirelessly at longer ranges, extended distances and larger volumes than other systems operating in the same or similar frequency ranges. The various embodiments disclosed herein generally apply to power-transmitting (Tx) and/or power-receiving (Rx) systems, apparatuses, transmitters, receivers and related constituents and components. Also, according to various embodiments of the present disclosure, disclosed are features, structures, and constructions for limiting electromagnetic interference (EMI) levels, managing excess heat, ruggedizing to withstand shock, vibration, impacts and drops, detecting foreign objects, communicating data effectively, and maximizing efficiency of, between and across multiple wireless power transmitters, each individually or all simultaneously.

Further, the various embodiments of the present disclosure are applied to either a Qi system, Qi-like system, or similar low frequency systems so that when the embodiments within are incorporated into such systems, the embodiments within enable the transfer of more power by these systems at a longer range, an extended distance and a larger volume. This is accomplished by redirecting, reshaping and/or focusing a magnetic field generated by a wireless Tx system so that at longer ranges, extended distances and larger volumes the magnetic field changes. The present application provides various embodiments of coil design, firmware settings (which affect the control loop), and mitigation of heat features (which may have significant temperature rise due to the electrical current required in order to reach these longer ranges, extended distances and larger volumes), which may each be incorporated within such systems separately or in combinations thereof.

In some embodiments disclosed, a component, an assembly, a module, a structure, a construct or a configuration comprises one or more protective materials, wherein the one or more protective materials avoids or suppresses one of a movement, a stress, a pressure, an impact, a drop, a shock, a vibration, or combinations thereof. In some embodiments, the protective material comprises one of a foam, an adhesive, a resin, an elastomer, a polymer, a plastic, a composite, a metal, an alloy, an interface material, a pad, a plate, a block, a sheet, a film, a foil, a fabric, a weave, a braid, a mesh, a screen, an encapsulation, or a custom form, and combinations thereof. In some embodiments, the protective material comprises one or more pressure-sensitive adhesives. In some embodiments, the protective material comprises one or more encapsulations. In some embodiments, the one or more encapsulations comprises one or components. In some embodiments, the one or more encapsulation components comprise at least one of the protective materials listed above. In some embodiments, the one or more encapsulations surround one or more individual components of a power system. In some embodiments, the one or more encapsulation components comprise a bracket, a holder, a brace, and/or a mechanical support construct.

Embodiments disclosed herein comprise a component, an assembly, a module, a structure, a construct or a configuration comprising one of a magnetic material, a ferrimagnetic material, or combinations thereof, wherein the component, the assembly, the structure, the construct or the configuration reshapes a magnetic field generated by a wireless power transmitter so that the magnetic field is more concentrated at a distant position or at a spatial volume location at or within which a power receiver resides. Such magnetic field concentration increases coupling between the transmitter and the receiver, resulting in more efficient power transfer. Some embodiments further comprise a component, an assembly, a module, a structure, a construct or a configuration having one of a magnetic material, a ferrimagnetic material, or combinations thereof, wherein the component, the assembly, the structure, the construct or the configuration comprises a magnetic material, the magnetic material comprising a surface having a surface area, wherein the surface of the magnetic material comprises one or more horizontal planes, each horizontal plane optionally comprising one or more projections extending vertically from at least one of the one or more horizontal planes.

Embodiments disclosed comprise features which dissipate heat more effectively than present-day power-transmitting (Tx) systems, limiting heat buildup and creating new options for using the subject technology in a wide range of applications. Some embodiments comprise one or more power transmitting coils positioned over a metal chassis, the metal chassis configured to dissipate heat.

Embodiments can be especially useful in demanding applications, for example, when operating in elevated temperature environments, within limited spaces, at high power, at high electrical currents, at high voltages, using costly active cooling devices, and the like. In such cases, components must remain below a certain temperature to operate effectively. For example, one reason that typical wireless power systems are not used for extended-range or extended-power applications is because doing so would increase voltage and current, causing excessive heat buildup that could endanger operations and possibly cause a system shutdown. Specifically regarding using active cooling devices, embodiments of the present application dissipate heat without active cooling, which has the added benefit of lowering cost. However, heat dissipating embodiments of the present application may be configured to comprise active cooling. The active cooling may further comprise a mechanical structure and/or a liquid cooling structure. Some embodiments effectively dissipate heat, allowing continued operation of systems and processes even when operating requirements and or conditions cause significant heat to be generated.

Embodiments disclosed herein comprise a magnetic material backing with a magnetic material core, wherein the magnetic material backing with the magnetic material core increases coupling by focusing magnetic fields in a more uniform direction. The magnetic material backing with the magnetic material core comprises one of a flat configuration, a "top hat", a T-core, a T-shape, an E-core or an E-shape magnetic material structure. The magnetic material structure further comprises a base having a thickness and one or more protrusions or other separate structures residing either above that base or below the base, with or without one or more projections. The resulting increase in coupling between a transmitter and a receiver translates into more effective power transfer, even if distance between a transmitter and receiver is increased. In some embodiments, the magnetic material backing is of a larger dimension than is typically found in standard present-day WPT systems, which provides a transmitter that offers higher efficiency than the WPT systems of today. This higher efficiency is in addition to the extended-distance and volume performance, which present-day WPT systems typically cannot do. Hence, this offers particular advantage in use cases where having a compact transmitter is less important than having higher wireless power transfer efficiency at longer ranges, extended distances and larger volumes.

Some embodiments disclosed herein include a single coil, a multi-layer coil, a multi-tiered coil, or combinations thereof. In some embodiments the single coil, the multi-layer coil, the multi-tiered coil, or the combinations thereof reside on one or more planes. Coils residing on one or more planes further increase coupling and spatial freedom between the wireless transmitter and the wireless receiver. One or more single coil, multi-layer, multi-tiered coil or combinations thereof are positionable on, at, near or adjacent a magnetic material. One or more single coil, multi-layer, multi-tiered coil or combinations thereof may comprise a first coil portion positioned on, at, near or adjacent a first magnetic material, and a second coil portion positioned on, at, near or adjacent a second magnetic material. One or more single coil, multi-layer, multi-tiered coil or combinations thereof may comprise a coil portion positioned on, at, near or adjacent n-number of magnetic materials. The multi-layer and multi-tiered coils may be connected in series, may reside in one or more horizontal planes, or both. Some embodiments comprise either a Tx coil, an Rx coil, or both, wherein the Tx coil, the Rx coil, or both comprise one of a single coil, a multi-layer coil, a multi-tiered coil, or combinations thereof, wherein the Tx coil, the Rx coil, or both are positioned on, at, near or adjacent one of a magnetic material, a magnetic material comprising multiple pieces, or one or more magnetic materials. The magnetic material comprising multiple pieces, the one or more magnetic materials, or both may further comprise the same material or two or more different magnetic materials. Two or more Tx coils, or the Rx coils and their respective driving circuitry may be each be configured to be controlled by a common controller, or alternately each may be controlled by its own unique controller. Some embodiments comprise either a Tx coil, an Rx coil, or both, wherein the Tx coil, the Rx coil, or both comprise one of a single coil, a multi-layer coil, a multi-tiered coil, or combinations thereof, wherein the single coil, the multi-layer coil, the multi-tiered coil, or combinations comprise one or more extended connection ends, wherein a portion of at least one of the extended connection ends comprises an insulating material. The insulating material may further be configured to surround only the at least one extended connection end. In this case, the insulating material does not surround any portion of the wire of the coil structure. In some embodiments, a power system comprises one of a single coil, a multi-layer coil, a multi-tiered coil, or combinations thereof. A multi-layer or a multi-tiered coil may further comprise a first coil part positioned within a first plane and a second coil part positioned within a second plane. In some embodiments, a multi-layer or multi-tiered coil is an antenna configured to transfer power, energy and/or data wirelessly.

Embodiments disclosed herein provide power transfer at distances of about 5 mm to about 25 mm, when the wattage range is greater than 1 nW up to 30 W. These power transfer distances are further provided while operating at Qi™ frequencies, that is, 25 kHz-300 kHz. Present-day configured Qi™-compatible system typically operate at distances of only 3 mm to 5 mm to effectively transfer power wirelessly.

Embodiments disclosed herein provide reduced EMI. Some embodiments provide reduced EMI by operating at a fixed frequency, and some embodiments provide reduced EMI while operating at a variable frequency.

The embodiments and descriptions disclosed in this specification are contemplated as being usable separately, and/or in combination with one another. Furthermore, in this disclosure, the terms "bracket" and "brace" are used interchangeably. The terms refer to a component which is configured to hold other components in place, and which might also be configured to provide features such as thermal conductivity, electrical conductivity, thermal insulation, electrical insulation, or combinations thereof.

Some embodiments comprise one or more circuit boards, circuitry, and/or firmware. In some of these embodiments, the circuit board comprises a printed circuit board (PCB).

Circuitry is defined herein as a detailed plan or arrangement of a circuit or a system of circuits that performs a particular function in a device or an apparatus. The circuit provides a line or path along which power, energy or data travels, such as in driving, sending, accepting, broadcasting, communicating, dissipating, conducting or carrying a signal, power, energy and/or data. In some embodiments, the circuitry is a conditioning circuitry. Some embodiments may comprise one or more driving circuits. Two or more driving circuits may be replicas of one another. Two or more driving circuits may reside on either a single circuit board or two or more circuit boards. In some embodiments, the conditioning circuitry comprises a resistor network. In some embodiments, the conditioning circuitry specifies a threshold for activation. The activation threshold is a protection and/or an operation threshold comprising one of an over voltage protection (OVP), an under voltage protection (UVP), an over current protection (OCP), an over power protection (OPP), an over load protection (OLP), an over temperature protection (OTP), a no-load operation (NLO) a power good signal, and combinations thereof. In some embodiments, the conditioning circuitry comprises a positive temperature coefficient (PTC) fuse. In some embodiments, one or more of the PTC fuses is resettable. In some embodiments, the conditioning circuitry comprises one or more field-effect transistors (FETs). In some embodiments, one or more FETs comprise a P-channel or P-type metal oxide semiconductor FET (PMOSFET/PFET) and/or an N-channel or N-type metal oxide semiconductor FET (NMOSFET/NFET). Some embodiments comprise one of an FET, an NFET, a PFET, a PTC fuse, or combinations thereof. Some embodiments further comprise one of an FET, an NFET, a PFET, a PTC fuse, or combinations thereof within one or more integrated circuits, one or more circuit boards, or combinations thereof. Some embodiments comprise conditioning circuitry comprising components having current ratings of 4 A-10 A. Some embodiments comprise one or more Q factor sensing circuits having a resistor comprising a power rating of 0.5 W. Some embodiments comprise one or more coil tuning capacitors having a voltage rating of 100 V-400 V. Such a voltage rating mitigates damage of, for example, coil tuning capacitors while operating at power transfers up to 30 W. Some embodiments comprise one or more inductors having power conversion current saturation ratings of 7 A-20 A. Such ratings prevent damage to wireless power system circuitry while operating at power transfers up to 30 W and/or when subjected to large in-rush currents. Some embodiments comprise one or more resistors having an electrical resistance of about 10 k ohms to about 150 k ohms. The one or more resistors may be used to demodulate communication.

Firmware is a specific class of software with embedded software instructions that provides a control function for a specific hardware. For example, firmware can provide a standardized operating environment, allow more hardware-independence, or, even act as a complete operating system, performing all control, monitoring and data manipulation functions. In the present application, firmware provides instruction for sending, accepting, broadcasting, communicating, dissipating, conducting or carrying a signal, power, energy and/or data with other devices or apparatuses so that a function is performed. Some embodiments comprise firmware comprising an instruction, the instruction comprising one of a tuning instruction, a detection instruction, an authentication instruction, a settings instruction, a verification instruction, an interrogation instruction or combinations thereof. The firmware instruction may further comprise one of tuning, adjusting, foreign object detection (FOD), authentication, authentication mediation, verification, interrogation, and/or power requirement detection. Any of these may be executed dynamically, and may further be based on inputs received in real time. In some embodiments, the instruction provides functional instruction to a component, an assembly, a module, a structure, a construct or a configuration. For example, a firmware may adjust coil gain, mediate authentication between a transmitter and a receiver prior to starting wireless power transfer, and/or differentiate between a foreign object and an acceptable object by interrogating the electronics or firmware of each before initiating the function. In some embodiments, a firmware works in concert with electronics to interrogate and/or verify an object is foreign or acceptable before and/or after power transfer. In some embodiments, firmware dynamically adjusts FOD limits by learning from previous receiver data.

Some embodiments comprise controller firmware comprising an instruction to limit an amount of current passing through a transmitter coil. The current limit may further be statically set by a system designer. The current being passed through the transmitter coil can be varied by methods that include but are not limited to: frequency modulation, amplitude modulation, duty cycle modulation, or combinations thereof. In some embodiments, controller firmware comprises an instruction to limit an amount of current passing through a transmitter coil based on a static threshold that is programmed into a controller. In some embodiments, controller firmware comprises an instruction to limit an amount of current passing through a transmitter coil, wherein the limit can be dynamically calculated based on a data set of parameters that is either pre-programmed or measured directly on a transmitter device. These parameters may include, but are not limited to: ambient temperature, magnetic field strength, system input current (especially if multiple transmitters are being used), or combinations thereof. Some embodiments comprise a controller firmware comprising an instruction to synchronize two or more wireless power systems. The controller firmware synchronization instruction may further comprise one of an instruction to reduce idle power, an instruction to control a total maximum delivered power, an instruction to control a total maximum delivered power to each of one or more receivers, an instruction to optimize power delivery compliant with a system thermal threshold limits, or combinations thereof. Some embodiments comprise a controller firmware comprising an instruction to optimize power delivery between multiple receivers. The controller firmware optimization instruction may further comprise an instruction that is based on one of a maximum allowable thermal rise, a maximum allowable voltage, a maximum allowable current, or combination thereof in either a receiver or a transmitter. Some embodiments comprise a controller firmware comprising an instruction to vary one of one or more duty cycles, one or more voltages, one or more frequencies, or combinations thereof of a driving circuitry. The varying instruction may further comprise one of an instruction to maximize efficiency across one or more wireless power transmitters simultaneously, an instruction to maintain a single operating frequency, an instruction to tune to a maximum efficiency, or combinations thereof. Embodiments comprise a controller firmware comprising an instruction. Embodiments comprise a controller, wherein the controller operates at a variable frequency comprising range of 25 kHz-300 kHz.

Some embodiments comprise a bracket or holder, the bracket or holder further comprising a container, a receptacle, a case, a casing, a cover, a covering, a housing, a sheath, a stand, a rest, a support, a base, a rack, or combinations thereof. The bracket or the holder in some embodiments provide one of heat conductivity, heat dissipation, thermal conductivity, thermal insulation, electrical conductivity, electrical insulation, mechanical stability, mechanical support, structural ruggedness where said mechanical bracket is also configured to provide mechanical stability. The bracket may be mechanical, a board or an assembly of various individual components assembled to fasten, hold support and/or shield a power system, a power-generating system, a power-transmitting system, a power-receiving system, or assemblies, modules and combinations thereof.

Some embodiments comprise one or more components configured to provide thermal conductivity, thermal insulation, electrical conductivity, electrical insulation, electrical grounding, structural integrity, or combinations thereof.

Some embodiments comprise one or more components with magnetic and/or ferrimagnetic properties which are configured to enhance inductive electrical coupling. The components with magnetic and/or ferrimagnetic properties further comprise a portion which is positioned next to, behind, under or below an antenna coil. Some embodiments, alternately comprise one or more components with magnetic/ferrimagnetic properties, wherein at least one component is either partially or completely surrounded by an antenna coil. Some embodiments comprise one or more components with magnetic/ferrimagnetic properties. The one or more components with magnetic/ferrimagnetic properties may further comprise a first portion positioned under an antenna coil and a second portion surrounded by an antenna coil, or vice versa. Each antenna coil may comprise the same coil material, coil wire type, and/or coil construction, a different coil material, coil wire type, and/or coil construction, or combinations thereof. The first and second portions of the one or more components with magnetic/ferrimagnetic properties may further be positioned one atop another. In some embodiments, said second portion is positioned atop said first portion, or vice versa. In some embodiments, one of an apparatus, a device, an assembly, a module, or a power system comprises one or more components with magnetic/ferrimagnetic properties, or comprises a component with one of a first magnetic/ferrimagnetic material and a second magnetic material, wherein the first and second magnetic/ferrimagnetic materials each may be the same or each may be different. In some embodiments, one of an apparatus, a device, an assembly, a module, or a power system comprises a third magnetic/ferrimagnetic component which is positioned partially within or fully within a coil. Said coil may further comprise a single coil, a multi-layer coil, or a multi-tiered coil. In some embodiments, the third magnetic/ferrimagnetic component further comprises a coil, wherein the coil is a wound coil, and wherein the wound coil is either partially or fully wound.

Some embodiments comprise one or more thermal insulator materials. In some embodiments, one or more thermal insulator materials comprise foam.

In some embodiments, the apparatus comprises one or more empty gaps, positioned between heat-generating components and one or more outer surfaces. The one or more empty gaps further comprise air.

In some embodiments, the apparatus comprises an electronic component comprising one or more pass-through holes, wherein said one or more pass-through holes are connectable to one or more of a coil, a wire, a wire connection end or a conductor. The one or more pass-through holes are further connectable by a conductive plating surrounding at least one of the one or more pass-through holes. The one or more pass-through holes are alternately connectable by one of a via, a solder, a tab, a wire, a pin, a screw, a rivet, or combinations thereof.

Some embodiments comprise one or more components with at least one notch. The at least one notch further comprises one or more indentations. Such notches and/or indentations manage the development of eddy currents due to current passing through a coil.

Some embodiments comprise a coil or a conductor, wherein the coil or the conductor comprises one or more connection ends. In some embodiments, the one or more connection ends are bent at an angle ranging from about 70° up to about 110°.

Some embodiments disclosed herein comprise an inverter. The inverter is configured to operate in an apparatus, a device, an assembly, a module, or a power system. In some embodiments, the inverter is a full-bridge inverter configured to operate at a fixed frequency. In some embodiments, the inverter is a half-bridge inverter that is configured to operate at a fixed frequency.

Some embodiments disclosed herein comprise a power receiver or a power-receiving system, wherein the power receiver or the power-receiving system comprises a spacer. Said spacer is further positioned between a receiving coil and a battery. In some embodiments, said spacer is positioned between a magnetic/ferrimagnetic component and a battery. In some embodiments, the power receiver or the power-receiving system is a module. Said module further comprises one or more antennas, one or more battery packs, one or more batteries, or combinations thereof.

Some embodiments comprise a power transfer system, wherein one of a power, an energy or data are transmitted to two or more receivers, wherein the two or more receivers comprise one of a different electrical load, a different profile, or both. Some embodiments comprise a Tx system, wherein data transfer to one or more receiving devices comprises a data antenna different from a power antenna. Some embodiments comprise a Tx system, wherein one or more transmitters dynamically assign a frequency or a frequency range. Some embodiments comprise a Tx system, the assigned frequency or frequency range of the one or more transmitters minimize noise and/or mitigate and/or manage an effect of a source of the noise. Some embodiments comprise two or more wireless power systems contained within a single mechanical housing. The single housing may further comprise mechanical alignment features for aligning either transmitters and receivers, Tx and Rx coils, Tx and Rx modules or Tx and Rx assemblies. Some embodiments comprise a housing, wherein the housing comprises a mechanical alignment feature comprising either a flat or a non-flat surface. Non-flat alignment surfaces are further configured to align a center or centers of one or more Tx coils to a center or centers of one or more Rx coils. The alignment center or centers of the of one or more Tx coils to the one or more Rx coils comprises a maximum offset of 10 mm. Some embodiments comprise a multi-bay system, the multi-bay system comprising one or more transmitters and one or more receivers. Some embodiments further comprise a transmitter housing, the transmitter housing may further be configured to ensure alignment between each of the transmitter and the receiver coils. Some embodiments comprise a wireless power controller configured to measure current passing through a transmitter coil. The wireless power controller further comprises one of a circuit for measuring voltage over a small resistor, a tuning capacitor in series with the transmitter coil, a magnetic current sensing element, or combinations thereof. Some embodiments are configured to vary power by one of a frequency modulation, an amplitude modulation, a duty cycle modulation, or combinations thereof. Some embodiments may further be configured to vary power to individual Rx apparatus or device by one of a frequency modulation, an amplitude modulation, a duty cycle modulation, or combinations thereof. Some embodiments comprise firmware comprising an instruction for varying power by one of a frequency modulation, an amplitude modulation, a duty cycle modulation, or combinations thereof. Some embodiments comprise firmware further comprising an instruction for varying power by one of a frequency modulation, an amplitude modulation, a duty cycle modulation, or combinations thereof. Some embodiments may be configured to manage heat generated by a constituent or a component of a Tx and/or an Rx apparatus or device in addition to varying power by one of a frequency modulation, an amplitude modulation, a duty cycle modulation, or combinations thereof.

In some embodiments, a transmitter communicates with a receiver and a wireless power connection is negotiated between them. In some embodiments, a current limit may be programmed as a static value; this static value may be a maximum current level that is passed through a transmitter coil without causing an over-temperature fault. In some embodiments, a current limit can be dynamically calculated using data from a table and/or data from sensor measurements. In some embodiments, a transmitter controller is configured to vary current going through a transmitter coil in order to reduce transmitter power losses. In some embodiments, a transmitter controller is configured to negotiate a power connection with a receiver during an initial handshake and can be configured to deny any further power increases if measured transmitter coil current exceeds a set current limit and/or a certain temperature limit. In some embodiments, this negotiation is dynamic. In some embodiments, a transmitter controller is configured to negotiate a power connection with a receiver during an initial handshake and change a power transfer connection to a lower power scheme to reduce transmitter coil current based on a set current limit and/or a temperature limit. In some embodiments, this negotiation is dynamic. In some embodiments, a transmitter or receiver is configured to periodically renegotiate a wireless power connection, and a transmitter controller can deny any further power increases to a receiver based on a set current limit. In some embodiments, a transmitter or receiver is configured to periodically renegotiate a wireless power connection, and a transmitter controller can change a power transfer connection to a lower power scheme to reduce transmitter coil current based on a set current limit. In some embodiments, a controller is configured to encode/decode data using a time slotting technique. In some embodiments, a controller is configured to encode/decode data using frequency modulation, FM. In some embodiments, a controller is configured to encode/decode data using coding modulation (CM), such as but not limited to Hadamard/Walsh code. In some embodiments, a controller is configured to encode/decode data using impedance modulation (IM) by dynamically adjusting impedance of coupled coils. In some embodiments, a controller is configured to implement analog and/or digital filtering. In some embodiments, a Tx controller is configured to select operating frequency based on sensing spectral intensity of available operating frequencies. In some embodiments, a power-receiving (Rx) controller is configured to dither an encoding frequency to reduce spectral peak energy associated with Rx data generation. In some embodiments, a Tx controller is configured to dither an operating frequency to reduce spectral peak energy associated with carrier wave generation. In some embodiments, a Tx controller is configured to dither an operating amplitude to reduce spectral peak energy associated with carrier wave generation.

Other principal features and advantages of the invention will become apparent to those skilled in the art upon review of the following drawings, the detailed description, and the appended claims

BRIEF DESCRIPTION OF THE DRAWINGS

FIG. 1 is absent a power-transmitting coil assembly.

DETAILED DESCRIPTION OF THE INVENTION

Figure 1:
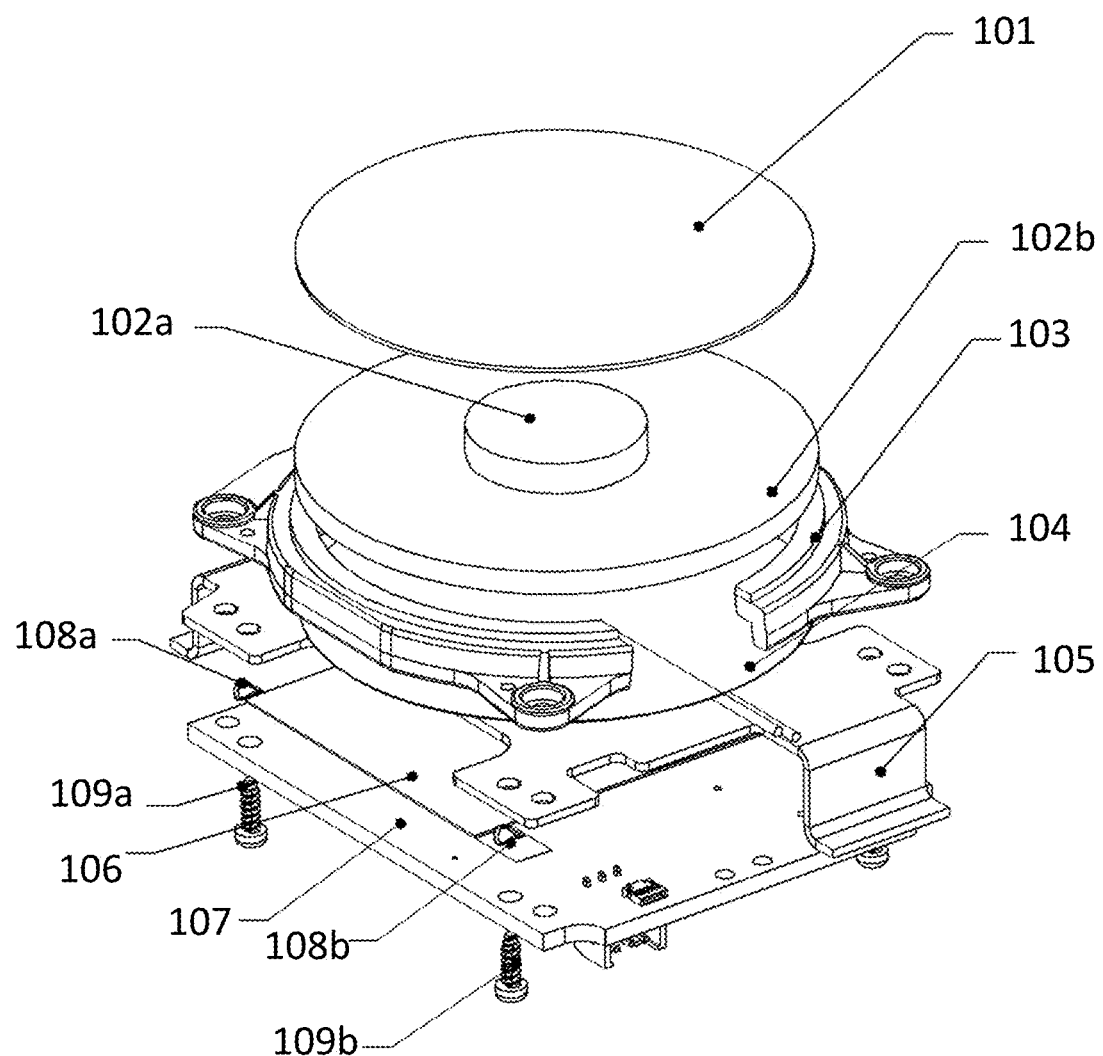
FIG. 1 illustrates an exploded perspective view of a portion of a power-transmitting (Tx) system embodiment.

The following detailed description of the present application refers to the accompanying figures. The description and drawings do not limit the subject technology; they are meant only to be illustrative of example embodiments. Other embodiments are also contemplated without departing from the spirit and scope of what may be claimed.

In the following description, numerous specific details are set forth by way of these examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Referring now to the drawings, embodiments of the subject technology are shown and disclosed.

FIG. 1 illustrates an exploded perspective view of a portion of a power-transmitting (Tx) system 100 embodiment. The constituents shown include an electrically insulating material 101, a magnetic material 102a, 102b, a bezel 103, an adhesive 104, a bracket 105, a thermal gasket 106, a circuit board 107, a metal spring washer 108a, 108b, and a screw 109a, 109b.

Figure 2:
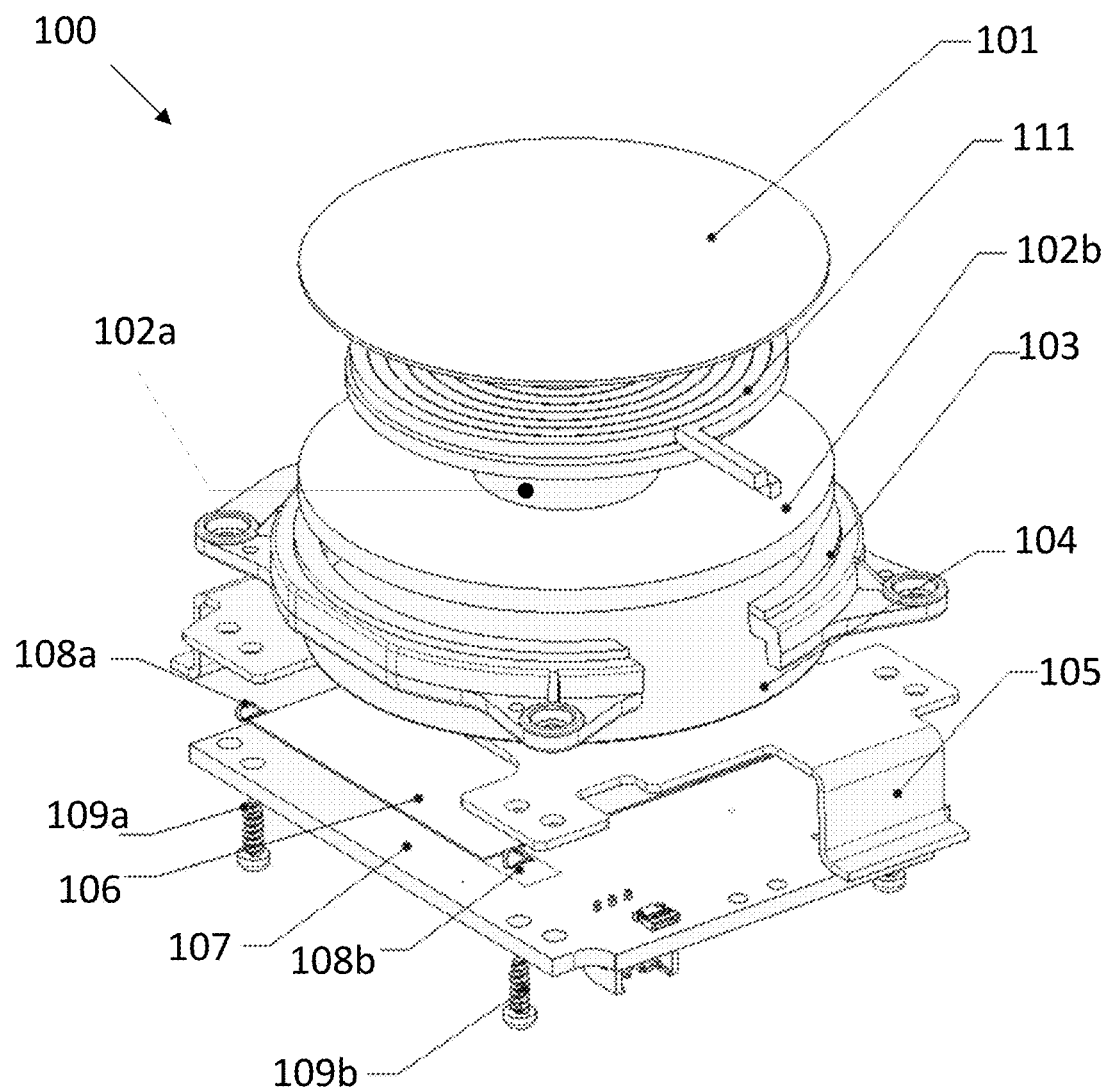
FIG. 2 illustrates an exploded perspective view of a Tx system embodiment showing the constituents of FIG. 1 and a power-transmitting coil assembly.

FIG. 2 illustrates an exploded perspective view of a Tx system embodiment having the constituents of FIG. 1 and a power-transmitting (Tx) coil 111 component. The Tx coil 111 comprises an electrically conductive wire. A wire is a conductor. As defined herein, the word "wire" is a length of electrically conductive material that may either be of a two dimensional conductive line or track with negligible thickness that may extend along a surface, or alternatively, a wire may be of a three dimensional conductive line or track having a defined thickness or diameter that is contactable to a surface. A wire may comprise a trace, a filar, a filament or combinations thereof. A "trace" is an electrically conductive line or track that may extend along a surface of a substrate. The trace may be of a two dimensional line that may extend along a surface or alternatively, the trace may be of a three dimensional conductive line that is contactable to a surface. A "filar" is an electrically conductive line or track that extends along a surface of a substrate. A filar may be of a two dimensional line that may extend along a surface or alternatively, the filar may be a three dimensional conductive line that is contactable to a surface. A "filament" is an electrically conductive thread or threadlike structure that is contactable to a surface. These elements may be a single element or a multitude of elements such as a multifilar element or a multifilament element. Further, the multitude of wires, traces, filars, and filaments may be woven, twisted or coiled together such as a Litz wire, a ribbon, or a cable. The wire as defined herein may comprise a bare metallic surface or alternatively, may comprise a layer of electrically insulating material, such as a dielectric material that contacts and surrounds the metallic surface of the wire.

The Tx coil 111 of FIG. 2 is a round coil, but other coil configurations, such as a circular solenoidal configuration, a square solenoidal configuration, a circular spiral configuration, a square spiral configuration, a rectangular configuration, a triangular configuration, a circular spiral-solenoidal configuration, a square spiral-solenoidal configuration, and a conformal solenoid configuration, are also contemplated. As used herein, the term "conformal" is defined as being similar or identical in form to the shape, contours, and/or topology of a structure or harmoniously conforming in form to the shape, contours, and/or topology of a structure. The wire of the Tx coil 111 may have a cross-sectional shape, such as but not limited to a circular cross-section, a rectangular cross-section, a square cross-section, a triangular cross-section, an elliptical cross-section or combinations thereof. The wire may comprise copper, gold, silver, aluminum, calcium, tungsten, zinc, nickel, iron, and combinations or alloys thereof, The wire may further comprise titanium, platinum, iridium, tantalum, niobium, zirconium, hafnium, nitinol, gold, palladium, carbon, and combinations or alloys thereof, including various stainless steels, platinum-iridium alloys, and Co—Cr—Ni alloys such as MP35N, Havar™, and Elgiloy™, Additionally, the wire may be a layered wire, a clad wire, a composite layered wire, a composite clad wire, a multi-layered wire or a multi-clad wire in any of the above material combinations.

FIG. 2 further shows that the Tx coil 111 is assemblable to a magnetic material 102a, 102b. The magnetic material 102a, 102b may comprise a magnetic material. A magnetic comprises ceramic compounds of the transition metals with oxygen, which are ferrimagnetic but electrically nonconductive (in other word, an insulating material). The magnetic further comprises an iron oxide combined with one of nickel, zinc, manganese or combinations thereof. The magnetic material 102a, 102b comprises low coercivity. Low coercivity of the magnetic material means that the material's magnetization can easily reverse direction without dissipating much energy (that is, hysteresis losses), while the material's high resistivity prevents formation of eddy currents in the core, which is another source of energy loss. The coercivity, also known as magnetic flux saturation density or $B_{sat}$, of the magnetic material of the present application is greater than 0.5 Tesla. The magnetic material 102a, 102b comprises a permeability. Free space has permeability of $\mu$ equal to $\mu 0$. Materials having permeability much greater than $\mu 0$ concentrates the magnetic flux in the low reluctance path, hence can be used to contain the magnetic flux in areas where it is required. More importantly, a material with higher permeability induces a higher inductance on a transmitter, and higher inductance on a receiver in close-coupled situations. Higher inductance results in a greater mutual inductance which enables wireless power transfer at longer ranges, extended distances and larger volumes. The magnetic material 102a, 102b comprises a permeability 100µ' to 10,000µ', depending on an application's operating frequency. It is contemplated that the magnetic material 102a, 102b may be a magnetic shielding material. The magnetic shielding material may re-direct a magnetic field so it lessens the field's influence on the item being shielded. The magnetic shielding material may further facilitate the magnetic field to complete its path. More importantly, the magnetic shielding material redirects, reshapes and/or focuses a magnetic field generated by a wireless Tx system so that the magnetic field is more concentrated at a distant position or at a spatial volume location at or within which an Rx system resides, thereby enables the wireless Tx system of the present application to transfer more power wirelessly at longer ranges, extended distances and larger volumes. Such magnetic shielding materials may include, but are not limited to, zinc comprising magnetic materials such as manganese-zinc, nickel-zinc, copper-zinc, magnesium-zinc, and combinations thereof. These and other magnetic material formulations may be incorporated within a polymeric material matrix so as to form a flexible magnetic pad, sheet or component conformal to the Tx coil 111. Examples of such materials may include but are not limited to, FFSR and FFSX series magnetic materials manufactured by Kitagawa Industries America, Inc. of San Jose, Calif., and Flux Field Directional RFIC material, manufactured by 3M™ Corporation of Minneapolis, Minn.

FIG. 2 further shows that, in addition to being assemblable to a magnetic material 102a, 102b, the Tx coil 111 is further assemblable to an optional bezel 103. As used herein, an assembled Tx coil is defined as a coil assembly, comprising a Tx coil 111, a magnetic material 102a, 102b, and an optional bezel 103. A bezel is defined as a structure that holds the Tx coil 111 in place. The bezel may further provide structural integrity to the Tx coil. A bezel may comprise a frame around the Tx coil. The frame may or may not be conformal. The bezel may comprise a groove and/or a slot. The groove and/or the slot may be configured to accommodate a wire or wires of the Tx coil, the Tx coil itself or both. The bezel may comprise a rim configured to fasten or hold the Tx coil in place. The bezel may comprise sloping facets to accommodate a wire or wires of the Tx coil, the Tx coil itself, or both.

While bezel 103 is shown in FIG. 2 as a component of the Tx system 100, it is contemplated that bezel 103 may be physically integrated into a housing (not shown) of the Tx system 100, or to a housing of an object to which a Tx system is attached (also not shown). In the latter case, an exemplary embodiment is a housing of a charger, wherein the housing comprises a bezel that is either a separate construct that is physically attached to the housing, such as a charger cover, or is pre-formed as a part of the housing, for example by a stamping, a progressive stamping or a deep-drawing process, or is a molded part of a housing such as by plastic injection molding, metal injection molding, fixture poured molding, or other molding processes that shape a pliable material using a rigid frame to which the pliable material conforms. In this way bezel 103 may not only hold in place the Tx coil 111 but may also facilitate Tx coil alignment with a power-receiving (Rx) coil. It is also contemplated that an assembled Tx system may be physically attached to a bezel formed in the housing of a charger, or be affixed to a preformed bezel compartment in the housing using the same methods as described for forming bezel 103.

Another exemplary embodiment is a bezel that is a part of a support structure, such as a table, a bench, a stand, a cabinet, or other similarly configured support structure, wherein the support structure comprises a bezel that is physically attached to, machined as part of, carved into, or inserted into said support structure. The bezel may be positioned on a surface, a wall, an underside, or in an opening made to accommodate the bezel. It is also contemplated that the support structure can comprise an assembled Tx system 100 that is fastened to a bezel that is physically attached to, machined as part of, carved into, or inserted into the support structure.

The bezel 103 of FIG. 2 may comprise a metal, an alloy, a plastic, a polymer, a foamed metal, a foamed plastic, a foamed polymer, a composite, or combinations thereof. Composites, which are made from two or more constituent materials, have different physical and chemical properties, such that when combined, produce a composite material with characteristics different from the individual components. The individual components remain separate and distinct within the finished structure. Of significance is that the individual components of the composite material may specifically be selected to produce a material with properties that minimize or even resolve application issues. Hence, composites can be customized to specifically address, for example, thermal management, magnetic field management, magnetic field concentration, electromagnetic interference (EMI) mitigation, noise susceptibility shielding, weight, cost, magnetic field coupling strength (capture) for broader and/or stronger wireless power transmission, or wireless power transmission at extended distances beyond present-day capability. Note that Tx coil 111 may be secured to the Tx system 100 by other structures or hardware besides bezel 103 without departing from the scope of the invention.

Referring to FIG. 2, the Tx coil 111 with magnetic 102a, 102b and optional bezel 103 is shown to be attachable to an optional bracket 105. Bracket 105 may comprise a metal, a foamed metal, an alloy, a foamed alloy, a plastic, a foamed plastic, a polymer, foamed polymer, a composite or combinations thereof. The composite may be the same or different than the composite of the bezel 103. Similarly to the composite of the bezel 103, the composite of the bracket 105 comprises individual components that may specifically be selected to produce a material with properties that minimize or resolve application issues, and can be customized to specifically address similar issues, such as, thermal management, magnetic field management, magnetic field concentration, electromagnetic interference (EMI) mitigation, noise susceptibility shielding, weight, cost, magnetic field coupling strength (capture) for broader and/or stronger wireless power transmission, or wireless power transmission at extended distances beyond present-day capability. Note that Tx coil 111 may be secured to the Tx system 100 by other structures or hardware besides bracket 105 without departing from the scope of the invention.

Similarly to optional bezel 103, while bracket 105 is shown in FIG. 2 as a component of the Tx system 100, it is contemplated that bracket 105 may be physically integrated into a housing (not shown) of the Tx system 100, or to a housing of an object to which a Tx system is attached (also not shown). In the latter case, an exemplary embodiment is a housing of a charger, wherein the housing comprises a bracket that is either a separate construct that is physically attached to the housing, such as a charger cover, or is pre-formed as a part of the housing, for example by a stamping, a progressive stamping or a deep-drawing process, or is a molded part of a housing such as by plastic injection molding, metal injection molding, fixture poured molding, or other molding processes that shape a pliable material using a rigid frame to which the pliable material conforms. In this way bracket 105 may not only hold in place the assembled Tx coil 111 and bezel 103, but may also facilitate Tx coil 111 alignment with an Rx coil. It is also contemplated that an assembled Tx system may be physically attached to the housing of a charger, or be affixed to a preformed compartment in the housing using the same methods as described for forming bracket 105.

Another exemplary embodiment is a bracket that is a part of a support structure, such as a table, a bench, a stand, a cabinet, or other similarly configured support structure, wherein the support structure comprises a bracket that is physically attached to, machined as part of, carved into, or inserted into said support structure. The bracket may be positioned on a surface, a wall, an underside, or in an opening made to accommodate the bracket. It is also contemplated that the support structure can comprise an assembled Tx system 100 that is fastened to a bracket that is physically attached to, machined as part of, carved into, or inserted into the support structure.

The Tx coil 111 and the magnetic material 102a, 102b, with or without the bezel 103 shown in FIG. 2, may be secured to bracket 105 using an adhesive 104. The adhesive 104 may comprise, a structural adhesive, a self-adhesive, a self-stick adhesive, or a pressure sensitive adhesive (PSA). The adhesive 104 may further comprise a heat spreader to facilitate heat dissipation. A heat spreader may comprise a body, the body comprising a pad, a plate, a block, a sheet, a film, a foil, a fabric, a screen, a weave, a mesh, a foam, a custom fiber or wire form, or a braid of a high thermal conductivity material. A heat spreader may also comprise particulates or particles of high thermal conductivity materials in any shape or form, including a sphere, a flake, an oval, trapezoidal, tabular, irregular, dendritic, platelet, a fiber, a whisker, a tube, tubular, angular, symmetric, asymmetric, a pressed powder, a pressed clump, and combinations thereof. High thermal conductivity materials include silver, copper, gold, brass, aluminum, iron, steel, various carbons including graphite, graphene, diamond, pyrolytic graphite and fullerenes, and combinations or alloys thereof. It is contemplated that a heat spreader may comprise any body, alone or combination with another different body, in combination with one or more particulate or particle options. The Tx coil 111 may alternately be assembled to the bracket 105 using an epoxy, a thermal epoxy, a tape, a glue, a thermal paste or any adherence medium that is applied to one surface, or both surfaces, of two separate items so that the adherence medium binds them together and resists their separation. The adherence medium may also further comprise a heat spreader to facilitate heat dissipation. Also, alternatively, the Tx coil 111 may be assembled to the bracket 105 using fasteners, the fasteners comprising screws, staples, nails, Velcro, or combinations thereof. It is contemplated that any adherence medium, alone or combination with another different adherence medium, may be used in combination with one or more fastener options.

A circuit board 107 is also assemblable to the bracket 105. Assembly is shown using a thermal gasket 106. A thermal interface material may be used instead of the thermal gasket 106. A thermal interface material is any material that is inserted between two components in order to enhance the thermal coupling between them. The thermal gasket 106 (or alternately, the thermal interface material) may also may comprise any one of the heat spreaders disclosed above, alone or in combination, to facilitate heat dissipation. The circuit board 107 may optionally be fitted with an additional high thermal conductivity material between the circuit and the bracket so that heat may be extracted from the circuit board and/or circuit board components for dissipation by the bracket 105. Any one of the high thermal conductivity materials previously named may be used alone or in combination thereof for this purpose. Additionally, the added high thermal conductivity material between the circuit board and the bracket may optionally be used with or without the thermal gasket 106. A thermal gasket is herein defined as a component which is specifically designed to function in areas of a structure that generate heat. The thermal gasket 106 may be fabricated in a number of ways. For example, the thermal gasket may be cut using a die. Alternatively, the thermal gasket may be cut without using a die, in other words, a dieless cut. Cuts can comprise a standard form, or can be custom-made to form the thermal gasket 106 from one of a cured thermal adhesive, paste, resin or elastomer, a thermal composite, a thermal interface material, a gap pad, a filter pad, and combinations thereof. Furthermore, the thermal gasket 106 made be cut from any shapeable material capable of attaching, separating and/or sealing two surfaces in an apparatus or device. In addition to cutting, the thermal gasket can be made by stamping or punching. The thermal gasket can also be made by molding a flowable material that is then cured. The thermal gasket 106 may comprise polyurethane, silicone, foam, sponge, rubber, polytetrafluoroethylene (PTFE), or combinations thereof. Additionally, any of the above named materials may be used in combination with any of the previously high thermal conductivity materials named. Additional commercially available non-limiting examples of potential thermal gasket materials include PORON® polyurethane gaskets, BISCO® silicone gaskets, 3M™ thermal gaskets, Porex PTFE gaskets, Nomex® insulator gaskets, or Formex® Insulator gaskets, any of which might further be customized to enhance thermal conductivity by way of a heat spreader, a reflective foil, and interface material, a lining or the like. The circuit board 107 may alternately be assembled to the bracket 105 using an epoxy, a thermal epoxy, a tape, a glue, a thermal paste or any adherence medium that is applied to one surface, or both surfaces, of two separate items so that the adherence medium binds them together and resists their separation. The adherence medium may also further comprise a heat spreader to facilitate heat dissipation. Also, alternatively, the circuit board 107 may be assembled to the bracket 105 using fasteners, the fasteners comprising screws, staples, nails, Velcro, or combinations thereof. It is contemplated that any adherence medium, alone or combination with another different adherence medium, may be used in combination with one or more fastener options, or any one or more thermal gaskets 106.

Also shown in FIG. 2 is an electrically insulating material 101 assembled atop the Tx coil 111. The insulating material 101 may comprise one of a polyimide, an acrylic, glass, fiberglass, rubber, polyester, polyether imide, polytetrafluoroethylene, polyethylene, polyetheretherketone (PEEK), polyethylene napthalate, polyvinyl chloride (PVC), fluoropolymers, copolymers, a ceramic material, a magnetic material, a laminate, a resin, papers and films, a foam material, a silicone, a sponge, a rubber, a soft ceramic-filled silicone elastomer with or without a liner, a silicone coated fabric or mesh, or combinations thereof. A foam material may further comprise, a high temperature silicone foam, an open-cell foam such as, but not limited to, a polyurethane, a reticulated polyurethane foam, a closed cell foam such as, but not limited to, polyethylene, a cross-linked polyethylene foams, or combinations thereof. The electrically insulating material 101 may further be either thermally insulating, for example, if contactable by a user, or thermally conducting depending on an application's requirements. The electrically insulating material 101 may also be reflective, wherein the electrically insulating material comprises a foil capable of reflecting radiant heat. The insulating material 101 may encapsulate an assembled Tx coil, the assembled Tx coil comprising a magnetic 102a, 102b, wherein the magnetic may be a magnetic shielding material. Encapsulation of the assembled power Tx coil thereby provides protection against damage potentially imparted said coil assembly by, for example, shock, vibration, impacts and drops.

Figure 3A:
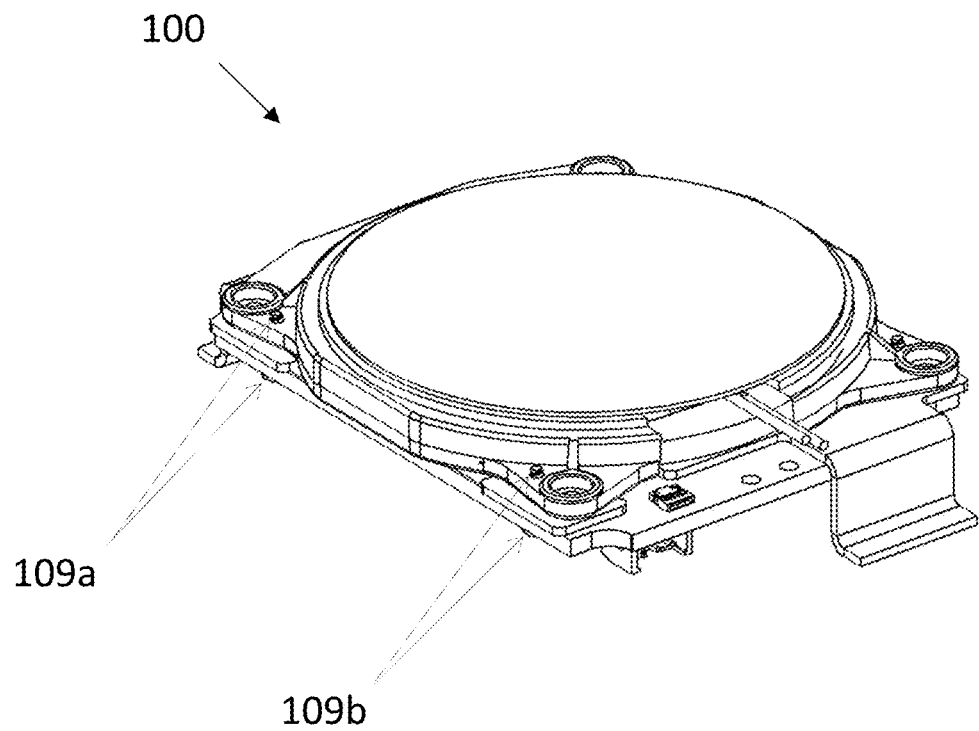
FIG. 3A shows a perspective view of the Tx system embodiment of FIG. 2 assembled.

FIG. 3A shows a perspective view of the assembled Tx system 100 of FIG. 2, showing a top end and a bottom end of screws 109a and 109b after fastening.

Figure 3B:
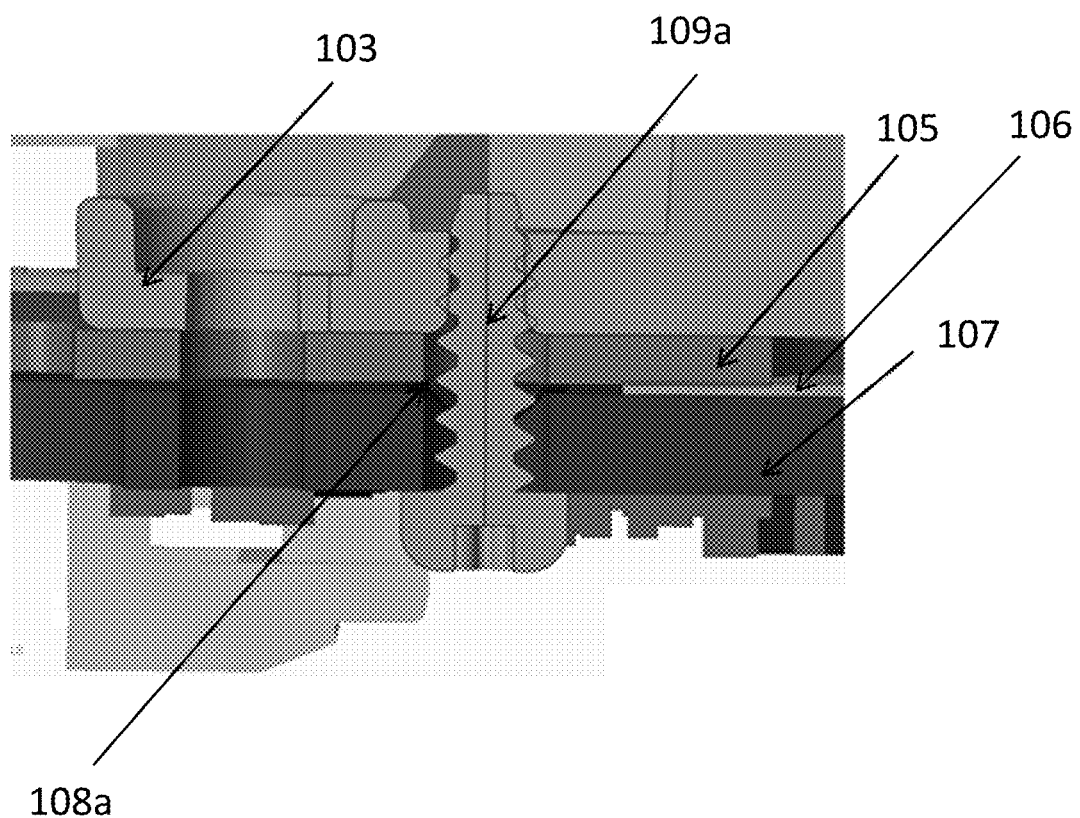
FIG. 3B illustrates a magnified view of a portion of the assembled Tx system embodiment.

FIG. 3B shows a magnified cross-sectional view of a portion of the Tx system 100 of FIG. 3A. Visible is a portion of the bezel 103, a portion of the bracket 105, a portion of the thermal gasket 106, a portion of the circuit board 107, a metal spring washer 108a and a screw 109a. The screw 109a is shown passing through a hole extending through the circuit board 107 and the bracket 105 and engages the threading in the hole of the bezel 103. Prior to fastening, the hole of the circuit board 107, the bracket 105 and the bezel 103 are aligned. The screw is inserted into the aligned vias or holes and secured to a washer 108a, thereby fastening the circuit board 107, the bracket 105 and the bezel 103 one to another as shown. The metal spring washer 108a, when flattened, provides a preload force preventing the screw 109a from backing out of the bezel 103. A spring force also allows the metal spring washer 108a to electrically connect the screw 109a, the circuit board 107 and the bracket 105, ensuring a continuous ground path between the bracket 105 and the circuit board 107. In this embodiment, the thermal gasket 106 comprises a thermally conductive and an electrically insulating material. The thermal gasket 106 thermally connects the circuit 107 to the bracket 105, providing a continuous thermal path for the heat generated by the circuit board 107 and/or its components to be conducted for dissipation by the bracket 105. This is important for proper thermal management of the Tx system 100 during operation. Additionally, the fastened assembly comprises a single connection, wherein the single connection is, simultaneously, structurally, electrically and thermally connecting the circuit board 107 and the bracket 105. Thermally connected is herein defined as a path or line through which heat flows. Thermally connected structures may comprise a path or line having two or more points or bodies through which heat is conducted. Additionally, a thermally connected structure may comprise a construction, the construction comprising two or more point-to-point or body-to-body connections.

Figure 4:
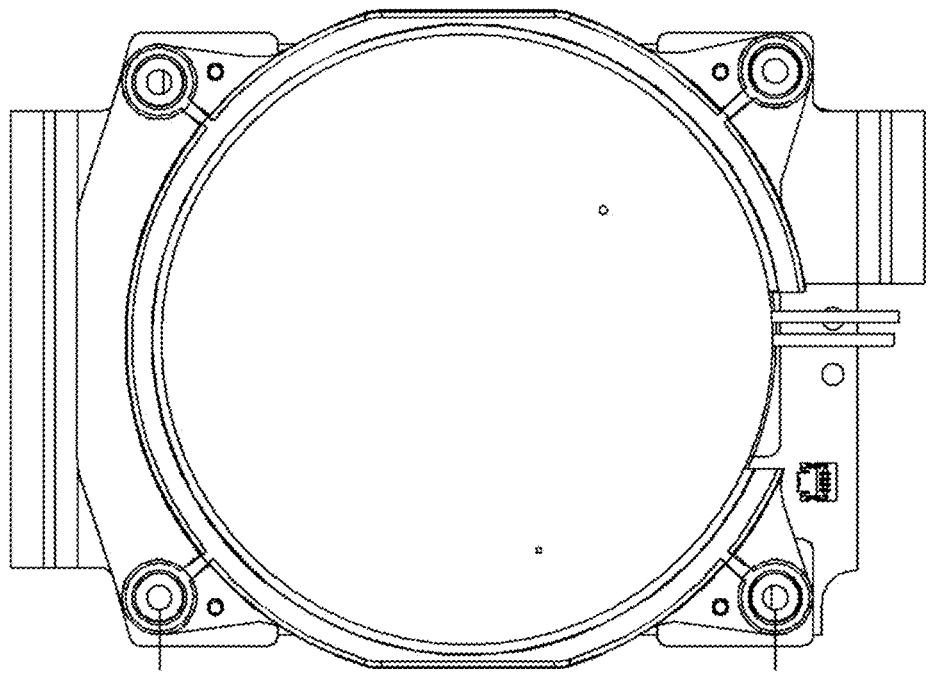
FIG. 4 is a top view of the assembled Tx system embodiment of FIG. 3A.

FIG. 4 is a top view of the assembled Tx system 100 of FIG. 3A.

Figure 5:
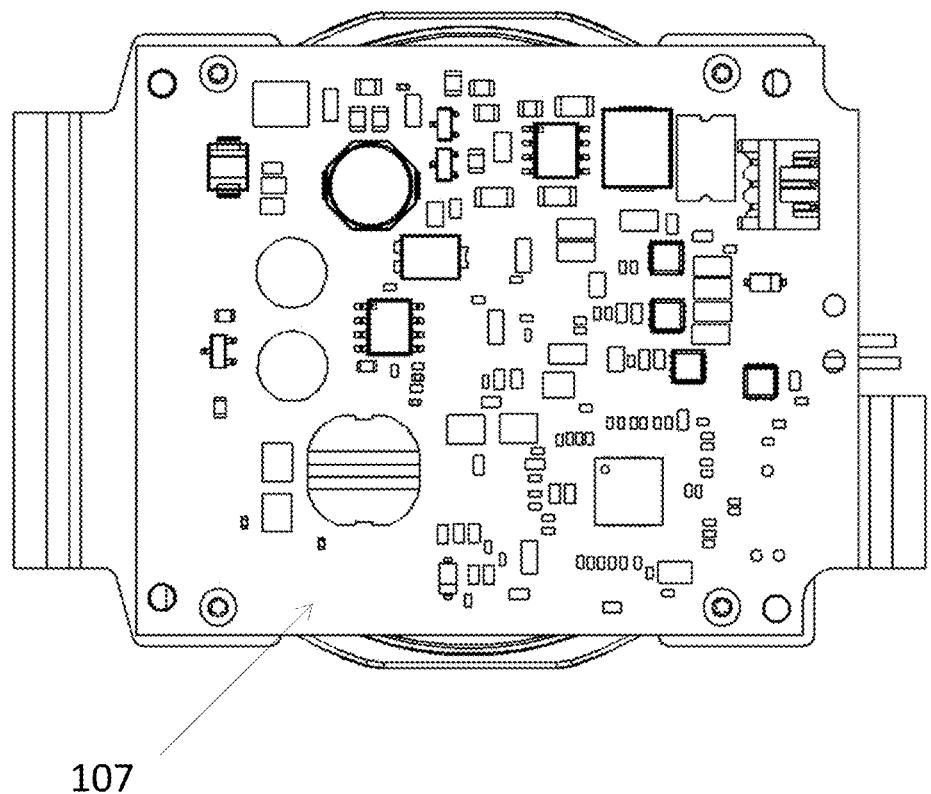
FIG. 5 is a bottom view of the assembled Tx system embodiment of FIG. 3A.

FIG. 5 is a bottom view of the Tx system 100 of FIG. 3A showing the circuit board 107. The circuit board of the present application is a constituent of the Tx system 100 comprising a structure that allows assembly of one of an electrical circuit, a data circuit, or both in either a printed circuit board configuration, a multi-layer printed wiring board, or a point-to-point construction board. Furthermore, the electrical and the data circuits of the circuit board may be capable of transmitting a combination of electrical energy, electromagnetic energy, electrical power and electronic data together or separately. The circuit board of the present application may also comprise component non-limiting elements such as inductors, capacitors, resistors, switches, heat sinks, thermal relief structures, thermal relief pads, band pass, high pass and low pass filters and the like. The circuit board may also comprise an LC tank. The LC tank is defined as an inductor and a capacitor, or mechanical equivalents such as a crystal or MEMS oscillator, to make a circuit that is responsive to frequency. The LC tank may comprise an LC circuit. The LC circuit may comprise either a high impedance or a low impedance at a resonant frequency. The LC tank or the LC circuit may operate as a bandpass filter, a band stop filter, or an oscillator. Additionally, circuit board components may comprise the multi-layer wire or the multi-layer multi-turn technology of U.S. Pat. Nos. 8,567,048, 8,610,530, 8,653,927, 8,680,960, 8,692,641, 8,692,642, 8,698,590, 8,698,591, 8,707,546, 8,710,948, 8,803,649, 8,823,481, 8,823,482, 8,855,786, 8,860,545, 8,898,885, 9,208,942, 9,232,893, 9,300,046, 9,306,358, 9,439,287, and 9,444,213, incorporated fully herein by reference. The circuit board of the present application may be a coil circuit board or a main Tx system circuit board, either each constructed separately or constructed within a single, unitary circuit board configuration. More than one circuit board of any type and/or combination may be physically and/or electrically connected by a connector, the connector comprising one of a via, a solder, a tab, a wire, a pin, a screw or a rivet.

Figure 6A:
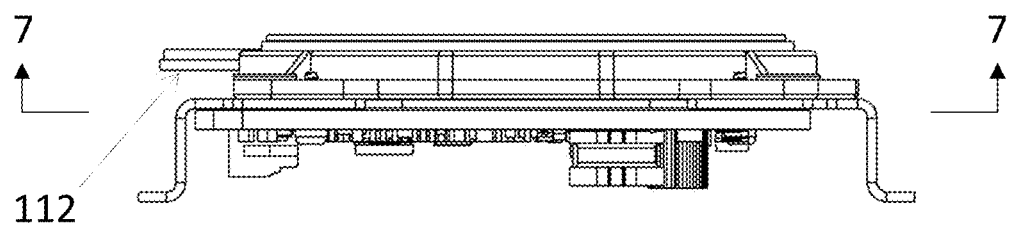
FIG. 6A is a first side view of the assembled Tx system embodiment of FIG. 3A.
Figure 6B:
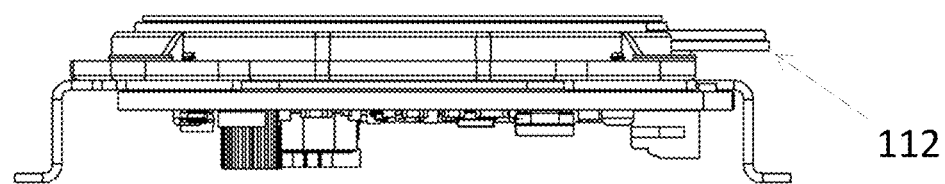
FIG. 6B is a second side view of the assembled Tx system embodiment of FIG. 3A.
Figure 6C:
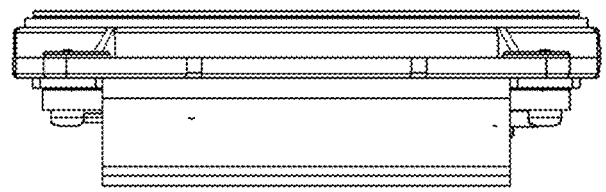
FIG. 6C is an end view of the assembled Tx system embodiment of FIG. 3. This end view is opposite the end showing coil end connections.

FIG. 6A shows a first side view of the assembled Tx system 100 of FIG. 3A. Coil connection ends 112 are shown on the left of the first side of FIG. 6A FIG. 6B shows a second side view of the assembled Tx system 100 of FIG. 3A. Coil connection ends 112 are shown on the left of the first side of FIG. 6A FIG. 6C shows an end view of the assembled Tx system 100 of FIG. 3A. The coil connection ends 112 are present on the opposite end of the assembled Tx system end view being shown.

Figure 7:
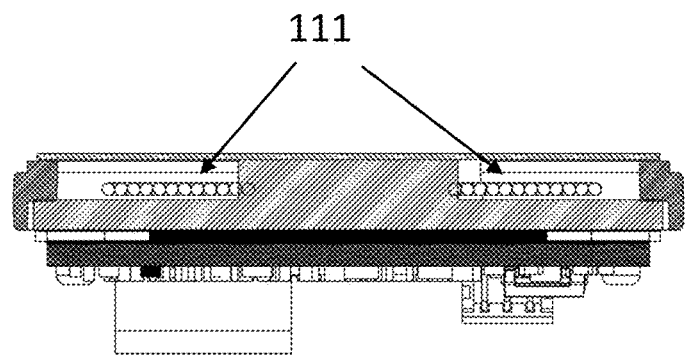
FIG. 7 is taken from section 7-7 of FIG. 6B, illustrating a cross-section of the assembled Tx system embodiment.

FIG. 7 is a cross-sectional view taken from section 7-7 of the assembled Tx system of FIG. 6B (coil end connections 112 are not present in this cross-section). The wire of Tx coil 111 shows a circular shape, however, as previously mentioned the wire of the Tx coil can be of various other cross-sectional shapes.

Figure 8:
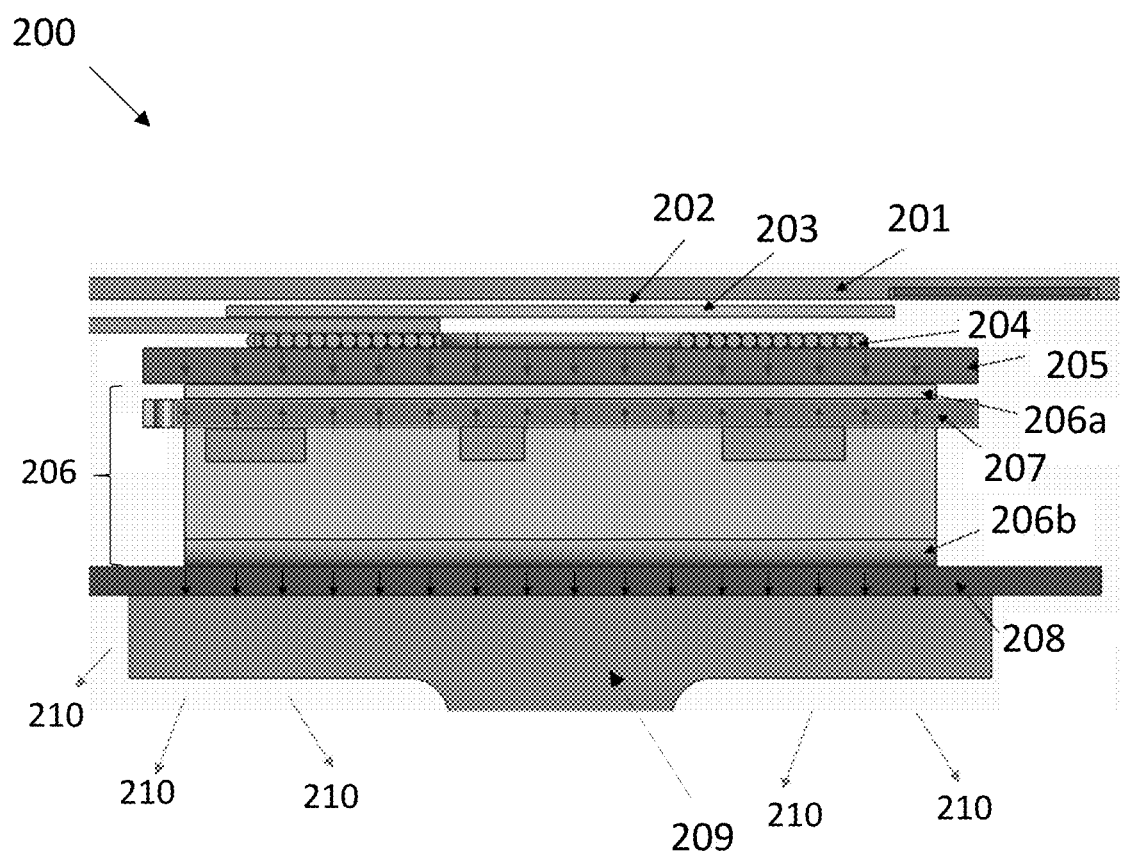
FIG. 8 is a cross-sectional view of a Tx system embodiment with thermal management features.

FIG. 8 shows a cross-sectional view of an embodiment of a Tx system 200 with thermal management features. Shown are: a front housing 201, an air gap 202, a foam 203, a Tx coil 204, a magnetic material 205, a two-piece bracket 206 comprising a bracket top component 206a and a bracket bottom component 206b, a circuit board 207, and a back housing 208. In this embodiment, the foam 203 is an electrically insulating material. It is contemplated that any of the electrically insulating materials 101 previously named may alternately be used instead of the foam 203. The foam 203 or an alternate electrically insulating material may also be thermal insulating or a thermal conducting depending on the application. If the front housing 201 is contactable by a user, then a thermal insulating foam may be selected, so that when contact is made by the user, the user is not subjected to any discomfort that may occur as a result of a front surface elevated temperature when the Tx system 200 is in operation. If the front housing 201 is not contactable by a user, but instead exposed to an environment 200, then a thermal conducting foam may be selected, so that any heat generated when the Tx system 200 is in operation can be dissipated to the environment 200.

Also shown in FIG. 8 is an optional mounting plate 209. The optional mounting plate 209 may provide support for the Tx system 200, may mount the Tx system 200 to an object, such as, but not limited to, a holder, or may dissipate heat generated by the Tx system 200 and/or its components to a surrounding environment 210.

The arrows depicted in the magnetic 205, the circuit board 207, and the back housing 208 of FIG. 8 are exemplary indicating directional heat flow. More specifically, the exemplary arrows of magnetic 205 indicate how heat may be dissipated from the Tx coil 204 to the bracket top component 205a. Similarly, the exemplary arrows depicted in circuit board 207 indicate how heat may be dissipated from the circuit board 207 and/or its components to the bracket top component 205a. Likewise, the exemplary arrows depicted in the back housing 208 indicate how heat may be dissipated from the bracket bottom component 206b to the optional mounting plate 209, and then from the optional mount plate 209 to the surrounding environment 210. It is understood that, in the absence of the optional mounting plate, the exemplary arrows depicted in the back housing 208 would indicate that the heat may be dissipated from the bracket bottom component 206b to the surrounding environment 210. Materials for use in dissipating heat should have high thermal conductivity. Non-limiting examples include: silver, copper, gold, brass, aluminum, iron, steel, various carbons including graphite, graphene, diamond, pyrolytic graphite and fullerenes, and combinations or alloys thereof. As previously disclosed, composites may also be used. Non-limiting examples include metal matrix composites (MMCs) comprising copper-tungsten, AlSiC (silicon carbide in aluminium matrix), Dymalloy (diamond in copper-silver alloy matrix), and E-Material (beryllium oxide in beryllium matrix).

Figure 9A:
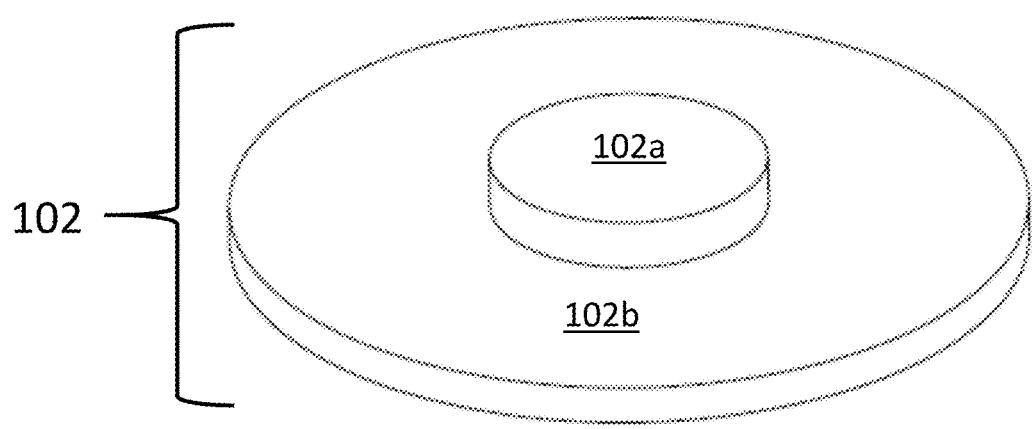
FIG. 9A is a perspective view of a T-shape magnetic material embodiment.

FIG. 9A shows a perspective view of an embodiment of a T-shape magnetic material comprising two components, a magnetic core 102a and a magnetic backing 102b. The magnetic core 102 a and the magnetic base 102b may be formed by using an adhesive or an epoxy, Alternately, the magnetic core 102a and a magnetic backing 102b may be formed by pressing a powder into a mold to obtain the desired shape, followed by a sintering process. Yet another way to form the magnetic core 102a and a magnetic backing 102b is to assemble, then press and/or sinter multiple layers of sheet magnetic. The T-shape magnetic material alternately may comprise a single material construction, wherein a portion of the T-shape magnetic material comprises the magnetic core as a projection extending from the magnetic base. In the single material construction the magnetic core projection may be formed extending from the magnetic base from a single starting magnetic material piece. The same alternate processes disclosed above may be used to form the single material construction T-shape magnetic material. In the T-shape embodiment shown, the magnetic core 102a is concentrically positioned atop a magnetic backing 102b. It is understood, however, that a magnetic core may be positioned off-center atop the magnetic backing. It is further contemplated that more than one magnetic core may be positioned atop a single magnetic backing. It is also contemplated that either the magnetic core 102a, the magnetic base 102b, or both may comprise one or more magnetic materials. The one or more magnetic materials may be the same for both or each may have different magnetic materials. The one or more magnetic materials may further be planarly layered in either the magnetic core 102a, the magnetic base 103b, or both; arranged along the a longitudinal or z-axis with layers extending outwardly in a radial direction if circular or oval or other such round surface defined by radii, or in an x or y axis direction if shaped other than a circular or round or radially defined.

Figure 9B:
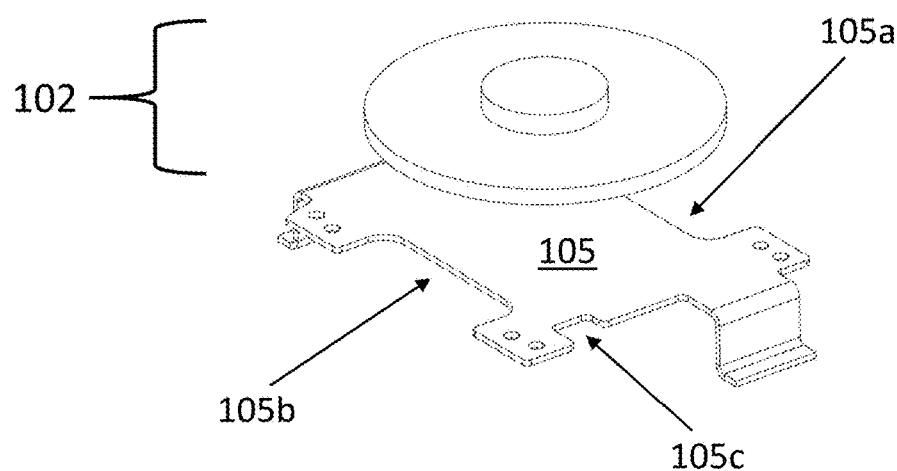
FIG. 9B illustrates an exploded perspective view of the magnetic material embodiment of FIG. 9A in relation to a bracket.

FIG. 9B illustrates an exploded perspective view of the magnetic material embodiment of FIG. 9A in relation to a bracket 105. The bracket 105 may comprise one of an electrical shielding material, a heat conduction material, a heat dissipation material, an electrical grounding structure, or combinations thereof.

Regarding electrical grounding, it is important for any circuit board 107 in the Tx system 111 to be electrically grounded. The electrical grounding structure as part of the bracket 105 is a convenient grounding option. For example, referring once again to FIG. 3B, the metal spring washer 108a is shown with the screw 109a. The threads of the screw 109a pass through a hole extending through the center of said washer. In this embodiment, screw 109a is a capture screw. This cross-sectional view shows, to the right and to the left of the imaginary center line of the screw 109a, that the screw threads have captured the edge of the hole of said washer. Capture of the edge of the hole of said washer resulted in a portion of said washer to be angularly bent from its as-manufactured planar configuration. Also visible in this cross-sectional view is the outer edge of the metal spring washer 108a. The outer edge of the metal spring washer 108a, which includes the entire outer edge perimeter, is shown sandwiched between the circuit board 107 and the bracket 105. This cross-sectional view illustrates the metal spring washer edge as a flat end that extends to the circuit board 107 and the bracket 105, wherein the extension is initially flat, and then exhibits the angular bend that eventually positions the hole edge at a thread of screw 109a. To the right of screw 109a, the thermal gasket 106 is also shown sandwiched between the circuit board 107 and the bracket 105. When the capture screw with its washer intentionally electrically connects a ground plate of the circuit board 107 to the bracket 105, then the circuit board is grounded to said bracket. Grounding the bracket to the circuit is essential in mitigating electrostatic discharge (EDS) and potentially dangerous arcing events. Similarly, sandwiching of the thermal gasket 106 between the circuit board 107 and the bracket 105 thermally connects said circuit board to said bracket, thereby enabling heat that may be generated in the circuit board and/or circuit board components to be conducted away from said circuit board to bracket for eventual dissipation. The embodiments disclosed above are only one way to electrically ground and/or thermally connect the circuit board 107 to the bracket 105. There are other configurations to electrically ground and/or thermally connect the circuit board 107 to the bracket 105 without departing from the scope of the invention.

Also visible in the bracket 105 of FIG. 9B are notches 105a, 105b, and 105c. The notches shown are only one possible embodiment. Pending the application, the bracket notches can be positioned in any shape and any manner within the bracket or around the perimeter of the bracket. In some embodiments, the notches may be positioned to manage the development of eddy currents due to current passing through an antenna coil. Eddy currents that develop in a metal shield reduces the inductance of the Tx coil thereby introducing losses which subsequently decreases the Quality factor of the Tx coil. A notch or notches helps in that the presence of a notch causes the path of an eddy current to be modified. The eddy current flows opposite the direction of the current flow of the Tx coil and also flows in close proximity to the notch so as to maintain the eddy current loop. Hence, the magnetic fields created by the eddy current at the notch area will cancel each other. The presence of notches in conjunction with a shielding material mitigates much of the effect the eddy current might have on the Tx coil. Additionally, the continuity of the shield is essentially left intact. So, even though the notch exists, there is enough continuity retained by the shield for sufficient EMI shielding to be sustained. It is known that the magnetic fields of a Tx coil typically couple to the EMI metal shield even-though the magnetic shield is present to prevent coupling. For coupling not to occur, the dimensions of the magnetic shield would have to be infinite. Consequently, the notches in the shield result in a smaller overall area directed toward EMI shielding, which means less magnetic fields will couple, and less eddy current will flow, which, as previously disclosed, normally flows opposite to the direction of the current flow of the coil. There are other notch configurations of said bracket other than the one shown in this embodiment to manage the operation of the Tx system 100 without departing from the scope of the invention.

Figure 9C:
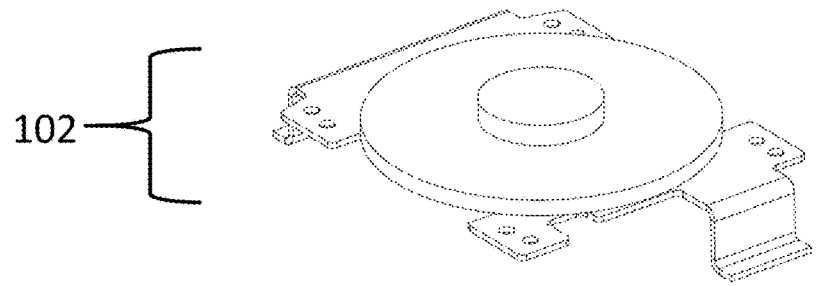
FIG. 9C illustrates a perspective view of the magnetic material and the bracket after assembly

FIG. 9C illustrates a perspective view of the magnetic material 102 and the bracket 105 after assembly.

Figure 9D:
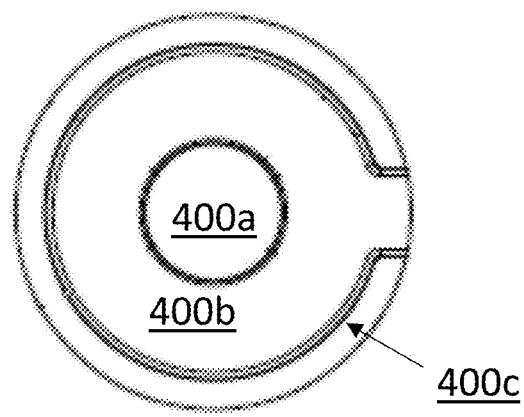
FIG. 9D is a perspective top view of an E-core magnetic material embodiment.

FIG. 9D is a perspective top view of an E-core magnetic material embodiment. This embodiment comprises a magnetic core 400a, a magnetic backing 400b, and a magnetic ring 400c. The magnetic ring 400c is spaced inwardly from the outer edge of the magnetic backing 400b and projects in an upward direction from the top surface said magnetic backing. The magnetic core 400a and the magnetic ring 400c function to direct and focus magnetic fields, hence improving coupling with a receiver coil. Also, magnetic ring 400c provides a low-resistance path through which magnetic fields are directed, limiting an amount of magnetic flux that would otherwise pass through nearby metal components. This type of embodiment minimizes formation of eddy currents which could otherwise counteract a transmitter's magnetic field and limit magnetic field strength.

Figure 9E:
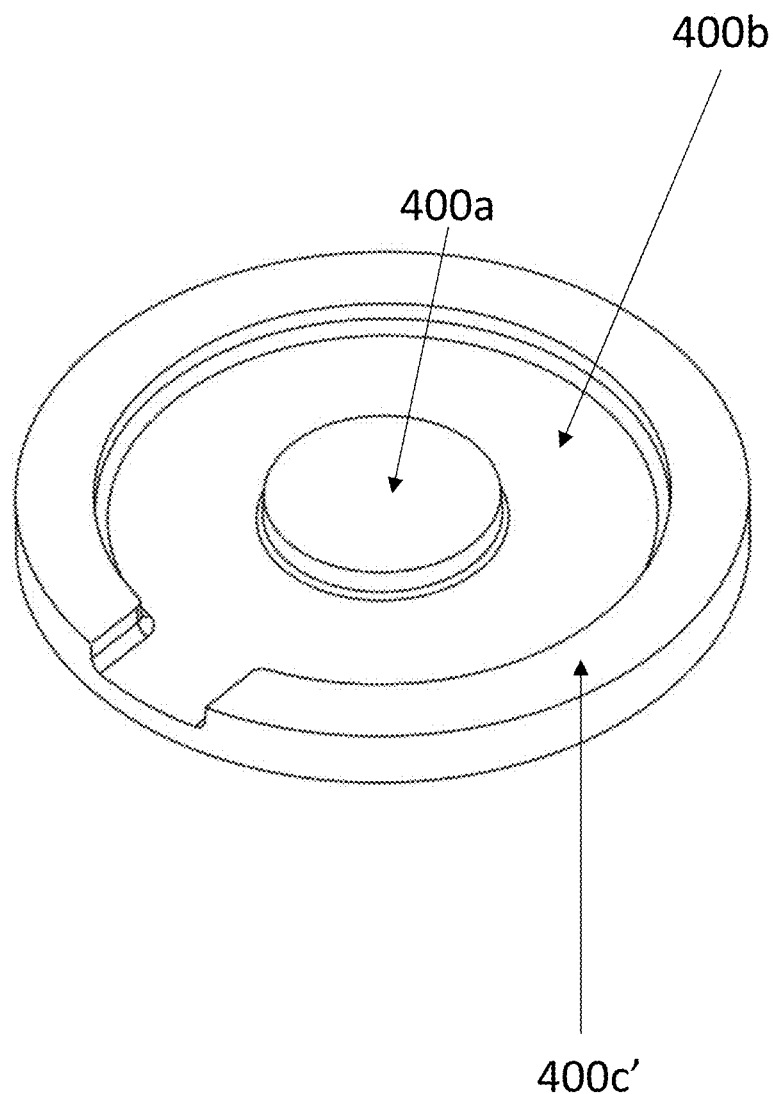
FIG. 9E is a perspective view of an alternative E-core magnetic material embodiment.

FIG. 9E is a perspective view of an alternative E-core magnetic material embodiment. In this embodiment, instead of magnetic ring 400c spaced inwardly from the outer edge of the magnetic backing 400b, shown is a ring-like wall 400c' at the perimeter of the outer edge of the magnetic base 400b.

Figure 9F:
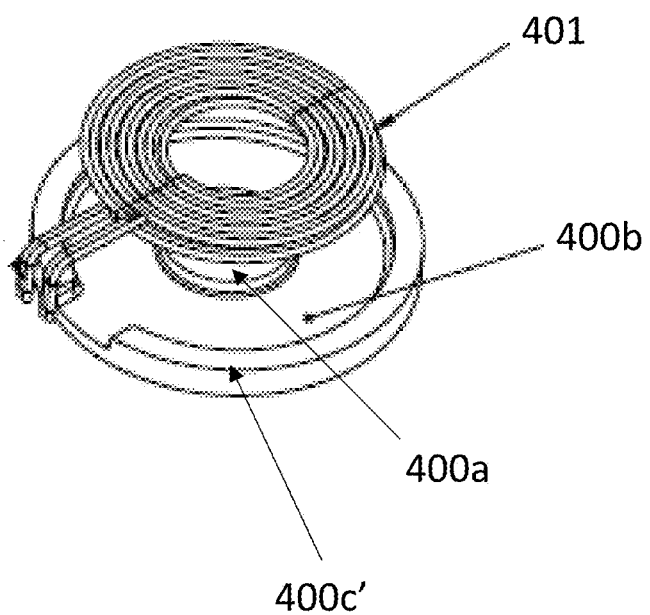
FIG. 9F is an exploded perspective view of a Tx coil and the E-core magnetic material embodiment of FIG. 9E.

FIG. 9F is an exploded perspective view of a Tx coil 401 and the embodiment of the E-core magnetic material 400c' of FIG. 9E. Illustrated is a Tx coil 401, which (due to its shape) creates a magnetic field when an electric current passes through it. Here, said coil 401 is positioned above a magnetic combination which comprises magnetic core 400a, magnetic backing 400b, and magnetic ring 400c. The magnetic combination functions to help direct and concentrate magnetic fields created by coil 401, and can also limit side effects that would otherwise be caused by magnetic flux passing through nearby metal objects.

Figure 9G:
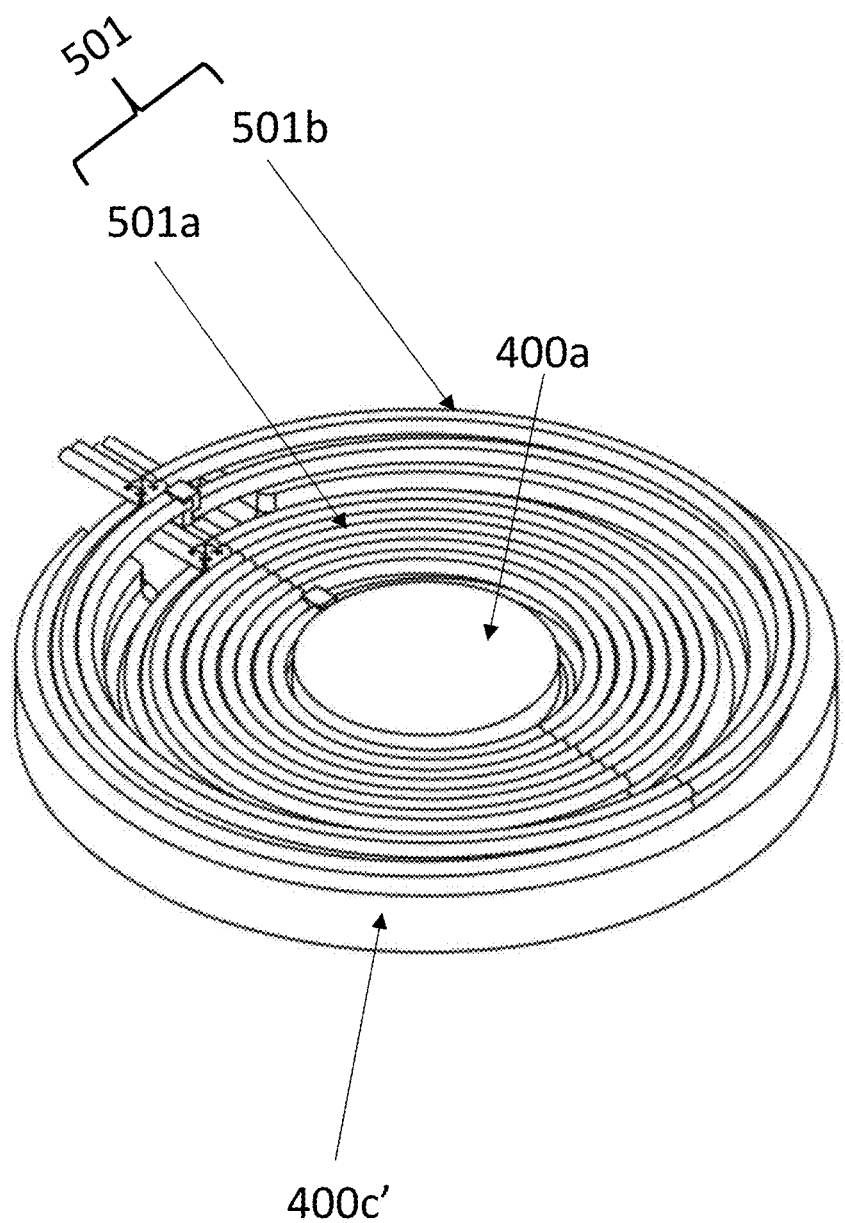
FIG. 9G is a perspective view of a Tx coil and the E-core magnetic material embodiment of FIG. 9F after assembly. This Tx coil shows an additional coil layer versus the single coil layer of FIG. 9F. The additional coil layer is positioned atop the outer rim of the E-core magnetic.

FIG. 9G is a perspective view of an Rx coil 501 and the embodiment of the E-core magnetic 400c' of FIG. 9F after assembly. The Rx coil 501 comprises coil sections 501a and 501b, which are connected to one another forming a multi-coil assembly. Note that the coil section 501b is positioned about the magnetic core 400a and on the magnetic backing 400b (not visible). The coil section 501a is at least partially positioned on top surface of the ring-like wall 400c', and, since positioned on the top surface of the ring-like wall 400c', resides at a higher level than does the coil section 501a. In the embodiment, the magnetic structure affects magnetic flux conduction and concentration. Thus, a magnetic field generated by coil section 501a will be directed centrally, and will allow higher coupling with small receivers at extended z-distances. Also, a magnetic field generated by coil section 501 will be affected by the magnetic structure that increases coupling and charging distance. Additionally, the magnetic structure enables larger power-transfer spatial ranges, such as required by larger volume applications. The larger power-transfer spatial range permits more effective functioning with receivers which are, for instance, offset in an x-y plane as well as in a z-direction.

Figure 9H:
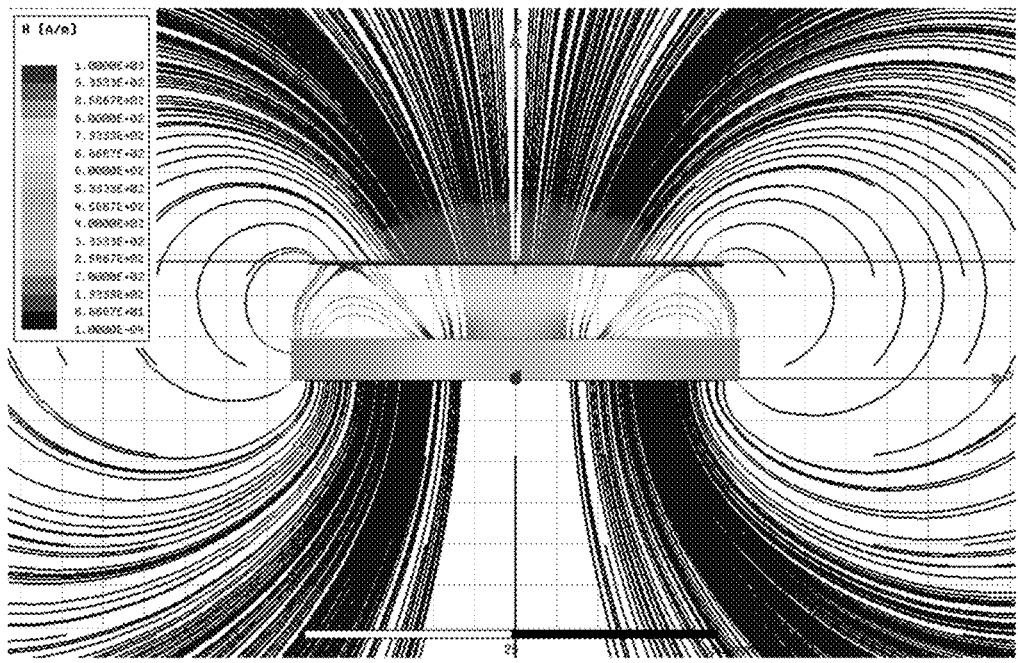
FIG. 9H illustrates an actual simulation of the magnetic field generated by the Tx coil of FIG. 9F and a standard Rx phone coil.

FIG. 9H illustrates an actual simulation of the magnetic field generated by the Tx coil 401 of FIG. 9F and captured by a standard Rx phone coil at an extended distance. The standard Rx phone coil was modeled with a metal piece behind the coil. The metal piece was used to simulate a battery. The simulation shows that the magnetic field generated by the Tx coil 401 was captured by the Rx phone coil at an extended z-distance of 9 mm. As discussed previously, Qi™ wireless Tx systems typically operate between coil-to-coil distances of 3 mm-5 mm. The shaped-magnetics of the present application have shown to favorably reshape a magnetic field so that coil-to-coil coupling can occur at extended z-distances, wherein the z-distances are extended about 2 times to about 5 times the distance of present day Qi™ wireless Tx systems. Furthermore, the shaped-magnetics of the present application can extend coupling of present day a Qi™ wireless Tx system a z-distance ranging about 5 mm to about 25 mm. The magnetic may comprise one of a T-core shape, an E-core shape, a custom shape, or combinations thereof. Any of the T-core, E-core and custom shapes previously discussed may successfully be used to reshape the magnetic field for extended z-distance coupling by a minimum of a 5% compared to standard present-day transmitters. In addition, any of the T-core, E-core and custom shapes previously discussed, each in conjunction with its relation to a coil to the magnetic has also may further increase z-direction coupling by at least another 5%. An embodiment comprising a structure, the structure comprising a coil and a magnetic material, wherein a gap between the coil and the magnetic material residing at the inner diameter of the coil comprises 2 mm, reshapes the magnetic field so that coupling increases by 5%. Another embodiment comprising a structure, the structure comprising a coil and a magnetic material, wherein a gap between the outer perimeter edge of the coil and the magnetic material residing beneath the coil comprises 2 mm, reshapes the magnetic field so that coupling also increases by 5%. The magnetic material may comprise a magnetic body. The magnetic body may further comprise a single, unitary constituent, the single unitary constituent further comprising one or more structural components.

Figure 10A:
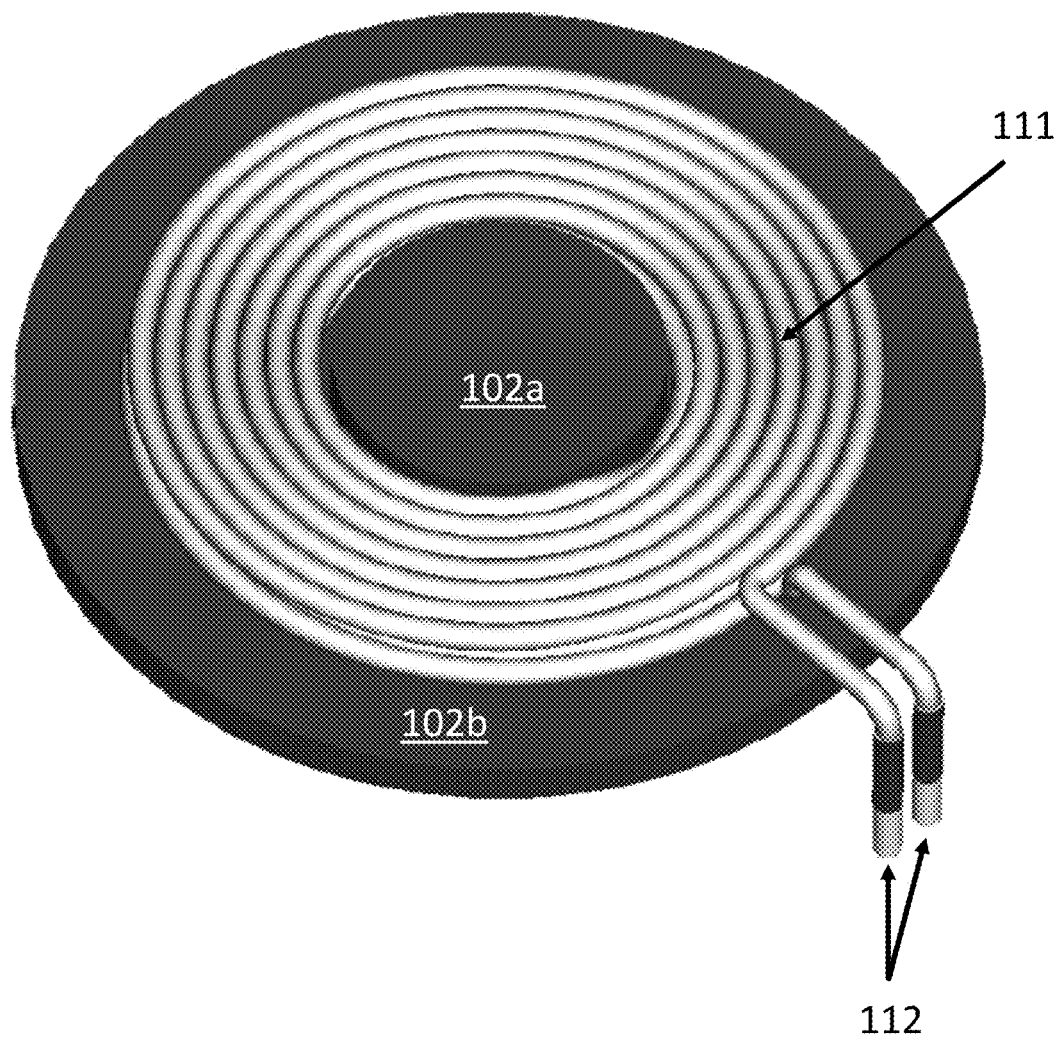
FIG. 10A is an image of an embodiment illustrating a magnetic material and a power-transmitting coil. The coil shows a right angle bend to the connection ends.

FIG. 10A is an image of an embodiment illustrating an actual magnetic material 102a, 102 and a Tx coil 111. The Tx coil 111 comprises one or more connection ends 112, the one or more connection are bent at a 90° angel. The connection ends 112 are pre-bent at 90° prior to assembly to the magnetic material 102a, 102b. While FIG. 10A shows the connection ends 112 of the Tx coil 111 to be bent 90°, it is contemplated that said connection ends may be pre-bent at any angle that facilitates assembly. For example, said connection ends may alternatively be pre-bent at a 70° angle up to a 110° angle. The connection ends 112 may attached to the circuit board (not shown) by either a manual or a reflow solder process. The connection ends 112 may optionally be tinned to facilitate solderability. Bending the connection ends 112 allows placement of the bent ends into the circuit board 107 via or hole, which eliminates any need for coil wire routing, or the need for service loop options in order to achieve circuit board connection. Circuit board via or hole connection adds strength to the connection, making the connection more resilient to shock, vibration, impacts and drops, thereby enhancing durability of the Tx system 100. Additionally, circuit board via or hole connection results in a smaller assembly footprint.

Figure 10B:
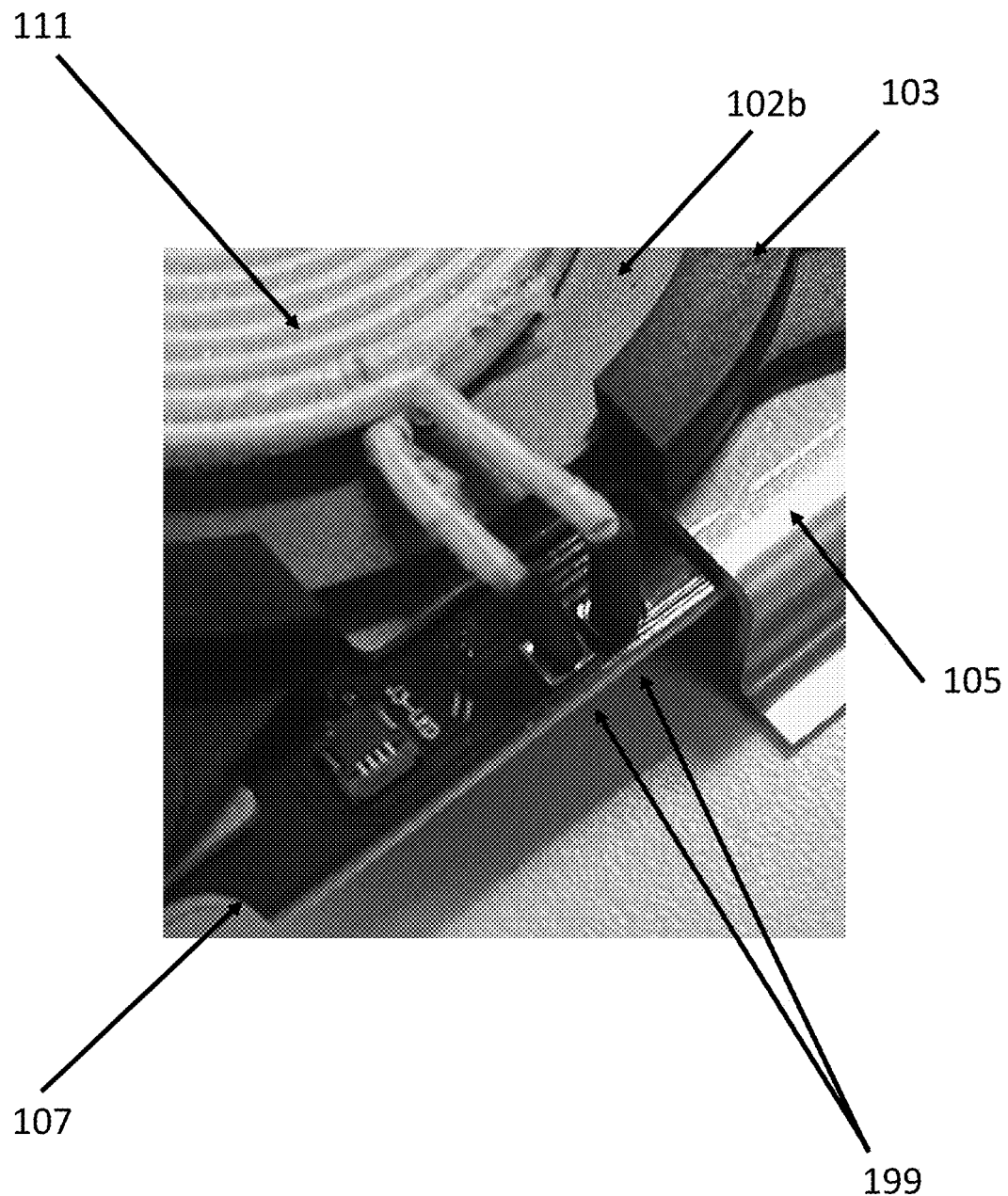
FIG. 10B is a magnified image of the connection end portion of the embodiment of FIG. 10A attached to a circuit board and bracket assembly.

FIG. 10B is a magnified image of the connection end portion of the embodiment of FIG. 10A attached to an actual circuit board 107 and bracket 105 assembly.

Figure 10C:
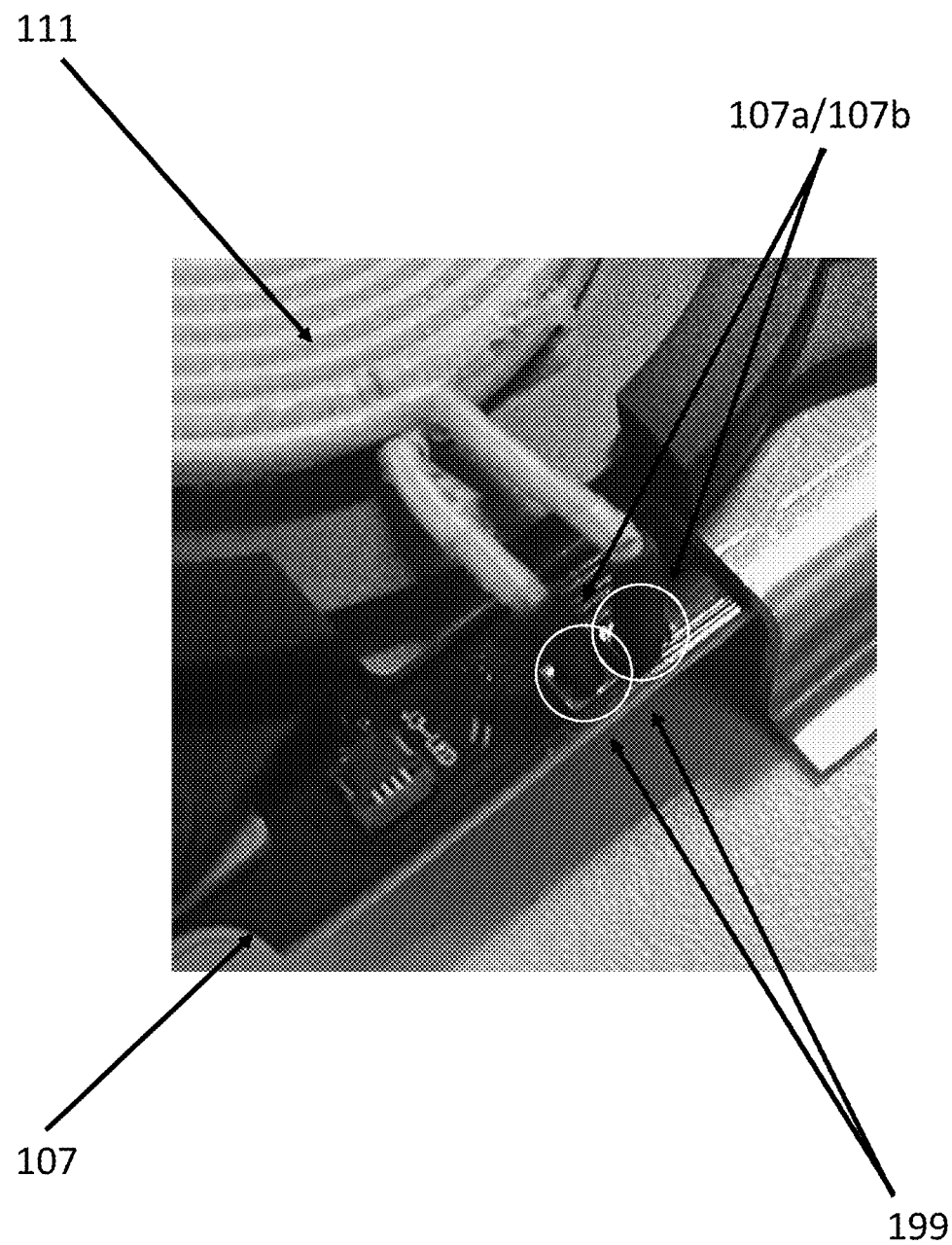
FIG. 10C is the same image as FIG. 10B except that the image has been annotated to accentuate the coil connection ends to the circuit board and bracket assembly.

FIG. 10C is the same image as FIG. 10B except that the image has been annotated to accentuate the coil connection ends 112 to the circuit board 107 and bracket 105 assembly. The image shows the connection ends 112 soldered to plated holes 107a, 107b of the circuit board 107.

Figure 11A:
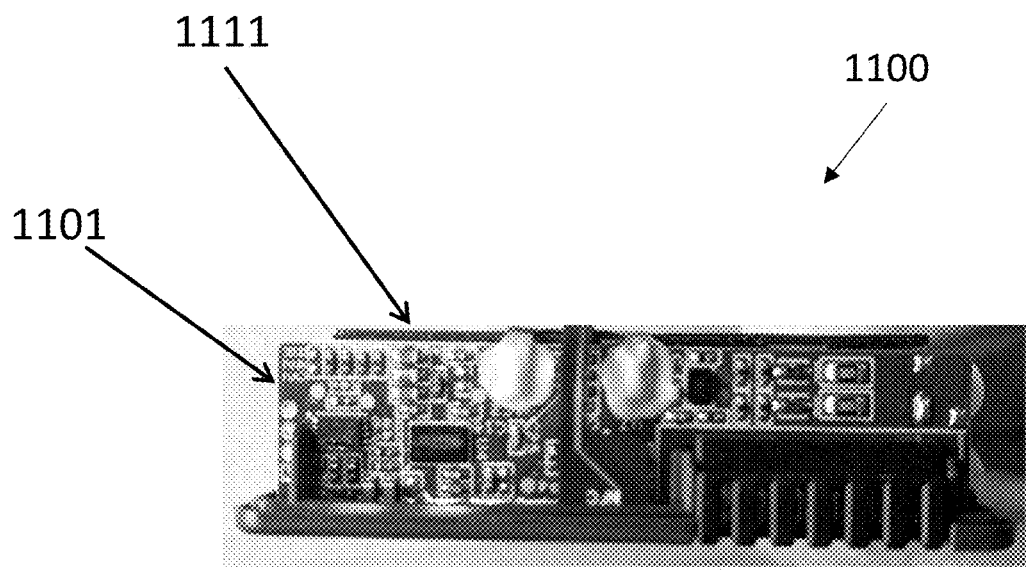
FIG. 11A is an image of an end view of a power-receiving (Rx) system.

FIG. 11A is an image of an end view of a power-receiving (Rx) system 1100. Shown is power-receiving (Rx) electronics 1101 and a power-receiving (Rx) coil 1111.

Figure 11B:
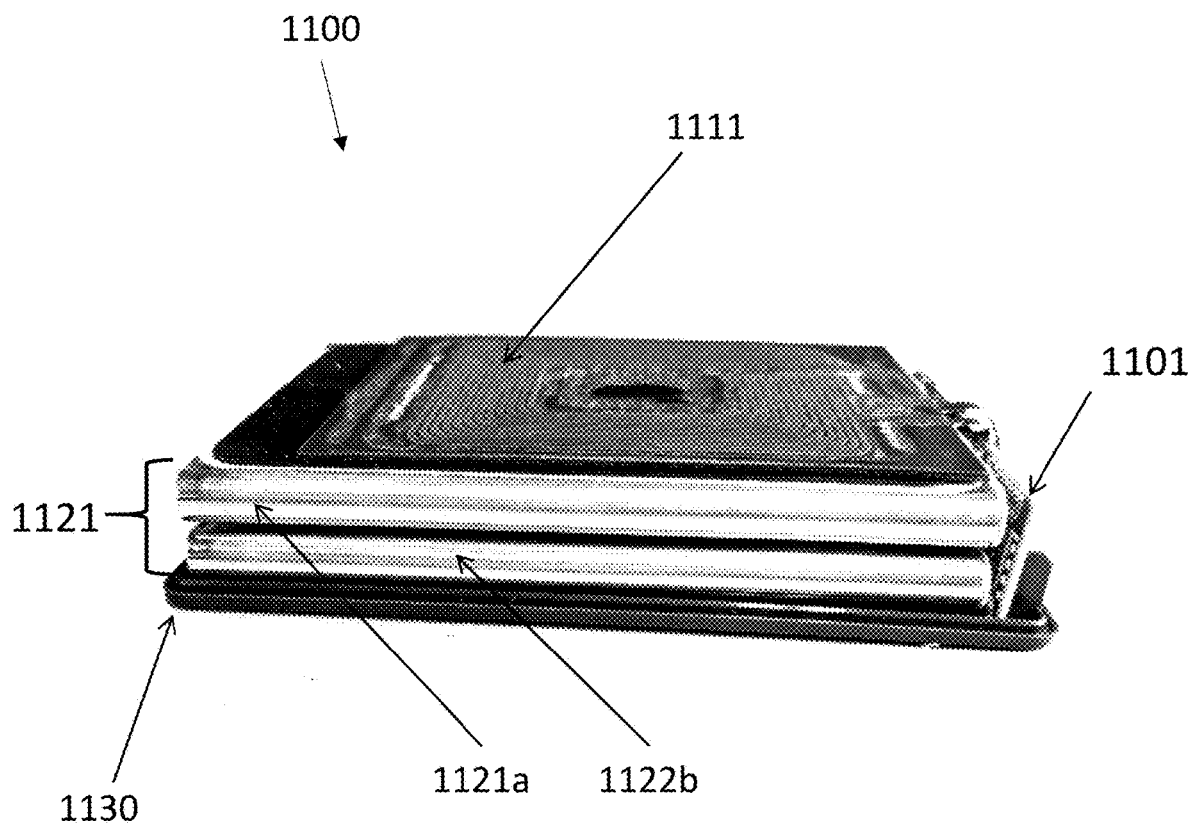
FIG. 11B is an image of a side view of the Rx system of FIG. 11A.

FIG. 11B is an image of a side view of the Rx system 1100 of FIG. 11A. In this view, the Rx electronics 1101 is on the right of the image, and the Rx coil 1111 is more clearly visible at the top of the Rx system. This embodiment of the Rx system comprises a battery pack 1121. The battery pack comprises two batteries 1121a and 1121b. At the bottom of the Rx system 1100 is a cover 1130.

Figure 12:
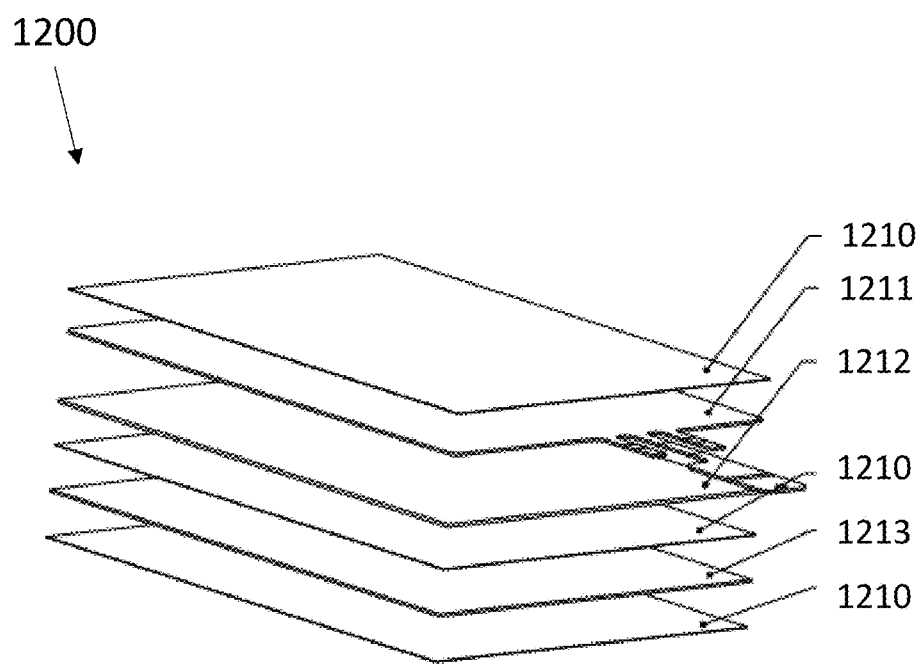
FIG. 12 is an exploded perspective view of an embodiment of an Rx coil of the Rx system of the present application.

FIG. 12 is an exploded perspective view of an embodiment of an Rx coil 1200 of the present application. This embodiment is exemplary of the Rx coil 1111 of the Rx system 1100 of FIG. 11B. The components of the Rx coil 1200 shown are: an adhesive 1210, a flexible printed circuit (FPC) Rx coil 1211, a magnetic material 1212, and a spacer 1213. The Rx coil 1200 follows a layered arrangement, wherein the layers are arranged, beginning with a top layer and ending with a bottom layer, in the following order: the top layer is an adhesive 1210, which is a first adhesive layer, followed by the FPC Rx coil 1211, which is followed by the magnetic material 1212. Following the magnetic material 1212 is the adhesive 1210, which is a second adhesive layer. The second adhesive layer is followed by the spacer 1213. The bottom layer is the adhesive 1210, which is a third adhesive layer. Thus the Rx coil 1200 of FIG. 12 comprises a total of six layers. Note that the FPC Rx coil 1211 is sandwiched between the adhesive 1210 and the magnetic material 1212, the adhesive 1210 comprising the first adhesive layer positioned atop the FPC Rx coil and the magnetic material 1212 positioned beneath the FPC Rx coil. Further, the FPC Rx coil 1211 with the magnetic material 1212 is sandwiched between the adhesive 1210, the sandwiching adhesive comprising a first adhesive layer and a second adhesive layer. This particular arrangement allows the coil to be mechanically affixed to a front housing, minimizing distance between transmitter coil and receiver coil. Having the magnetic material 1212 directly behind the Rx coil 1111 also reduces the distance between Tx magnetic material and Rx magnetic material, thereby boosting power transfer system performance and transmitter-receiver coupling. Also note that the spacer 1213 is sandwiched between the adhesive 1210. In this case the spacer 1213 is sandwiched by the second adhesive and third adhesive layers. In this embodiment, the spacer 1213 is used to separate the Rx coil 1211 with the magnetic material 1212 and a battery or a battery pack (not shown). An advantage of this arrangement is two-fold: (1) such an arrangement allows for a thinner construction when available space is limited; and, (2) this arrangement reduces equivalent series resistance (ESR) of the Rx coil 1211. Reduced ESR improves the quality factor of said coil. The quality factor affects wireless power transmission efficiency, and influences wireless transmission distances, i.e., the transmission range. Additionally, such an arrangement makes restricted physical orientations of a power-receiving apparatus or device (which are required by present-day wireless transmission systems in order to achieve optimal, complete and uncorrupted wireless power transmission) unnecessary. Other embodiments may alternately comprise one or more spacers, wherein each spacer comprises the same thickness, shape, and/or size. Yet other embodiments may alternately comprise one or more spacers, wherein at least one of the one or more spacers comprises a thickness, a shape and/or a size that differs. In some embodiments, the magnetic material 1212 alternately comprises one of a magnetic material, a ferromagnetic material, a magnetic shielding material, a metal shielding material, a metal shielding material with patterned cuts, an EMI shielding material, an amorphous material, a nanocrystalline material, a composite material, a material having coercivity greater than 0.5 Tesla, a material having permeability ranging between 100µ' to 10,000µ', or combinations thereof. An embodiment without the magnetic material 1212 is contemplated. Additionally, the flexible printed circuit (FPC) Rx coil 1211 may alternately comprise any coil wire previously disclosed. The adhesive 1210 may comprise any adherence medium previously disclose. The adhesive 1210 and any alternate adherence medium may further comprise a heat spreader, the heat spreader comprising any of the previously list heat spreader materials disclosed. The Rx coil 1200 may further comprise one or more filters. The one or more filters may be a special type of filter, such as, but not limited to, a comb filter.

Figure 13:
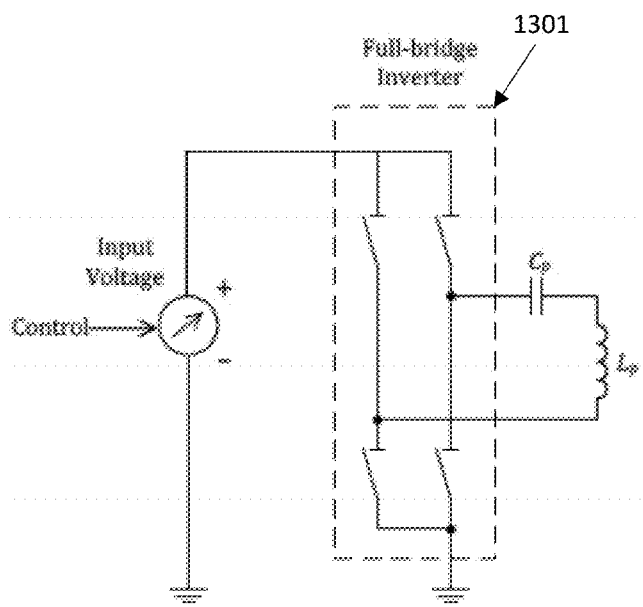
FIG. 13 is a schematic of an electrical circuit for use in a Tx system.

FIG. 13 is a schematic showing the constituents of an optional electrical circuit 1300 of a Tx system 100, 200. Here, a full bridge inverter 1301 is used to convert DC power to AC in order to drive a Tx coil. Voltage of the full bridge inverter 1301 can be varied to change a level of transmitted power. In an embodiment, an operating frequency may be kept fixed. It is contemplated that a half-bridge inverter may be alternately used in some embodiments.

Figure 14:
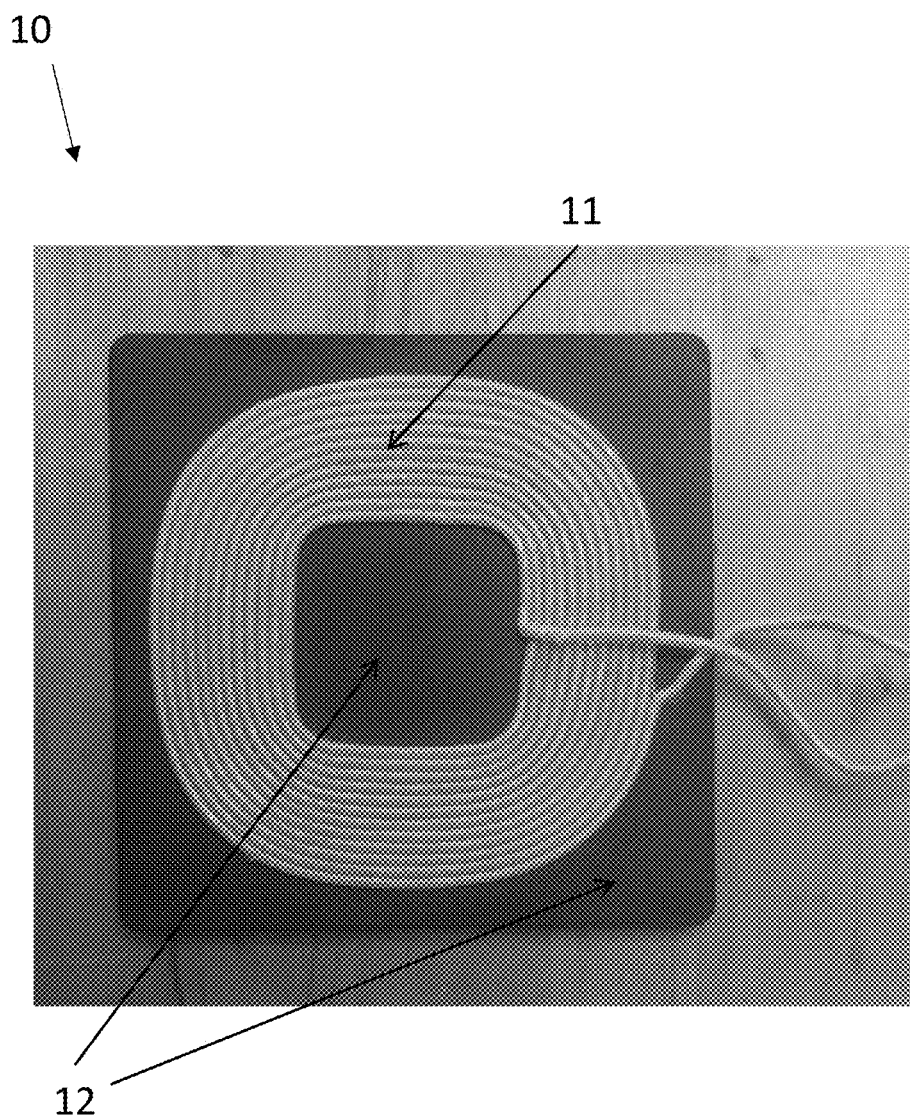
FIG. 14 is an image of a prior art standardized MP-A2 Tx coil.

FIG. 14 is an image of a prior art standardized MP-A2 Tx coil 10, which is often used for Qi™-compatible wireless power applications. Shown is the Tx coil wire structure 11 and a shielding 12 positioned beneath the Tx coil wire structure 11.

Figure 15:
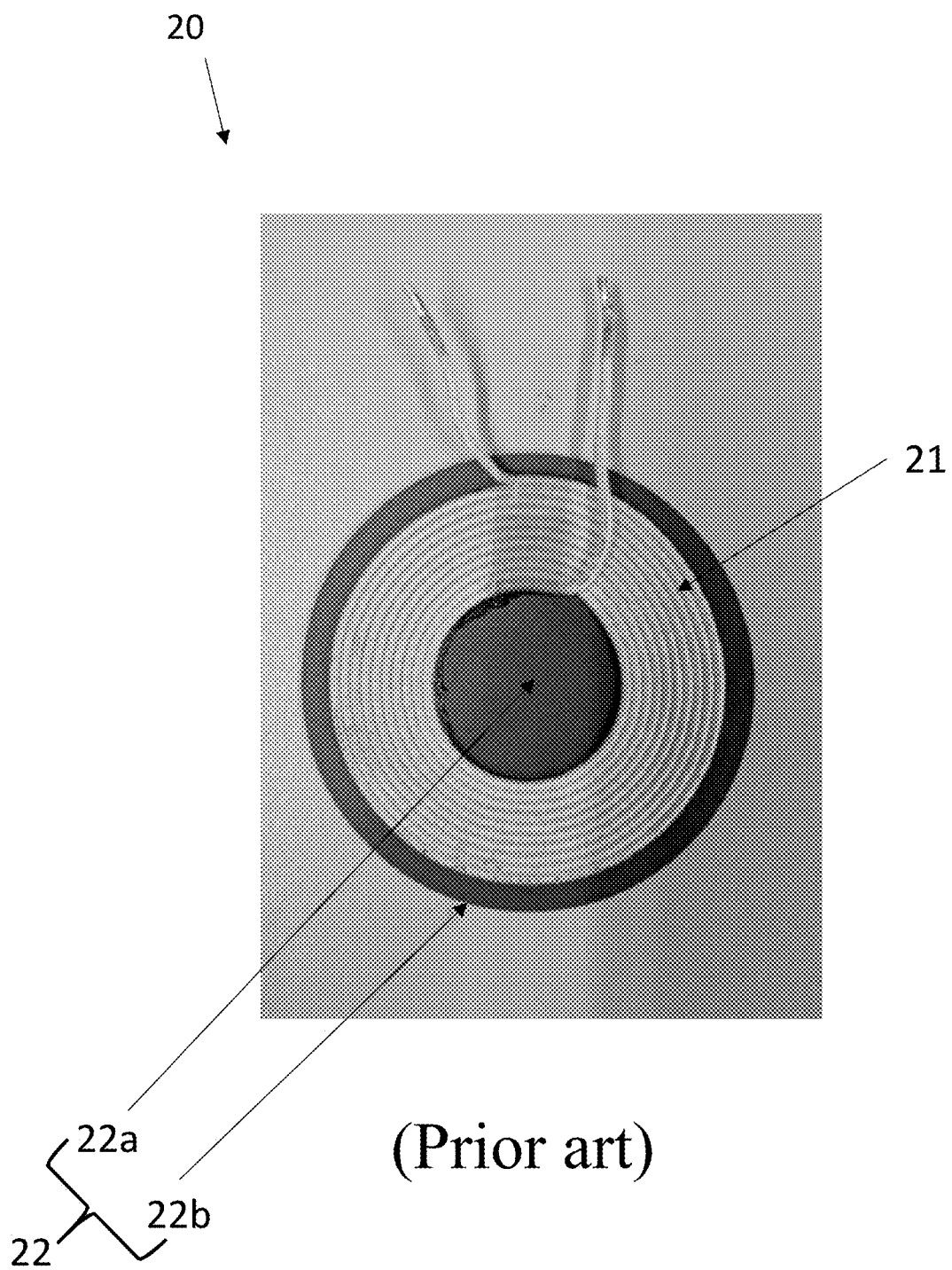
FIG. 15 is an image of a prior art standardized A11/MP-A11 Tx coil.

FIG. 15 is an image of a prior art standardized A11/MP-A11 Tx coil 20, which is also often used for Qi™-compatible wireless power applications. Shown here is a Tx coil wire structure 21 and a shielding 22 positioned beneath the Tx coil wire structure 21. In this embodiment the shielding 22 is a T-shape comprising a shielding core 22*a* and a shielding base 22*b*.

Figure 16:
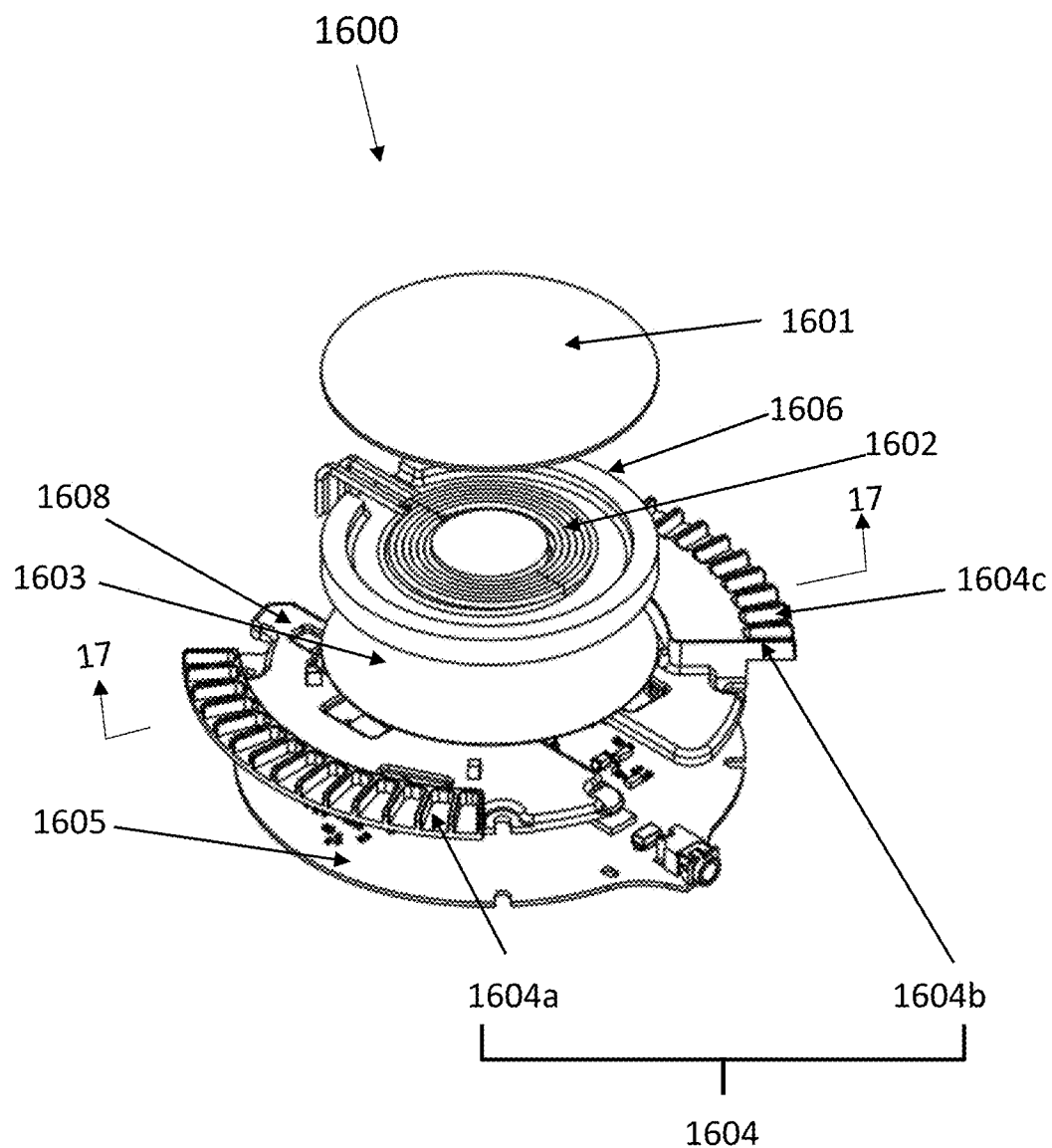
FIG. 16 is an exploded perspective view of a Tx system embodiment with thermal management features.

FIG. 16 is an exploded perspective view of an embodiment of a Tx system 1600 with thermal management features. The constituents shown include a foam 1601, a Tx coil 1602, a magnetic 1606, an adhesive 1603, a heat dissipater 1604, a shield 1608 and a circuit board 1605. In this exemplary embodiment, the heat dissipater 1604 comprises two portions 1604*a*, 1604*b*, each portion comprising heat dissipating fins 1604*c*. It is contemplated that the heat dissipater 1604 may take any form assemblable to a Tx system. The heat dissipater 1604 may comprise multiple components, each constructed separately and then assembled; or, alternatively, the heat dissipater 1604 may comprise a single construction, the single construction manufactured from a single material body. The fins 1604*c* of the heat dissipater 1604 increase a surface area on said dissipater, which facilitates heat dissipation to a constituent of the Tx system 1600 and/or to a surrounding environment (not shown). In this exemplary embodiment, heat may be dissipated from the circuit board 1605 and/or its components to either a constituent of the Tx system 1600 and/or to a surrounding environment (not shown). The heat dissipater 1604 is assemblable to the shield 1608. Alternatively, the heat dissipater 1604 and the shield 1608 may comprise a single construction, the single construction manufactured from a single material body.

Figure 17:
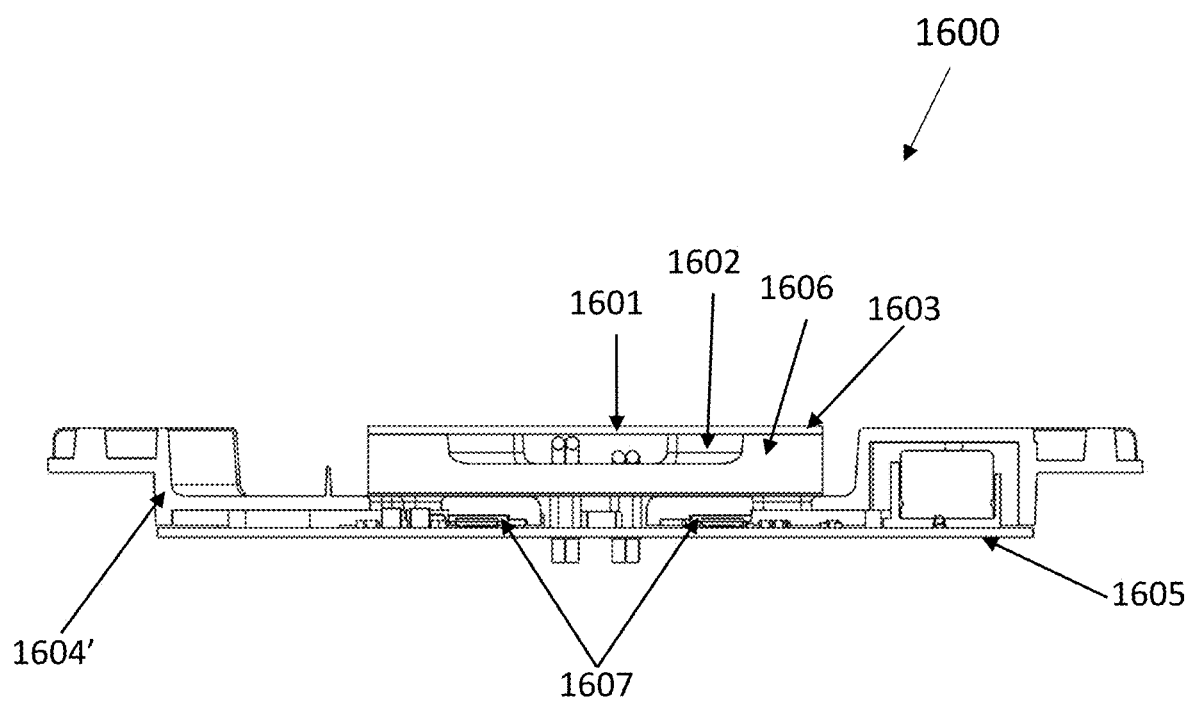
FIG. 17 is taken from 17-17 of FIG. 16, illustrating a cross-section of the Tx system embodiment.

FIG. 17 is taken from 17-17 of FIG. 16, illustrating a cross-section of the assembled Tx system 1600 embodiment. In this cross-section, an exemplary optional thermal interface material 1607 is shown in addition to all of the elements of FIG. 16. Also, the heat dissipater 1604 and the shield 1608 of FIG. 16 are shown in this cross section as a single construction heat dissipater 1604'. Regarding the optional thermal interface material 1607, it is contemplated that one or more of the thermal interface materials previously disclosed may alternatively be used. Further, the optional thermal interface material 1607 may comprise any of the shapes or configurations previously disclosed. In this exemplary embodiment, each optional thermal interface material 1607 shown is sandwiched, in other words, positioned between, a component of the circuit board 1605 and the magnetic 1606, so that the thermal interface material 1607 may conduct heat from a heat-generating component of the circuit board 1605 to the heat dissipater 1604', wherein the heat dissipater 1604' conducts the heat generated by the component for dissipation to another constituent of the Tx system 1600 and/or to a surrounding environment (not shown).

Figure 18:
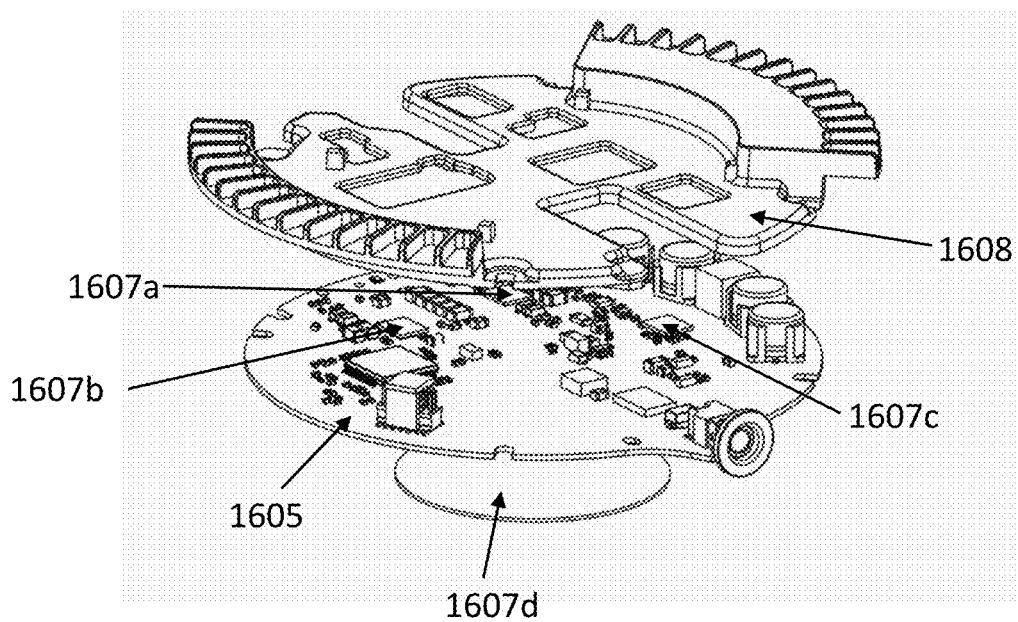
FIG. 18 is an exploded perspective view of constituents of a portion of the assembled Tx system embodiment of FIG. 17 showing thermal management constituents.

FIG. 18 is an exploded perspective view of constituents of a portion of the exemplary embodiment of the assembled Tx system 1600 of FIG. 16. In this embodiment, the optional thermal interface material 1607 is shown in four places. There are three thermal interface materials 1607*a*, 1607*b*, 1607*c* each atop a component of the circuit board 1605. A fourth optional thermal interface material 1607*d* is shown underneath circuit board 1607. Thermal interface materials 1607*a*, 1607*b*, 1607*c* conduct heat from a heat-generating component of the circuit board 1605 to the shield 1608. Thermal interface material 1607*d* conducts heat from the circuit board 1605 to either a constituent (not shown) of the Tx system 1600 and/or to a surrounding environment (also not shown).

It will be understood to those skilled in the art that there are a number of other ways to position optional thermal interface material 1607 in the Tx system 1600 in addition to the embodiments shown in FIGS. 16, 17 and 18.

Figure 19:
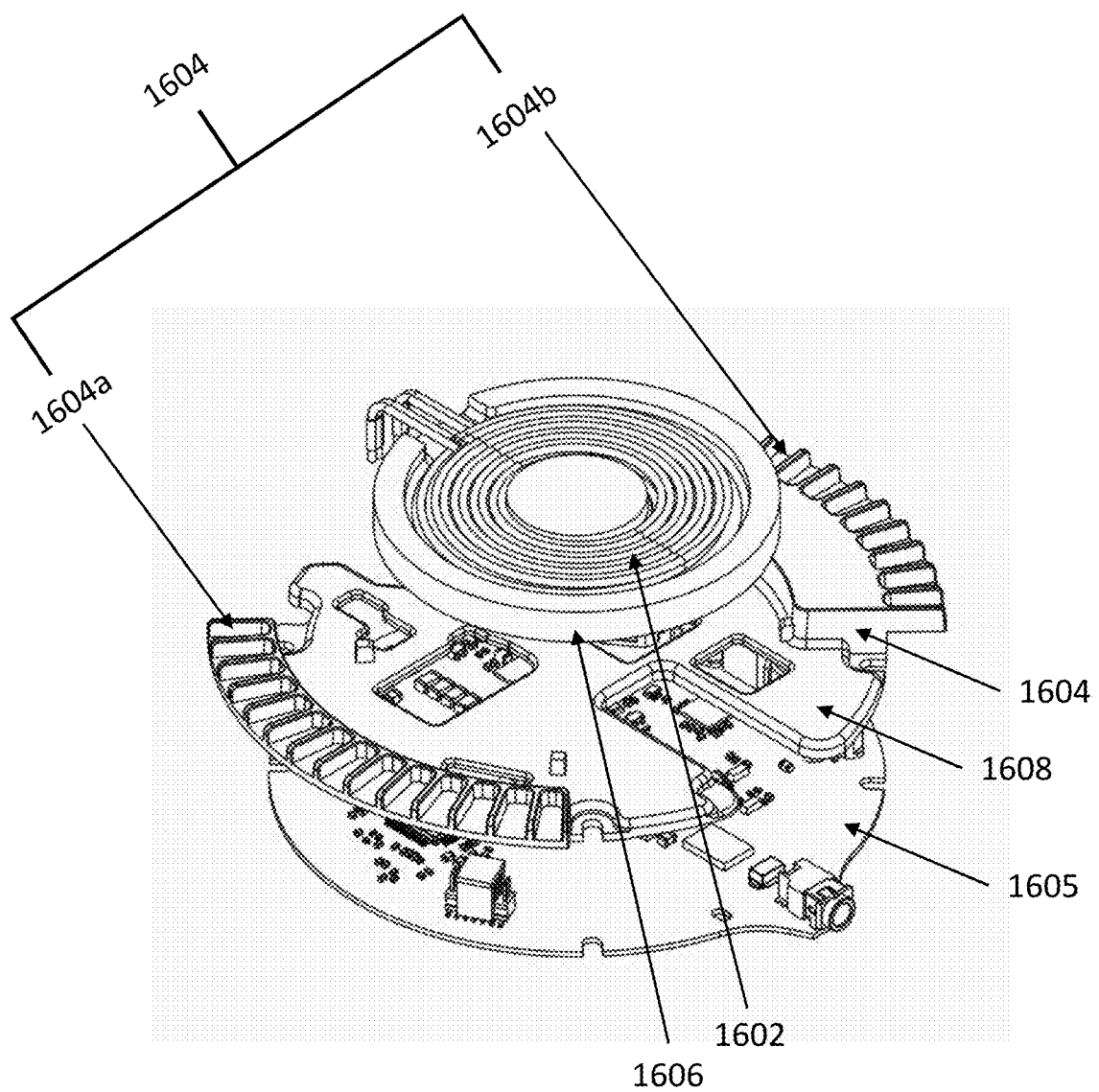
FIG. 19 is similar to FIG. 18, except this exploded perspective view includes a Tx coil assembly.

FIG. 19 is similar to FIG. 18, except that this exploded perspective view includes a Tx coil assembly. The Tx coil assembly shown here comprises a Tx coil 1602 and a magnetic 1606, wherein the magnetic is an E-core magnetic. The Tx coil 1602 is a multi-layer coil comprising at least two coils. It is contemplated that the number of coil layers can be as many as required by the application and/or that fits within the space allowed by the device or apparatus. It is also contemplated that the magnetic 1606 can alternatively be a T-core magnetic or any magnetic shape assemblable to the heat dissipater 1604. The magnetic 1606, may also be a magnetic shielding material. The magnetic may alternately be a metallic shield. The metallic shield provides both EMI and magnetic shielding. The magnetic shield also provides conduction of heat that may be generated by the coil during operation. As such, the metal shield acts like a heat sink, absorbing the heat from the coil, and then dispersing the heat away from the coil to avoid and/or mitigate system overheating. Similarly, the metal shield additionally provides conduction of heat that may be generated by the circuit board and/or the circuit board components during operation absorbing the heat from the circuit board and/or the circuit board components, and then dispersing the heat away from said circuit board and/or said components.

Figure 20:
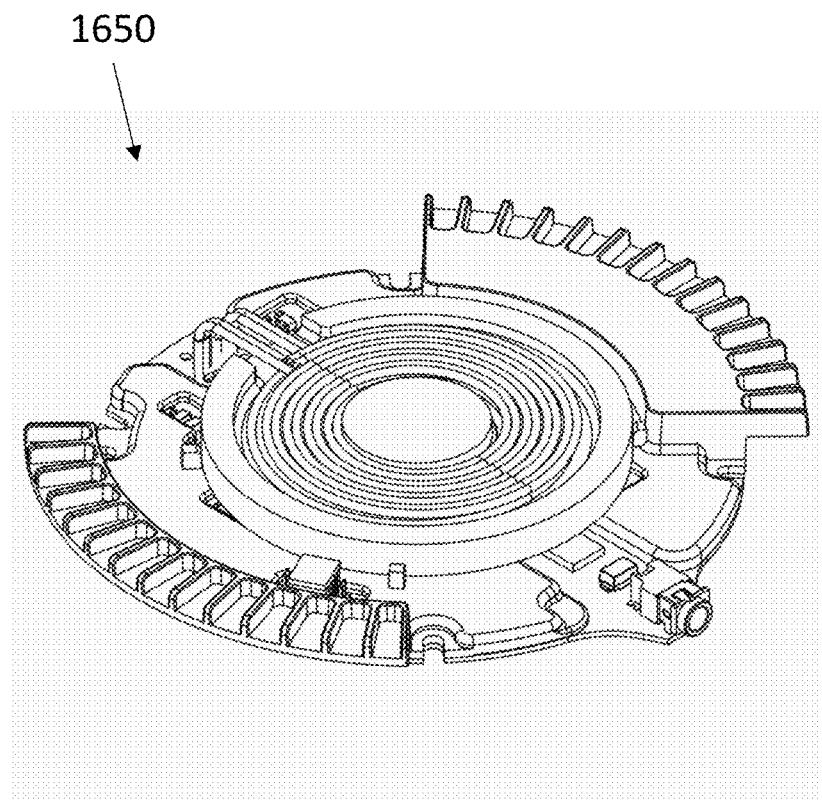
FIG. 20 is a perspective view of the Tx system of FIG. 19 after assembly.

FIG. 20 is a perspective view of the Tx system 1650 of FIG. 19 after assembly. The Tx system 1650 is capable of wireless power transmission at extended distances while effectively dissipating heat generated by the system during operation.

Figure 21:
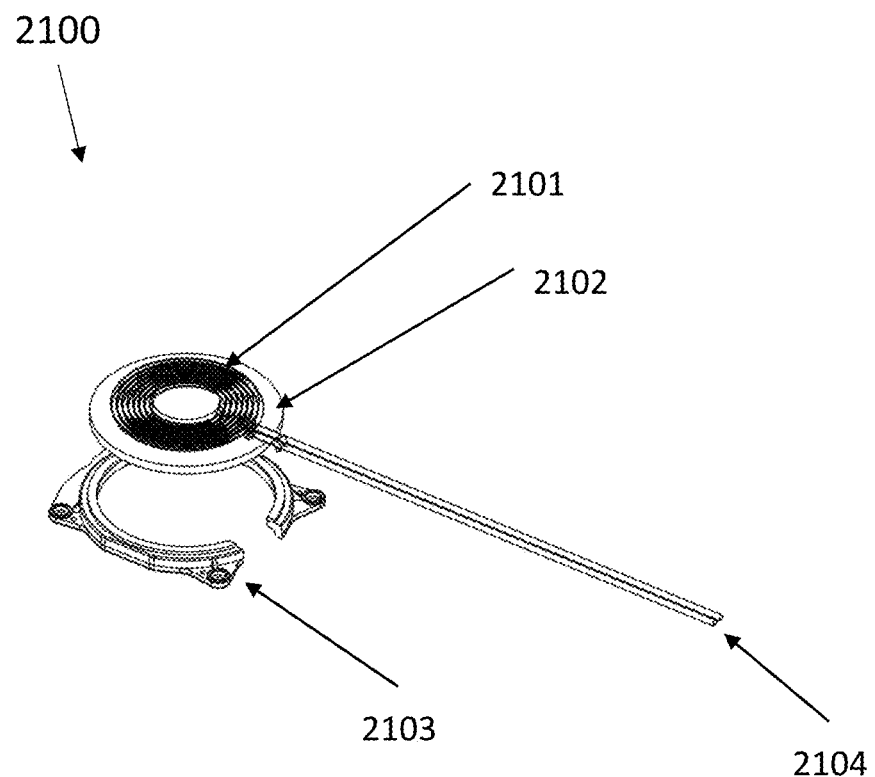
FIG. 21 is an exploded perspective view of a Tx coil assembly embodiment.

FIG. 21 is an exploded perspective view of an embodiment of a Tx coil assembly 2100 comprising a Tx coil 2101, a magnetic 2102, and a bezel 2103. The bezel 2103 may alternately be a brace or a holder. In this view, the Tx coil 2101 is assembled to the magnetic 2102. The Tx coil also has coil ends 2104 that extend a distance from the edge of the magnetic 2102. It is contemplated that the Tx coil 2101 may comprise any shape and/or any wire previously disclosed. The magnetic 2102 may also comprise a T-core, an E-core, or any shape previously disclosed. The magnetic 2102 may further comprise any of the alternate materials previously disclosed. The bezel 2103 is an open holder, meaning there is no floor or base to the surrounding wall of said holder. The bezel 2103 is also configured to accept the configuration of the outermost shape of the coil/magnetic assembly, which, in this embodiment, is the magnetic 2102. The bezel 2103 may comprise one of an insulating material, a magnetic shielding material, an EMI shielding material, a magnetic, a plastic, a polymer, a composite, a glass, a ceramic, a metal or combinations thereof. While the bezel 2103 in FIG. 21 is shown configured to accept the magnetic configuration of the Tx coil, it will be understood by those skilled in the art that the bezel 2103 may alternately comprise either a flat configuration, a base, or a shape not conformal to the Tx coil assembly.

Figure 22:
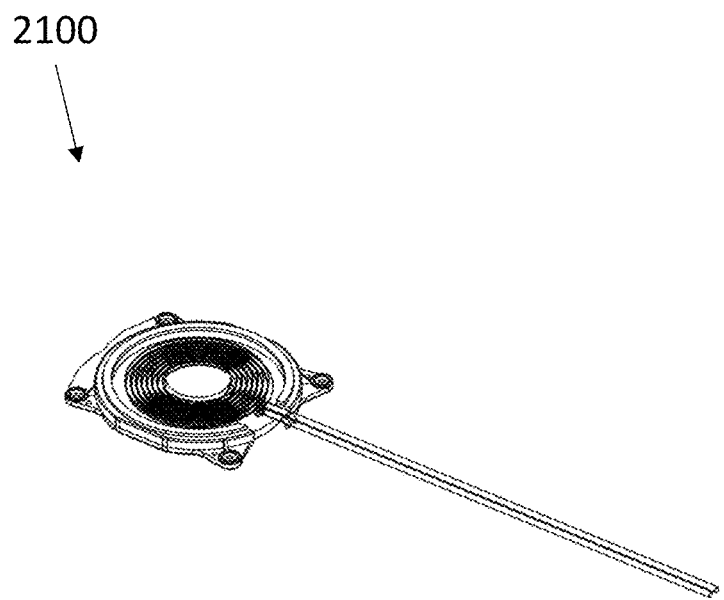
FIG. 22 shows a perspective view of the assembled Tx coil embodiment.

FIG. 22 is a perspective view of the constituents of FIG. 21 after assembly. The Tx coil assembly 2100 shown comprises a coil comprising extended leads. The extended leads of the coil facilitate accuracy in positioning the Tx coil assembly within a Tx system. A Tx system comprising Tx coil assembly positional accuracy favorably influences electrical performance while maintaining a good mechanical stability. The bezel 2103 further ruggedizes the Tx coil assembly 2100. The bezel 2103 may also provide thermal management of any heat generated by the coil 2101 during operation. The bezel 2103 may comprise any of the materials, components, features, configurations previously disclosed.

Figure 23:
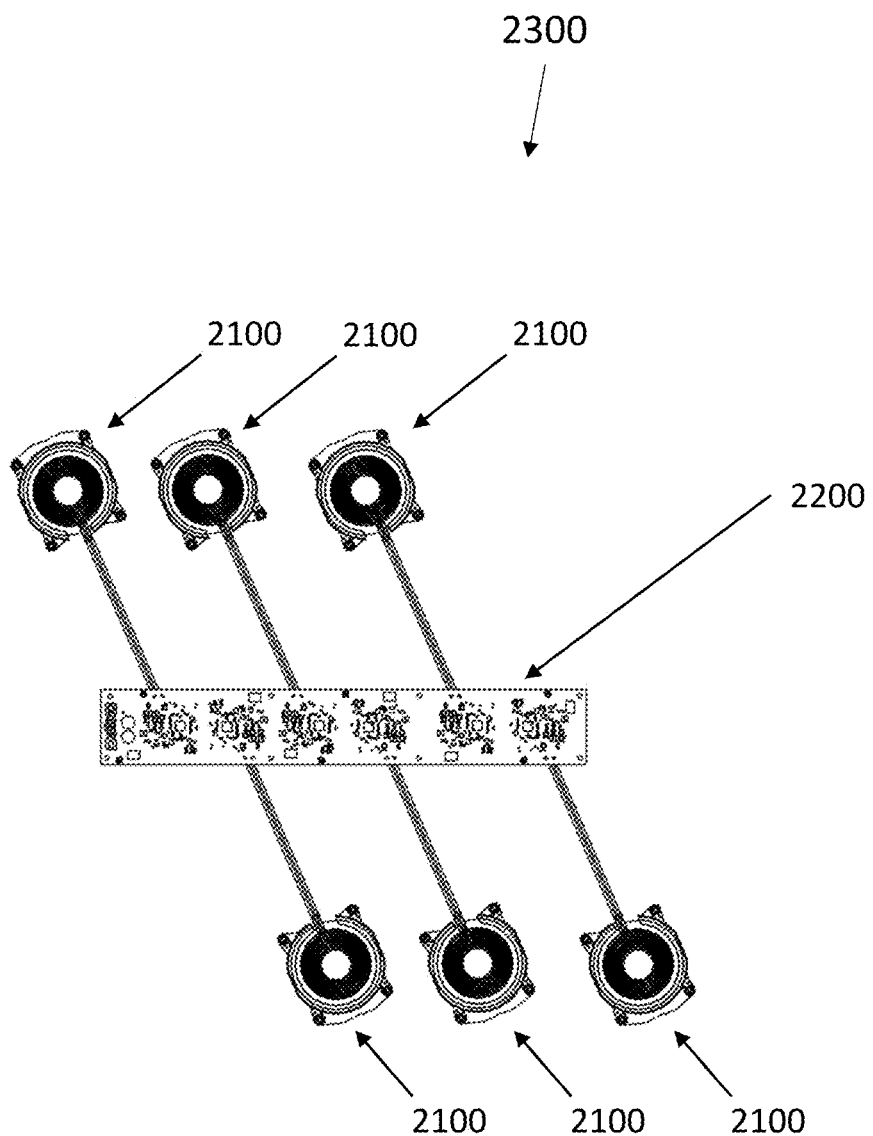
FIG. 23 illustrates the embodiment of the Tx coil assembly of FIG. 22 in an arrangement for use in a multi-bay Tx system.

FIG. 23 illustrates the embodiment of the Tx coil assembly 2100 of FIG. 22 in an exemplary arrangement for use in a multi-bay Tx system. Shown is a circuit board 2200, wherein the circuit board comprises six circuits. The circuit board may comprise one of a printed circuit board, a multi-layer printed wiring board, or a point-to-point construction board. Each of the six circuits in the circuit board 2200 supports six bays, each of which is physically and electrically connected to a Tx coil assembly 2100. The circuit board with the six Tx coil assemblies comprises a multi-bay Tx module 2300. The multi-bay Tx module 2300 is assemblable to a multi-bay Tx system (not shown). It will be understood by those skilled in the art that any embodiment of the Tx coil previously disclosed may be used to construct the multi-bay module 2300, wherein the Tx coils of the module can either all be the same, all be different, or in any combination between all being the same and all being different. Additionally, a Tx module 2300 may comprise as many Tx coils, circuit boards and/or circuits as required by the application and/or that fits within the space allowed by the Tx system and/or apparatus.

The multi-bay system may comprise one or more transmitters and one or more receivers. The multi-bay system may further comprise a transmitter housing, the transmitter housing configured to provide docking of the receiver and/or alignment between the transmitter and the receiver coils. The multi-bay system may comprise one or more circuit boards. The one or more circuit boards may comprise one of a printed circuit board, a multi-layer printed wiring board, a point-to-point construction board, or combinations thereof.

The multi-bay system comprise a controller configured to measure current passing through a transmitter coil. The controller may further comprise one of a circuit board, circuitry, a firmware, or combinations thereof. The circuitry of the multi-bay system may comprise conditioning circuitry. The conditioning circuitry may comprise a resistor network. The conditioning circuitry may specify a threshold for activation. The threshold activation may comprise a protection and/or an operation threshold, wherein the activation threshold specified comprises one of an over voltage protection (OVP), an under voltage protection (UVP), an over current protection (OCP), an over power protection (OPP), an over load protection (OLP), an over temperature protection (OTP), a no-load operation (NLO) a power good signal, or combinations thereof. The conditioning circuitry may comprise one or more positive temperature coefficient (PTC) fuses. One or more of the PTC fuses may be resettable. The conditioning circuitry may comprise one or more field-effect transistors (FETs). One or more FETs may comprise a P-channel or P-type metal oxide semiconductor FET (PMOSFET/PFET) and/or an N-channel or N-type metal oxide semiconductor FET (NMOSFET/NFET). The conditioning circuitry may comprise one of an FET, an NFET, a PFET, a PTC fuse, or combinations thereof. The conditioning circuitry may further comprise one of an FET, an NFET, a PFET, a PTC fuse, or combinations thereof within one or more integrated circuits, one or more circuit boards, or combinations thereof. The conditioning circuitry may comprise components having current ratings of 4 A-10 A. The conditioning circuitry may comprise a Q factor sensing circuit having a resistor comprising a power rating of 0.5 W. The conditioning circuitry may comprise coil tuning capacitors having a voltage rating of 100 V-400 V. Such a voltage rating mitigates damage of, for example, coil tuning capacitors while operating at power transfers up to 30 W. The conditioning circuitry may comprise inductors having power conversion current saturation ratings of 7 A-20 A. Such ratings prevent damage to wireless power system circuitry while operating at power transfers up to 30 W and/or when subjected to large in-rush currents.

The multi-bay system may comprise firmware, the firmware comprising an instruction, the instruction comprising one of a tuning instruction, a detection instruction, an authentication instruction, a settings instruction, a verification instruction, an interrogation instruction or combinations thereof. The firmware instruction may further comprise one of tuning, adjusting, foreign object detection (FOD), authentication, authentication mediation, verifications, power requirements, or combinations thereof, The instruction may provide functional instruction to a component, an assembly, a module, a structure, a construct or a configuration. For example, a firmware may adjust coil gain, mediate authentication between a transmitter and a receiver prior to starting wireless power transfer, and/or differentiate between a foreign object and an acceptable object by interrogating the electronics or firmware of each before initiating the function. In some embodiments, a firmware works in concert with electronics to interrogate and/or verify an object is foreign or acceptable before and/or after power transfer.

The multi-bay system may comprise controller firmware configured to limit an amount of current passing through a transmitter coil. The current limit may further be statically set by a system designer. The current being passed through the transmitter coil can be varied by methods that include but are not limited to: frequency modulation, amplitude modulation, duty cycle modulation, or combinations thereof. The controller firmware may limit an amount of current passing through a transmitter coil based on a static threshold that is programmed into a controller. The controller firmware may limit an amount of current passing through a transmitter coil, wherein the limit can be dynamically calculated based on a data set of parameters that is either pre-programmed or measured directly on a transmitter device.

A wireless power system for transferring power at extended coil-to-coil distances, extended transmitter-receiver ranges, and/or larger transmitter-receiver volumes comprises a receiving coil; one or more receiving electronics electrically connected to the receiving coil; a transmitting coil comprising a magnetic material; the transmitting coil being capable of being coupled to the receiving coil and, one or more transmitting electronics. The wireless power system of the present application further comprises one or more transmitting electronics electrically connected to the transmitting coil, wherein the transmitting electronics comprises a control system loop, wherein when the control system loop varies, one or more of a frequency, an input voltage, an input current, or a duty cycle, the wireless power system maintains uninterrupted operation. The wireless power system of the present application also further comprises at least one receiving electronics, wherein the at least one receiving electronics comprises a rectified voltage range between 8V and 50V. The wireless power system of the present application may comprise an operating frequency, wherein the operating frequency ranges from about 25 kHz to about 300 kHz. The wireless power system of the present application may transfer power that is greater than 1 nW up to 30 W. The wireless power system of the present application may transfer power at a coil-to-coil distance ranging from 5 mm to 25 mm. The wireless power system of the present application comprises a transmitting coil, wherein the transmitting coil comprises a transmitting coil surface and the magnetic material comprises a magnetic material surface, wherein the magnetic material surface is equal to or greater than the transmitting coil surface. The wireless power system of the present application further comprises a magnetic material surface, wherein the magnetic material surface comprises a surface area between 700 mm$^2$ and 10,000 mm$^2$. The wireless power system of the present application further comprises a magnetic material surface, wherein the magnetic material surface further comprises two or more horizontal planes, wherein at least one of the two or more horizontal planes extends beyond another horizontal plane. The wireless power system of the present application comprises one or more transmitting electronics, wherein the one or more transmitting electronics further comprises a tuning circuit. The wireless power system of the present application comprises a tuning circuit, wherein, when the tuning circuit is adjusted, the resonant frequency of an LC tank of the tuning circuit resonates at a frequency lower than an operating frequency of the wireless power system. The wireless power system of the present application comprises a magnetic material, wherein the magnetic material comprises one of a T-core shape, an E-core shape, a custom shape, or combinations thereof. The wireless power system of the present application comprises a coil assembly, wherein the coil assembly comprises a coil and a magnetic material, wherein the magnetic material resides at an inner diameter of the coil of the coil assembly, and wherein the coil and the magnetic material comprise a gap of at least 2 mm located therebetween. The magnetic material may be a magnetic material. The magnetic material may comprise a magnetic body. The magnetic body may further comprise a single, unitary constituent, the single unitary constituent further comprising one or more structural components. The wireless power system of the present application may comprise at least one a transmitting coil and at least one receiving coil, wherein either the at least one transmitting coil, the at least one receiving coil, or both comprise one of a single coil, a multi-layer coil, a multi-tiered coil, or combinations thereof. The multi-layer coil, the multi-tiered coil, or both may further comprise a coil structure comprising one or more coils. The multi-layer coil, the multi-tiered coil, or both may further comprise at least one series connection. The multi-layer coil, the multi-tiered coil, or both may reside in one or more horizontal planes.

As used herein, a "power system" is generally used interchangeably with a power transmitting system, a power receiving system, and/or a power-generating system. Non-limiting examples include: wireless power transmitters or wireless power receivers; transmitters or receivers; Tx or Rx. The term "power system" as used herein is defined as a device or an apparatus that sends, accepts, broadcasts, communicates, or carries a signal, power, energy and/or data from one point, location, apparatus or apparatuses to another point, location, apparatus or apparatuses, or over a part or all of a line or path without the use of wires as a physical link.

The word "constituent" is used herein to mean "the individual components that make an assembly." The word "component" is used herein to mean "one of a collection of independent constituents of an assembly." An embodiment therefore is constituted of individual constituent components.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim. Furthermore, to the extent that the term "include," "have," or the like is used in the description or the claims, such term is intended to be inclusive in a manner similar to the term "comprise" as "comprise" is interpreted when employed as a transitional word in a claim.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more embodiments, a processor configured to monitor and control an operation or a component may also mean the processor being programmed to monitor and control the operation or the processor being operable to monitor and control the operation.

Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

In this disclosure, the term "battery" is understood to refer to one of several types of loads; for instance, it can refer to an energy storage component, a series of energy storage components, or some other type of load which is adapted to receive electrical power. It will be appreciated that embodiments disclosed herein are adaptable to provide power and/or current to elements other than a battery; non-limiting examples include capacitors and general electrical devices and/or apparatuses.

Throughout this specification, the terms "T-core", "T-shape", and "top-hat" may be used interchangeably. As defined herein, and are understood to refer to a particular structure, wherein a magnetic material, such as a magnetic, comprises a larger structure and a smaller structure, the larger structure extending beyond the smaller structure. In some embodiments, the larger structure may comprise at least one horizontal plane. In some embodiments, the larger structure may provide a base for the smaller structure. The smaller structure may reside atop, below, or both atop and below the larger structure. The smaller structure may be positioned centrally, off-center, askew, angled, obliquely, symmetrically, asymmetrically, out of line, to one side, on one side, unevenly, or axially aligned relative to the larger structure. In an embodiment the magnetic material comprises a smaller structure positioned atop (or below, depending on orientation) a larger structure. The smaller structure of said arrangement may comprise the same magnetic material as that of the larger structure; or, alternatively, the smaller structure of said arrangement may comprise a different magnetic material than that of the larger structure. It is anticipated that the magnetic material of either the smaller structure, the larger structure, or both may comprise multiple magnetic materials that either differ in composition or are of the same composition, are layered in-line with each other or are staggered one from another, are of identical size and/or shape or differ in size and/or shape, any of which alone or in combination may be applied depending on the requirement(s) of the application, and/or the specific desired performance outcome(s) intended. For example, two or more magnetic materials may be layered, meshed, woven, braided, rolled, or extruded so that the two or more materials are distributed throughout the smaller structure, the larger structure or both. The magnetic materials may even be pressed or extruded forming either the smaller structure, the larger structure, or both, wherein the structure(s) thereof comprises two or more discrete magnetic material regions.

Said "T-core", "T-shape", or "top-hat" arrangement may alternately comprise one single unitary body, wherein a magnetic material of the single unitary body comprises a smaller structure physically protruding from a larger structure. The unitary body may comprise more than one magnetic material. For example, two or more magnetic material pieces (of the same size, or of differing size) may be layered and then formed to create a unitary body having the "T-core", "T-shape", or "top-hat" protrusion. Alternatively, a composite magnetic material piece comprising two or more magnetic materials, wherein the magnetic material may be meshed, woven, braided, rolled, or extruded so that the two or more materials are distributed through the unitary body. The magnetic materials may even be pressed or extruded forming a unitary body comprising two or more discrete magnetic materials regions within the unitary body. In this case, for example, one magnetic material region may provide for the smaller structure portion of the unitary body, while a different magnetic material region may provide the larger structure portion of the unitary body.

In addition to the above, it is also anticipated that this type of shape can be adapted to allow a coil of wire, a multi-layer printed coil, a multi-layer multi-turn printed coil, or other electrically conductive material, to sit atop the larger component while surrounding the smaller component. This setup combines benefits of a magnetic material core, such as a magnetic core, with benefits of a magnetic material base, such as a magnetic base. As defined herein, the word "wire" is a length of electrically conductive material that may either be of a two dimensional conductive line or track that may extend along a surface or alternatively, a wire may be of a three dimensional conductive line or track that is contactable to a surface. A wire may comprise a trace, a filar, a filament or combinations thereof. These elements may be a single element or a multitude of elements such as a multifilar element or a multifilament element. Further, the multitude of wires, traces, filars, and filaments may be woven, twisted or coiled together such as in a cable form. The wire as defined herein may comprise a bare metallic surface or alternatively, may comprise a layer of electrically insulating material, such as a dielectric material that contacts and surrounds the metallic surface of the wire. A "trace" is an electrically conductive line or track that may extend along a surface of a substrate. The trace may be of a two dimensional line that may extend along a surface or alternatively, the trace may be of a three dimensional conductive line that is contactable to a surface. A "filar" is an electrically conductive line or track that extends along a surface of a substrate. A filar may be of a two dimensional line that may extend along a surface or alternatively, the filar may be a three dimensional conductive line that is contactable to a surface. A "filament" is an electrically conductive thread or threadlike structure that is contactable to a surface. In summary, a magnetic material T-shape may be created from multiple pieces of magnetic material, or from a single magnetic material piece, either homogenous, heterogeneous, composite, or combinations thereof.

In this disclosure, terms such as "E-core", or "E-shape" are understood to refer to a setup comprising a magnetic base, a magnetic core atop the magnetic base, and a magnetic ring extending upward from the magnetic base. A cross-section of this setup generally forms the shape of a letter "E". The shape of the letter "E" may have several rotational orientations. A magnetic E-shape might be formed from multiple material pieces of magnetic, or from a single material body.

Note that combinations and shapes of magnetic are contemplated other than the above shapes; some of these might include combining elements such as a base, a core, and/or a ring in ways that form shapes different from those specified above.

Additionally, the above definitions shall be understood to include materials which provide functional benefits similar to magnetic, such as certain ceramic materials.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A wireless power system for transferring power, the wireless power system comprising:
    a receiving coil;
    a transmitting coil electrically connected to the receiving coil;
    an E-core magnetic having a magnetic core, a magnetic backing, and a magnetic ring, wherein the transmitting coil is positioned above the magnetic backing, radially outward of the magnetic core, and, at least partially, radially inward of the magnetic ring;
    one or more electronics electrically connected to the transmitting coil; and
    a heat dissipater thermally connected to the one or more electronics, wherein the heat dissipater is configured to dissipate heat generated by at least one or more of the transmitting coil, at least one of the one or more electronics, or any combinations thereof, and wherein at least a portion of the heat dissipater is positioned radially outward of the E-core magnetic and is configured to increase surface area on the heat dissipater for facilitating heat dissipation from one or more of the transmitting coil, the E-core magnetic, one or more electronics, or any combinations thereof.

2. The wireless power system of claim 1, wherein the portion of the heat dissipater comprises one or more fins, the one or more fins configured to increase surface area of the portion.

3. The wireless power system of claim 1, wherein the heat dissipater is configured to be assemblable to one of the transmitting coil, the E-core magnetic, a magnetic material, a ferromagnetic material, a shielding material, a ferrite material, a ferrite construct, a shield, a bezel, a holder, a brace, a thermal interface material, an adherence medium, a circuit board, a bracket, an assembly, a component, a construct, a structure, or combinations thereof.

4. The wireless power system of claim 3, wherein the heat dissipater is configured to be directly assemblable to one of the transmitting coil, the E-core magnetic, a magnetic material, a ferromagnetic material, a shielding material, a ferrite material, a ferrite construct, a shield, a bezel, a holder, a brace, a thermal interface material, an adherence medium, a circuit board, a bracket, an assembly, a component, a construct, a structure, or combinations thereof, or indirectly assemblable to one of a Tx coil, an Rx coil, a magnetic material, a ferromagnetic material, a shielding material, a ferrite material, a ferrite construct, a shield, a bezel, a holder, a brace, a thermal interface material, an adherence medium, a circuit board, a bracket, an assembly, a component, a construct, a structure, or combinations thereof, wherein an indirectly assembly comprises one of point-to-point construction, a component-to-component construction, an assembly-to-assembly construction, or combinations thereof.

5. The wireless power system of claim 1, wherein the heat dissipater comprises one of a single construction, the single construction manufactured from a single material body, or a multiple component construction, wherein each component is separate or constructed separately, and then assemblable into the heat dissipater.

6. The wireless power system of claim 1, wherein the heat dissipater comprises at least two portions, wherein at least one of the at least two portions comprises at least one fin.

7. The wireless power system of claim 1, further comprising a thermal interface material, the thermal interface material assemblable to the heat dissipater and selected from a group consisting of silver, copper, gold, brass, aluminum, iron, steel, various carbons including graphite, graphene, diamond, pyrolytic graphite and fullerenes, polyurethane, silicone, foam, sponge, rubber, polytetrafluoroethylene (PTFE), and combinations, composites or alloys thereof.

8. The wireless power system of claim 1, further comprising a heat spreader that is assemblable to the heat dissipater and is selected from a group consisting of a body, the body comprising a pad, a plate, a block, a sheet, a film, a foil, a fabric, a screen, a weave, a mesh, a foam, a custom fiber or wire form, or a braid.

9. The wireless power system of claim 1, wherein the heat dissipater conducts the heat generated by the transmitting coil, at least one of the one or more electronics, or a combination thereof, for dissipation to a surrounding environment.

10. The wireless power system of claim 1, wherein the heat dissipater is positioned near, adjacent, atop, or beneath the transmitting coil, wherein the heat dissipater conducts heat away from the transmitting coil.

11. The wireless power system of claim 1, comprising a conductive material, wherein the conductive material provides thermal conductivity, electrical conductivity, and electrical grounding simultaneously, and wherein the electrical conductivity of the conductive material is at least $1\times10^6$ Siemens/meter.

12. The wireless power system of claim 1, wherein the one or more electronics comprises one of a circuit board, circuitry, a firmware, or combinations thereof.

13. The wireless power system of claim 1, wherein the one or more electronics comprises conditioning circuitry.

14. The wireless power system of claim 13, wherein the conditioning circuitry comprises one of a resistor network, one or more positive temperature coefficient (PTC) fuses, one or more positive resettable PTC fuses, one or more field-effect transistors (FETs), one or more P-channel FETs (PMOSFETs), one or more P-type metal oxide semiconductor FETs (PFETs), one or more N-channel FETs (NMOSFETs), one or more N-type metal oxide semiconductor FETs (NFET), one or more Q factor sensing circuits, one or more coil tuning capacitors, or combinations thereof.

15. The wireless power system of claim 13, wherein the conditioning circuitry specifies a threshold activation, wherein the threshold activation specified comprises one of an over voltage protection (OVP), an under voltage protection (UVP), an over current protection (OCP), an over power protection (OPP), an over load protection (OLP), an over temperature protection (OTP), a no-load operation (NLO) a power good signal, or combinations thereof.

16. The wireless power system of claim 1, wherein the one or more electronics comprises discrete components comprising one of a current rating of 4 A-10 A, a power rating of at least 0.5 W, a voltage rating of 100 V-200 V, a voltage rating of 200 V-400 V, a saturation current rating greater than 7 A-20 A, or combinations thereof.

17. The wireless power system of claim 1, wherein the one or more electronics comprises tuning circuitry, wherein the tuning circuitry comprises tuning capacitors.

18. The wireless power system of claim 1, wherein the one or more electronics comprises one or more inductors, wherein the one or more inductors comprises a saturation current rating greater than 7 A to 20 A, and wherein the one or more inductors are used for buck conversion of power.

19. The wireless power system of claim 1, wherein the one or more electronics comprises a firmware, the firmware comprising a firmware instruction, the firmware instruction comprising one of a tuning instruction, a detection instruction, an authentication instruction, a settings instruction, a verification instruction, an interrogation instruction or combinations thereof.

20. The wireless power system of claim 19, wherein the firmware instruction further comprises one of tuning, adjusting, foreign object detection (FOD), authentication, authentication mediation, verifications, power requirements, or combinations thereof.

* * * * *